(12) United States Patent
Kurokawa

(10) Patent No.: US 10,319,743 B2
(45) Date of Patent: Jun. 11, 2019

(54) SEMICONDUCTOR DEVICE, DISPLAY SYSTEM, AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/837,270

(22) Filed: Dec. 11, 2017

(65) Prior Publication Data

US 2018/0175074 A1    Jun. 21, 2018

(30) Foreign Application Priority Data

Dec. 16, 2016 (JP) ................................. 2016-244323

(51) Int. Cl.
  *H01L 33/00* (2010.01)
  *H01L 27/12* (2006.01)
  (Continued)

(52) U.S. Cl.
  CPC .... *H01L 27/1225* (2013.01); *G02F 1/136286* (2013.01); *G09G 3/20* (2013.01); *G09G 3/3208* (2013.01); *G09G 3/3266* (2013.01); *G09G 3/3677* (2013.01); *G09G 5/39* (2013.01); *G09G 5/393* (2013.01); *H01L 21/283* (2013.01); *H01L 27/0688* (2013.01); *H01L 27/3248* (2013.01); *H01L 27/3276* (2013.01); *H01L 51/56* (2013.01); *G09G 2300/0408* (2013.01); *G09G 2300/0417* (2013.01); *G09G 2310/0286* (2013.01); *G09G 2310/0289* (2013.01); *G09G 2310/0291* (2013.01);
  (Continued)

(58) Field of Classification Search
  None
  See application file for complete search history.

(56) References Cited

U.S. PATENT DOCUMENTS

2003/0107688 A1    6/2003   Yamagishi
2007/0072439 A1    3/2007   Akimoto et al.
(Continued)

FOREIGN PATENT DOCUMENTS

JP    2007-096055 A    4/2007
JP    2007-123861 A    5/2007
WO    WO-2016/203340   12/2016

*Primary Examiner* — Kevin M Picardat
(74) *Attorney, Agent, or Firm* — Fish & Richardson P.C.

(57) ABSTRACT

A novel semiconductor device or display device is provided. A semiconductor substrate is used as a substrate of a display portion and a transistor in the display portion is formed using the semiconductor substrate. In this way, variation in the characteristics of the transistors among pixels is reduced and pixel density can be increased. Moreover, transistors used for a driver circuit, a signal generation circuit, and a level shifter are formed using the semiconductor substrate. As a result, these circuits can be formed directly on the substrate of the display portion, whereby bonding of a chip and the substrate is unnecessary. Furthermore, these circuits can be easily connected to each other, so that signal delay or an increase in power consumption due to complicated wirings can be prevented.

8 Claims, 39 Drawing Sheets

(51) Int. Cl.
  *H01L 27/32* (2006.01)
  *G02F 1/1362* (2006.01)
  *H01L 51/56* (2006.01)
  *H01L 21/283* (2006.01)
  *G09G 3/3208* (2016.01)
  *H01L 27/06* (2006.01)
  *G09G 3/20* (2006.01)
  *G09G 3/3266* (2016.01)
  *G09G 3/36* (2006.01)
  *G09G 5/39* (2006.01)
  *G09G 5/393* (2006.01)
  *H01L 51/00* (2006.01)

(52) U.S. Cl.
  CPC ........... *G09G 2310/0294* (2013.01); *G09G 2320/0276* (2013.01); *G09G 2340/06* (2013.01); *G09G 2360/144* (2013.01); *H01L 51/0096* (2013.01)

(56) References Cited

U.S. PATENT DOCUMENTS

| | | | |
|---|---|---|---|
| 2008/0284710 A1* | 11/2008 | Kimura | G02F 1/13454 345/98 |
| 2011/0031491 A1* | 2/2011 | Yamazaki | G02F 1/136227 257/43 |
| 2011/0267297 A1* | 11/2011 | Yamazaki | G06F 1/3265 345/173 |
| 2015/0255492 A1 | 9/2015 | Takahashi et al. | |
| 2017/0187360 A1* | 6/2017 | Uesugi | G09G 3/3648 |
| 2017/0270405 A1 | 9/2017 | Kurokawa | |
| 2017/0301376 A1 | 10/2017 | Kurokawa | |
| 2017/0337884 A1* | 11/2017 | Kurokawa | G09G 3/3413 |
| 2018/0005566 A1 | 1/2018 | Kurokawa | |
| 2018/0018752 A1 | 1/2018 | Kurokawa | |
| 2018/0040274 A1 | 2/2018 | Kurokawa | |

\* cited by examiner

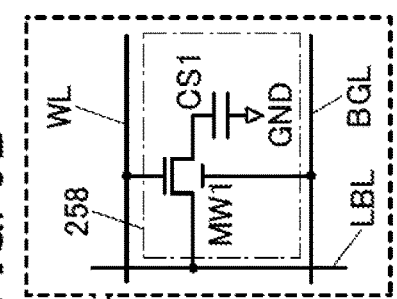
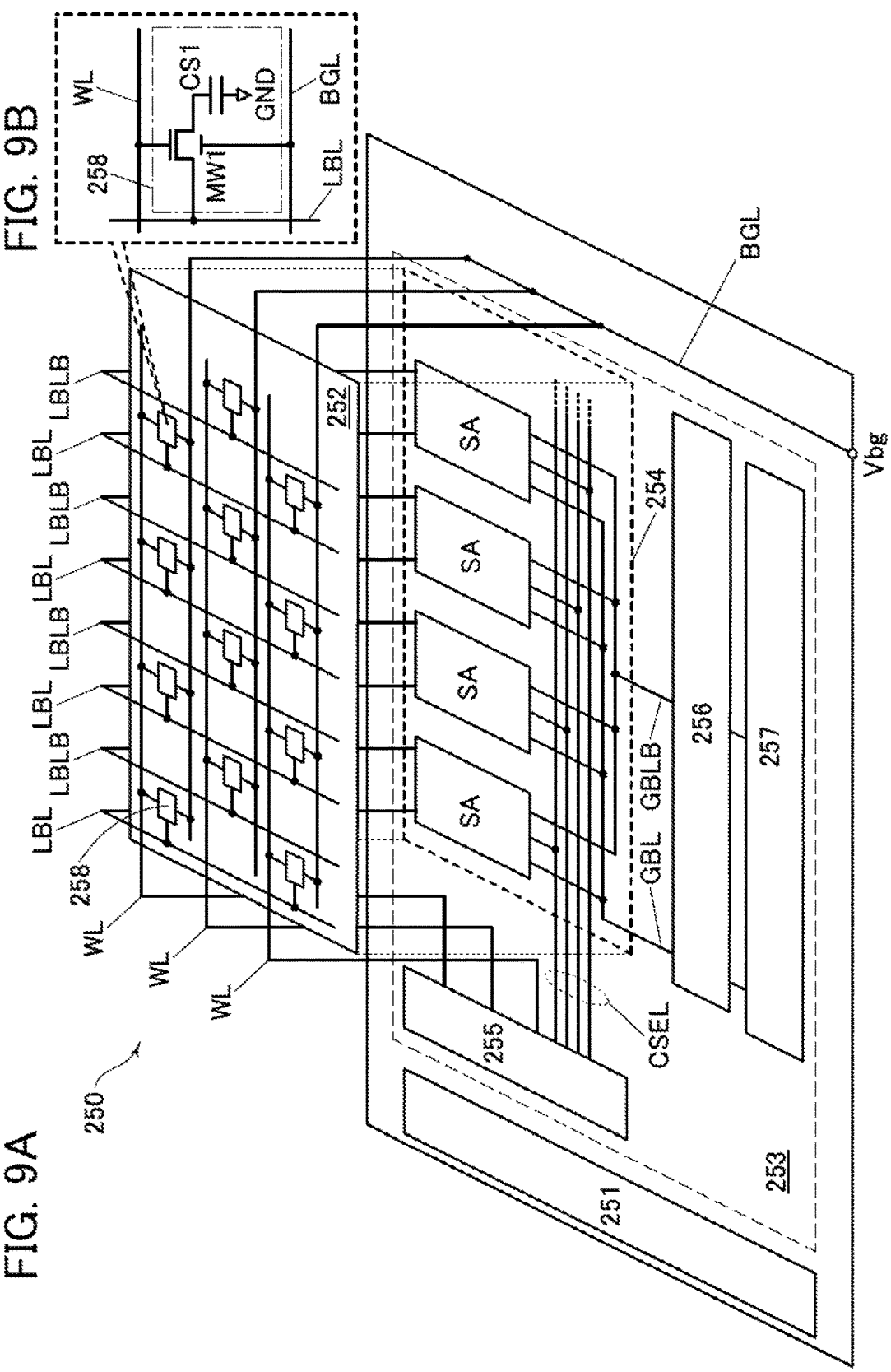

SEMICONDUCTOR DEVICE, DISPLAY SYSTEM, AND ELECTRONIC DEVICE

BACKGROUND OF THE INVENTION

1. Field of the Invention

One embodiment of the present invention relates to a semiconductor device, a display system, and an electronic device.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

The "semiconductor device" in this specification and the like means all devices which can operate by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

Flat panel displays typified by liquid crystal display devices and light-emitting display devices are widely used for displaying video. Although the transistors used in these display devices are mainly manufactured using silicon semiconductors, attention has been drawn to a technique in which a metal oxide exhibiting semiconductor characteristics is used for transistors instead of a silicon semiconductor in recent years. For example, in Patent Documents 1 and 2, a technique is disclosed in which a transistor manufactured using zinc oxide or an In—Ga—Zn-based oxide as a semiconductor layer is used in a pixel of a display device.

REFERENCES

Patent Documents

[Patent Document 1] Japanese Published Patent Application No. 2007-96055
[Patent Document 2] Japanese Published Patent Application No. 2007-123861

SUMMARY OF THE INVENTION

An object of one embodiment of the present invention is to provide a novel semiconductor device or display system. Another object of one embodiment of the present invention is to provide a highly integrated semiconductor device or display system. Another object of one embodiment of the present invention is to provide a semiconductor device or display system with high withstand voltage. Another object of one embodiment of the present invention is to provide a semiconductor device or display system capable of high-speed operation. Another object of one embodiment of the present invention is to provide a highly reliable semiconductor device or display system. Another object of one embodiment of the present invention is to provide a semiconductor device or display system which has low power consumption. Another object of one embodiment of the present invention is to provide a semiconductor device or display system capable of performing image processing in accordance with user's preference.

One embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

A semiconductor device of one embodiment of the present invention includes a pixel portion, a driver circuit, a signal generation circuit, and a level shifter. The level shifter is configured to amplify a signal input from the signal generation circuit and output an amplified signal to the driver circuit. The pixel portion includes a pixel including a first transistor. The driver circuit includes a second transistor. The signal generation circuit includes a third transistor and a fourth transistor. The level shifter includes a fifth transistor. A channel region of the first transistor, a channel region of the second transistor, and a channel region of the third transistor are formed in a semiconductor substrate. Each of a channel region of the fourth transistor and a channel region of the fifth transistor is formed in a semiconductor film. The semiconductor film contains a metal oxide.

In the semiconductor device of one embodiment of the present invention, the signal generation circuit may include a memory device and the memory device may include the fourth transistor.

In the semiconductor device of one embodiment of the present invention, the fourth transistor and the fifth transistor may be stacked over the first transistor, the second transistor, and the third transistor.

In the semiconductor device of one embodiment of the present invention, the pixel may include a sixth transistor and a light-emitting element, one of a source and a drain of the first transistor may be electrically connected to one electrode of the light-emitting element, one of a source and a drain of the sixth transistor may be electrically connected to a gate of the first transistor, and a channel region of the sixth transistor may be formed in a semiconductor film containing a metal oxide.

In the semiconductor device of one embodiment of the present invention, the semiconductor substrate may be a single crystal silicon substrate, a single crystal germanium substrate, a compound semiconductor substrate, or an SOI substrate.

A display system of one embodiment of the present invention includes the semiconductor device and a host. The signal generation circuit is configured to generate a video signal on the basis of image data input from the host.

In the display system of one embodiment of the present invention, the semiconductor device may include an arithmetic circuit, the host may include software, the arithmetic circuit may constitute a first neural network, the software may constitute a second neural network, the first neural network may be configured to output a parameter used for image processing on the basis of information on an environment where video displayed on the pixel portion is seen, the second neural network may be configured to perform supervised learning, and a weight coefficient of the second neural network updated by the supervised learning may be output to the first neural network.

An electronic device of one embodiment of the present invention includes the display device.

One embodiment of the present invention can provide a novel semiconductor device or display system. Another object of one embodiment of the present invention can provide a highly integrated semiconductor device or display system. Another object of one embodiment of the present invention can provide a semiconductor device or display system with high withstand voltage. Another object of one embodiment of the present invention can provide a semiconductor device or display system capable of high-speed operation. Another object of one embodiment of the present invention can provide a highly reliable semiconductor device or display system. Another object of one embodiment of the present invention can provide a semiconductor device or display system which has low power consumption. Another object of one embodiment of the present invention can provide a semiconductor device or display system capable of performing image processing in accordance with user's preference.

Note that the description of these effects does not preclude the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIGS. 2A, 2B-1, and 2B-2 are diagrams showing a configuration example of a display portion and configuration examples of a pixel portion;

FIGS. 9A and 9B illustrate a configuration example of a memory device;

DETAILED DESCRIPTION OF THE INVENTION

Figure 1:
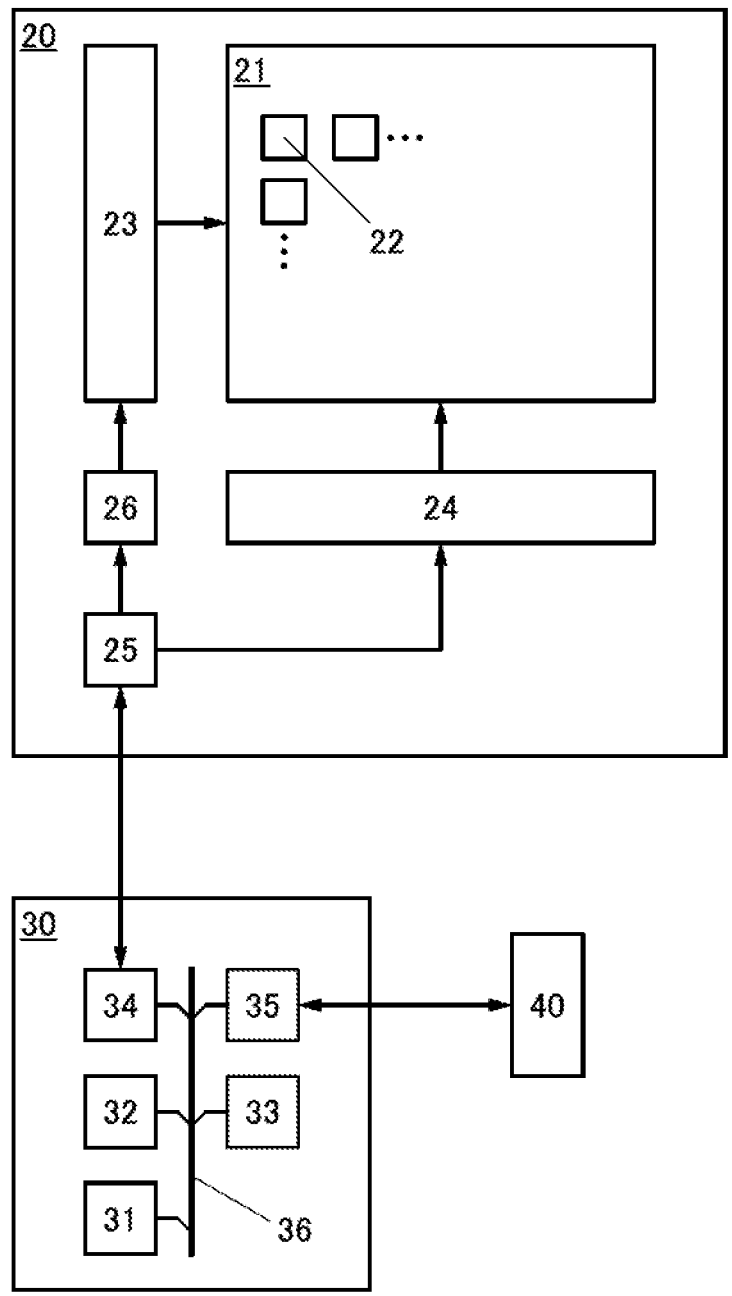
FIG. 1 illustrates a configuration example of a display system.

Embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as a semiconductor device, a memory device, a display device, an imaging device, and a radio frequency (RF) tag. The display devices include, in its category, liquid crystal display devices, light-emitting devices having pixels each provided with a light-emitting element typified by an organic light-emitting element, electronic paper, digital micromirror devices (DMDs), plasma display panels (PDPs), field emission displays (FEDs), and the like.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a channel region of a transistor is called an oxide semiconductor in some cases. That is to say, a metal oxide that has at least one of an amplifying function, a rectifying function, and a switching function can be called a metal oxide semiconductor, or OS for short. In the following description, a transistor including a metal oxide in a channel region is also referred to as an OS transistor.

In this specification and the like, a metal oxide including nitrogen is also called a metal oxide in some cases. Moreover, a metal oxide including nitrogen may be called a metal oxynitride. The details of a metal oxide are described later.

Furthermore, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that components denoted by the same reference numerals in different drawings represent the same components, unless otherwise specified.

Even when independent components are electrically connected to each other in the drawing, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a semiconductor device and a display system of one embodiment of the present invention are described.

<Configuration Examples of Display System>

FIG. 1 illustrates a configuration example of a display system 10. The display system 10 includes a display portion 20 and a host 30. The display system 10 has a function of displaying video on the display portion 20 on the basis of various signals output from the host 30. In this specification and the like, "video" is a term including not only a moving image but also an image. That is, the term "video" in this specification and the like can be changed into the term "image" in some cases. The signals output from the host 30 to the display portion 20 include data corresponding to video displayed on the display portion 20 (hereinafter also referred to as image data).

The display portion 20 has a function of displaying video on the basis of the image data input from the host 30. The display portion 20 includes a pixel portion 21, a driver circuit 23, a driver circuit 24, a signal generation circuit 25, and a level shifter 26.

The pixel portion 21 includes plurality of pixels 22 and has a function of displaying video. The pixel 22 includes a display element and has a function of displaying a predetermined gray level. The gray level displayed by the pixel 22 is controlled by signals output from the driver circuits 23 and 24, whereby a predetermined video is displayed on the pixel portion 21.

Figure 2A:
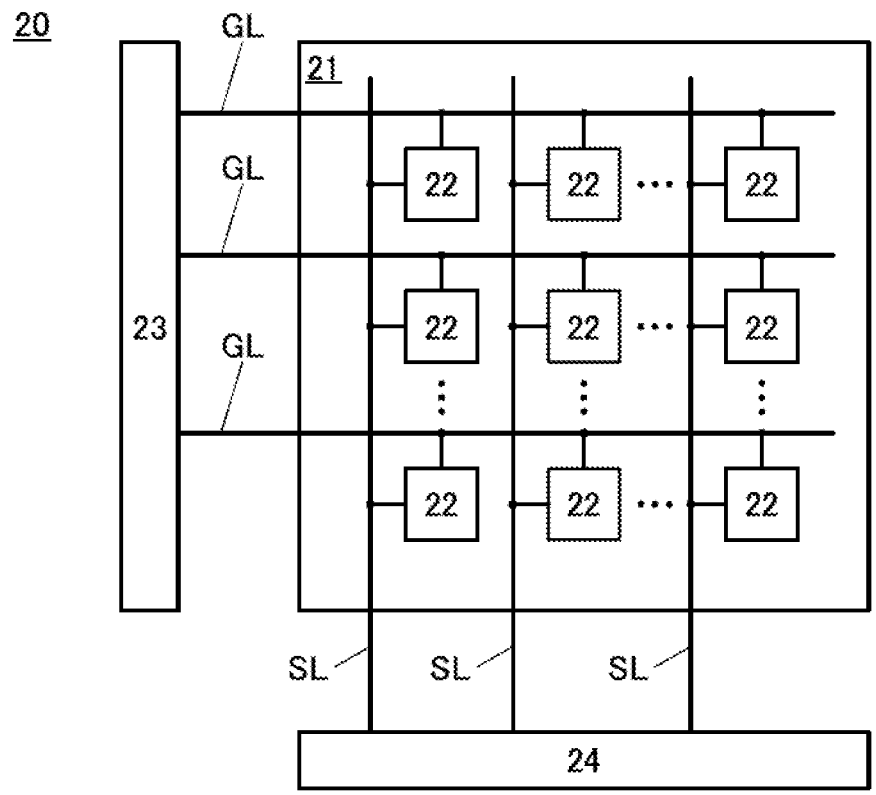

FIG. 2A illustrates a configuration example of the pixel portion 21. The pixels 22 are connected to wirings SL and wirings GL. The wirings GL and the wirings SL are respectively connected to the driver circuit 23 and the driver circuit 24.

The driver circuit 23 has a function of supplying a selection signal to the pixel 22 when a signal for displaying video (hereinafter also referred to as a video signal) is input to the pixel 22. Specifically, the driver circuit 23 has a function of supplying a selection signal to the wirings GL, and the wirings GL each have a function of transmitting the selection signal output from the driver circuit 23.

The driver circuit 24 has a function of supplying a video signal to the pixel 22. Specifically, the driver circuit 24 has a function of supplying a video signal to the wirings SL, and the wirings SL each have a function of transmitting the video signal output from the driver circuit 24. When the video signal is supplied to the pixel 22 to which the selection signal is supplied from the driver circuit 23, the video signal is written to the pixel.

Examples of the display element in the pixel 22 include a liquid crystal element and a light-emitting element. As the liquid crystal element, a transmissive liquid crystal element, a reflective liquid crystal element, a transflective liquid crystal element, or the like can be used. Alternatively, for example, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used as the display element. Examples of the light-emitting element include a self-luminous element such as an organic light-emitting diode (OLED), a light-emitting diode (LED), a quantum-dot light-emitting diode (QLED), and a semiconductor laser.

Figures 1, 2B:
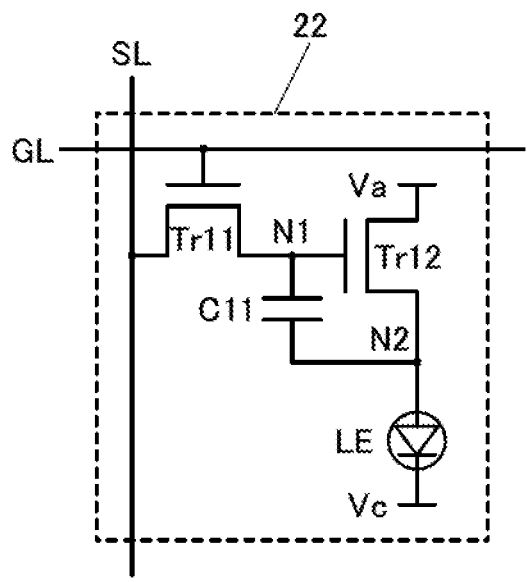

FIG. 2B-1 illustrates a configuration example of the pixel 22 using a light-emitting element. The pixel 22 illustrated in FIG. 2B-1 includes a transistor Tr11, a transistor Tr12, a capacitor C11, and a light-emitting element LE. Note that although the transistors Tr11 and Tr12 are n-channel transistors here, the polarity of the transistors can be changed as appropriate.

A gate of the transistor Tr11 is connected to the wiring GL, one of a source and a drain of the transistor Tr11 is connected to a gate of the transistor Tr12 and one electrode of the capacitor C11, and the other of the source and the drain of the transistor Tr11 is connected to the wiring SL. One of a source and a drain of the transistor Tr12 is connected to the other electrode of the capacitor C11 and one electrode of the light-emitting element LE and the other of the source and the drain of the transistor Tr12 is connected to a wiring to which a potential $V_a$ is supplied. The other electrode of the light-emitting element LE is connected to a wiring to which a potential $V_c$ is supplied. A node which is connected to the one of the source and the drain of the transistor Tr11, the gate of the transistor Tr12, and the one electrode of the capacitor C11 is referred to as a node N1. A node which is connected to the one of the source and the drain of the transistor Tr12 and the other electrode of the capacitor C11 is referred to as a node N2.

Here, the case where the potential $V_a$ is a high power supply potential and the potential $V_c$ is a low power supply potential is described. The capacitor C11 functions as a storage capacitor for holding the potential of the node N2.

Note that a source of a transistor in this specification and the like means a source region that is part of a semiconductor layer functioning as a channel region, a source electrode connected to the semiconductor layer, or the like. Similarly, a drain of a transistor means a drain region that is part of the semiconductor layer, a drain electrode connected to the semiconductor layer, or the like. A gate means a gate electrode or the like.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although the connection relationship of the transistor is described assuming that the source and the drain are fixed in some cases for convenience, actually, the names of the source and the drain interchange with each other depending on the relationship of the potentials.

The transistor Tr11 has a function of controlling supply of the potential of the wiring SL to the node N1. Specifically, the potential of the wiring GL is controlled to turn on the transistors Tr11, whereby the potential of the wiring SL corresponding to a video signal is supplied to the node N1, and thus is written to the pixel 22. Then, the potential of the wiring GL is controlled to turn off the transistor Tr11, whereby the potential of the node N1 is held.

The amount of current flowing between the source and the drain of the transistor Tr12 is controlled in accordance with the voltage between the nodes N1 and N2. The light-emitting element LE emits light with a luminance depending on the amount of flowing current. Accordingly, the gray level of the pixel 22 can be controlled. Note that the transistor Tr12 preferably operates in a saturation region.

Figures 2, 2B:
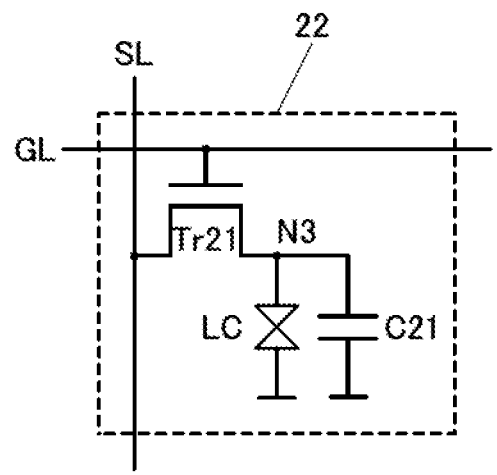

FIG. 2B-2 illustrates a configuration example of a pixel using a liquid crystal element. The pixel 22 illustrated in FIG. 2B-2 includes a transistor Tr21, a capacitor C21, and a liquid crystal element LC. Note that although the transistor Tr21 is an n-channel transistor here, the polarity of the transistor can be changed as appropriate.

A gate of the transistor Tr21 is connected to the wiring GL, one of a source and a drain of the transistor Tr21 is connected to one electrode of the liquid crystal element LC and one electrode of the capacitor C21, and the other of the source and the drain of the transistor Tr21 is connected to the wiring SL. The other electrode of the liquid crystal element LC and the other electrode of the capacitor C21 are each connected to a wiring to which a predetermined potential is supplied. A node which is connected to the one of the source and the drain of the transistor Tr21, the one electrode of the liquid crystal element LC, and the one electrode of the capacitor C21 is a node N3.

The potential of the other electrode of the liquid crystal element LC may be a common potential among a plurality of pixels 22 or may be the same potential as the other electrode of the capacitor C21. The potential of the other electrode of the liquid crystal element LC may differ between the pixels 22. The capacitor C21 functions as a storage capacitor for holding the potential of the node N3.

The transistor Tr21 has a function of controlling supply of the potential of the wiring SL to the node N3. Specifically, the potential of the wiring GL is controlled to turn on the transistor Tr21, whereby the potential of the wiring SL is supplied to the node N3 and is written to the pixel 22. Then, the potential of the wiring GL is controlled to turn off the transistor Tr21, whereby the potential of the node N3 is held.

The liquid crystal element LC includes a pair of electrodes and a liquid crystal layer containing a liquid crystal material to which the voltage between the pair of electrodes is applied. The alignment of liquid crystal molecules included in the liquid crystal element LC changes in accordance with the value of the voltage applied between the pair of electrodes, and thus the transmittance of the liquid crystal layer is changed. Therefore, when the potential supplied from the wiring SL to the node N3 is controlled, the gray level of the pixel 22 can be controlled.

The above operation is performed for the wirings GL one by one, whereby video for a first frame can be displayed.

The selection of the wirings GL may be performed by either progressive scan or interlaced scan. The supply of video signals to the wirings SL may be performed by dot sequential driving in which the video signals are sequentially supplied to the wirings SL, or line sequential driving in which the video signals are concurrently supplied to all the wirings SL. Alternatively, supply of video signals may be performed for every plural wirings SL.

Next, in a second frame period, video is displayed by an operation similar to that of a first frame period. Thus, the video displayed on the pixel portion 21 is rewritten.

The signal generation circuit 25 illustrated in FIG. 1 has a function of generating a video signal on the basis of image data input from the host 30. The video signal generated by the signal generation circuit 25 is output to the driver circuit 24. The signal generation circuit 25 has a function of generating a timing signal for controlling a timing at which the driver circuit 23 outputs a selection signal and a timing signal for controlling a timing at which the driver circuit 24 outputs a video signal.

The level shifter 26 has a function of shifting the level of an input signal. Specifically, the level shifter 26 has a function of converting a potential output from the signal generation circuit 25 into a potential used for the driver circuit 23. When a timing signal is input from the signal generation circuit 25 to the level shifter 26, the level shifter 26 amplifies the timing signal and outputs it to the driver circuit 23. The amplified timing signal is used for generation of a selection signal in the driver circuit 23. In the case where a negative potential is used for the driver circuit 23, for example, in the case where display is performed using a liquid crystal element, the negative potential is generated by the level shifter 26. Note that the level shifter 26 may be included in the driver circuit 23.

The host 30 has a function of controlling video displayed on the display portion 20 by generating various signals output to the display portion 20. The host 30 includes a processor 31, a graphics processing unit (GPU) 32, a memory device 33, an interface 34, and an interface 35. The processor 31, the GPU 32, the memory device 33, the interface 34, and the interface 35 are electrically connected to each other through a system bus 36.

The processor 31 functions as an arithmetic device and a controller and controls the operation of various circuits provided in the host 30. As the processor 31, a central processing unit (CPU), a microprocessor unit (MPU), or the like can be used.

The GPU 32 has a function of performing image processing for generating image data. In performing image processing, the host 30 can use the processor 31 as a processor for general processing and the GPU 32 as a processor for graphics processing. In the case where complicated processing such as two-dimensional or three-dimensional image processing which needs a large amount of arithmetic operation is required, the load on the processor 31 can be reduced by performing such a processing by the GPU 32.

The memory device 33 has a function of storing data used for processing in the host 30. As the memory device 33, a volatile memory such as a dynamic random access memory (DRAM) or a static random access memory (SRAM) or a nonvolatile memory such as a flash memory, a magnetic memory device (hard disk drive, a magnetic memory, or the like), or a read only memory (ROM) can be used. Alternatively, both the volatile memory and the nonvolatile memory can be used. Alternatively, a memory device including an OS transistor, which is described below, can be used as the memory device 33.

The interface 34 has a function of communicating with the display portion 20. Specifically, the interface 34 has a function of transmitting a signal to the display portion 20 or receiving a signal input from the display portion 20. Image data generated in the host 30 is output to the signal generation circuit 25 through the interface 34.

The interface 35 has a function of communicating with a device 40 provided outside the host 30. Specifically, the interface 35 has a function of transmitting a signal to the device 40 or receiving a signal input from the device 40. For example, an input device such as a keyboard or a mouse, a memory device such as a hard disk drive (HDD) or a solid state drive (SSD), or a sensor such as an external light sensor, an image sensor, a microphone, or an antenna can be used as the device 40.

The configuration of the host 30 illustrated in FIG. 1 is an example, and a device and a circuit in the host 30 can be appropriately changed. The host 30 may include a plurality of memory devices that are different from each other in operation speed or capacitance, for example. Alternatively, the host 30 may include a plurality of interfaces 35 that communicate with different devices 40. The host 30 does not necessarily include the GPU 32 in accordance with the content of image processing.

As described above, the display portion 20 and the host 30 constitute the display system 10.

Various circuits in the display portion 20 each include a transistor. Here, a glass substrate is often used as a substrate of the display portion 20. In this case, the transistors are formed using a semiconductor film deposited over the glass substrate. However, the characteristics of the transistors can be varied due to unevenness on the surface of the glass substrate, non-uniformity of crystallinity of the semiconductor film, or the like. Furthermore, when miniaturization of a transistor is required for increasing the density of the pixel portion 21, the influence of variation in the characteristics of the transistors among the pixels 22 becomes large, and thus the quality of video can be degraded. Such a problem is particularly prominent in the application that requires an extremely high pixel density such as virtual reality (VR), augmented reality (AR), or the like.

By a chip on glass (COG) method, a chip on film (COF) method, or the like, the driver circuit 23, the driver circuit 24, the signal generation circuit 25, and the level shifter 26 can be provided over the glass substrate over which the pixel portion 21 is formed. However, when a chip and the glass substrate are bonded to each other, the degree of precision of attachment can be a problem. In addition, wirings for connecting the circuits formed over the glass substrate and the chip are needed, so that a problem such as signal delay or an increase in power consumption due to complicated wirings can arise.

Here, in one embodiment of the present invention, a semiconductor substrate is used as the substrate of the display portion 20 and a transistor in the display portion 20 is formed using the semiconductor substrate. For example, a transistor used for the pixel 22 is formed using the semiconductor substrate. In this way, variation in the characteristics of the transistors among the pixels 22 is reduced and pixel density can be increased by miniaturization of a transistor. Moreover, transistors used for the driver circuit 23, the driver circuit 24, the signal generation circuit 25, and the level shifter 26 can be formed using the semiconductor substrate. As a result, these circuits can be formed directly on the substrate of the display portion 20, whereby bonding of the chip and the substrate is unnecessary. Furthermore, these circuits can be easily connected to each other on the semiconductor substrate, so that signal delay or an increase in power consumption due to complicated wirings can be prevented.

In addition, in one embodiment of the present invention, some of the circuits in the display portion 20 that need high withstand voltage can include OS transistors. An OS transistor has higher withstand voltage than a transistor containing silicon in a channel region (hereinafter also referred to as a Si transistor), for example, so that an OS transistor is favorably used for a circuit to which a high voltage is applied such as the level shifter 26. Furthermore, an OS transistor can be stacked over the circuit formed using the semiconductor substrate. Accordingly, the area of the display portion 20 and the area of the semiconductor substrate can be reduced, leading to cost reduction.

Alternatively, a Si transistor with high withstand voltage can be used for a circuit that needs high withstand voltage by a process in which the Si transistor with high withstand voltage and a minute Si transistor are formed on the same semiconductor substrate. However, in general, a special process is necessary to form a Si transistor with high withstand voltage, and the special process is developed after a next-generation miniaturization process is developed in some cases. That is, the process capable of forming a Si transistor with high withstand voltage is developed later than the development of the miniaturization process in some cases. Therefore, when a Si transistor with high withstand voltage and a minute Si transistor are formed on the same semiconductor substrate, there is a possibility that the next-generation process for forming a minute Si transistor cannot be employed. In such a case, a previous-generation process for forming a minute Si transistor needs to be employed. By contrast, when an OS transistor is stacked over a minute Si transistor as described above, a Si transistor with high withstand voltage is unnecessary. Accordingly, a Si transistor can be sufficiently miniaturized.

Figure 3:
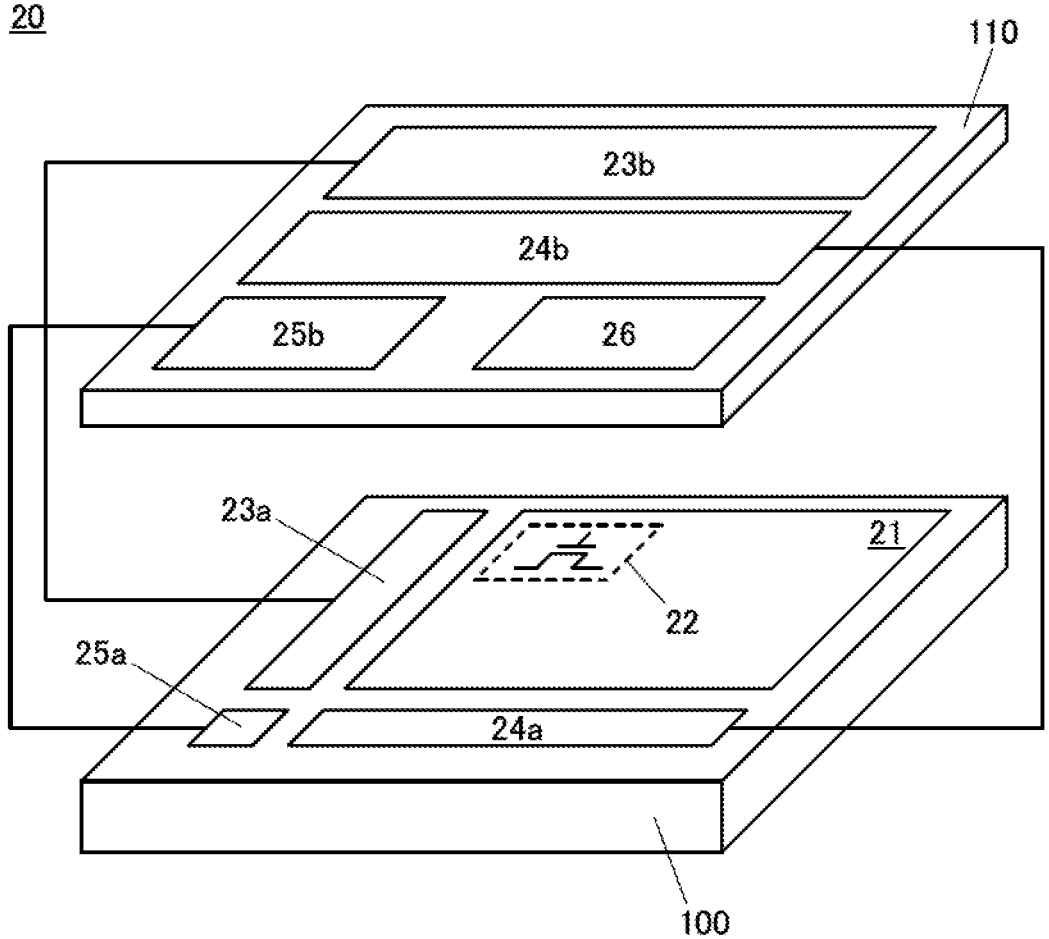
FIG. 3 illustrates a configuration example of a display portion.

A specific example of the display portion 20 with the above configuration is described below. FIG. 3 illustrates a configuration example of the display portion 20. The display portion 20 illustrated in FIG. 3 includes a semiconductor substrate 100 and an insulating layer 110. The pixel 22, a circuit 23a, a circuit 24a, and a circuit 25a are provided on the semiconductor substrate 100. A circuit 23b, a circuit 24b, a circuit 25b, and the level shifter 26 are provided over the insulating layer 110.

The circuits 23a and 23b constitute the driver circuit 23. That is, one of the circuits that constitute the driver circuit 23 is provided on the semiconductor substrate 100 and the other is provided over the insulating layer 110. Similarly, the circuits 24a and 24b constitute the driver circuit 24, and the circuits 25a and 25b constitute the signal generation circuit 25. The circuit 23a, the circuit 24a, and the circuit 25a are respectively connected to the circuit 23b, the circuit 24b, and the circuit 25b through a wiring.

Transistors of the pixel 22, the circuit 23a, the circuit 24a, and the circuit 25a are formed using the semiconductor substrate 100 and channel regions of the transistors are formed in the semiconductor substrate 100. The transistor formed using the semiconductor substrate 100 is excellent in integration, uniformity of characteristics, operation speed, and the like.

Since the transistor formed using the semiconductor substrate 100 is used for the pixel 22, the pixel portion 21 with high pixel density in which variation in the characteristics of the transistors among the pixels 22 is small can be formed. Moreover, since the transistors formed using the semiconductor substrate 100 are used for the circuit 23a, the circuit 24a, and the circuit 25a, circuits in the driver circuit 23, the driver circuit 24, and the signal generation circuit 25 can be miniaturized, can have uniform characteristics, or can operate at high speed. Furthermore, connection between the circuits or connection between the circuits and the pixel 22 can be simplified.

The material of the semiconductor substrate 100 is not particularly limited as long as a channel region of a transistor can be formed therein. For example, a single crystal semiconductor substrate, a single crystal germanium substrate, a compound semiconductor substrate (a SiC substrate, a GaN substrate, or the like), or a silicon on insulator (SOI) substrate can be used. As the SOI substrate, the following substrate may be used: a separation by implanted oxygen (SIMOX) substrate which is formed in such a manner that after an oxygen ion is implanted into a mirror-polished wafer, an oxide layer is formed at a certain depth from the surface by high-temperature annealing and eliminating defects generated in a surface layer, or an SOI substrate formed by using a Smart-Cut method in which a semiconductor substrate is cleaved by utilizing growth of a minute void, which is formed by implantation of a hydrogen ion, by thermal treatment; an epitaxial layer transfer (ELTRAN: a registered trademark) method; or the like. A transistor formed using a single crystal substrate contains a single crystal semiconductor in a channel region.

On the contrary, transistors of the circuit 23b, the circuit 24b, the circuit 25b, and the level shifter 26 are formed over the insulating layer 110 and channel regions of the transistors are formed in a semiconductor film deposited over the insulating layer 110. As the semiconductor film, a film containing a metal oxide is preferably used.

An OS transistor has higher withstand voltage than a Si transistor or the like. Thus, circuits that need particularly high withstand voltage in the level shifter 26, the driver circuit 23, the driver circuit 24, and the signal generation circuit 25 are preferably formed using OS transistors.

Because a metal oxide has a larger energy gap and a lower minority carrier density than a semiconductor such as silicon, a current flowing between a source and a drain of an OS transistor when the OS transistor is in an off state (hereinafter such a current is also referred to as an off-state current) is extremely low. Accordingly, when the circuit 25b formed using an OS transistor is used as a memory circuit in the signal generation circuit 25, for example, data can be held for a long time as compared with when a Si transistor or the like is used. Accordingly, even in a period in which power supply to the memory device is stopped, data can be held. Furthermore, operation when data writing is performed at predetermined intervals (refresh operation) is unnecessary or the frequency of the refresh operation can be extremely low. Thus, the memory device included in the display portion 20 is preferably formed using the OS transistor provided over the insulating layer 110.

As described above, the circuit in the display portion 20 can be formed in accordance with desired characteristics by using a transistor formed using the semiconductor substrate 100 and an OS transistor.

Furthermore, an OS transistor can be stacked over the transistor formed using the semiconductor substrate 100. Therefore, as illustrated in FIG. 3, the circuit provided over the insulating layer 110 can be stacked over the circuit provided on the semiconductor substrate 100 so as to have a region overlapping with the circuit provided on the semiconductor substrate 100. Consequently, the area of the display portion 20 can be reduced.

The driver circuits 23 and 24 may be formed using not OS transistors but the transistors formed using the semiconductor substrate 100. In this case, the circuits 23b and 24b are omitted.

Transistors used for the circuit 23b, the circuit 24b, the circuit 25b, and the level shifter 26 are not limited to OS transistors. As a material of a semiconductor film, a non-single-crystal semiconductor (non-single-crystal silicon such as amorphous silicon, microcrystalline silicon, or polycrystalline silicon, non-single-crystal germanium such as amorphous germanium, microcrystalline germanium, or polycrystalline germanium, or the like), a compound semiconductor such as gallium arsenide, an organic semiconductor, or the like can be used.

Figure 4:
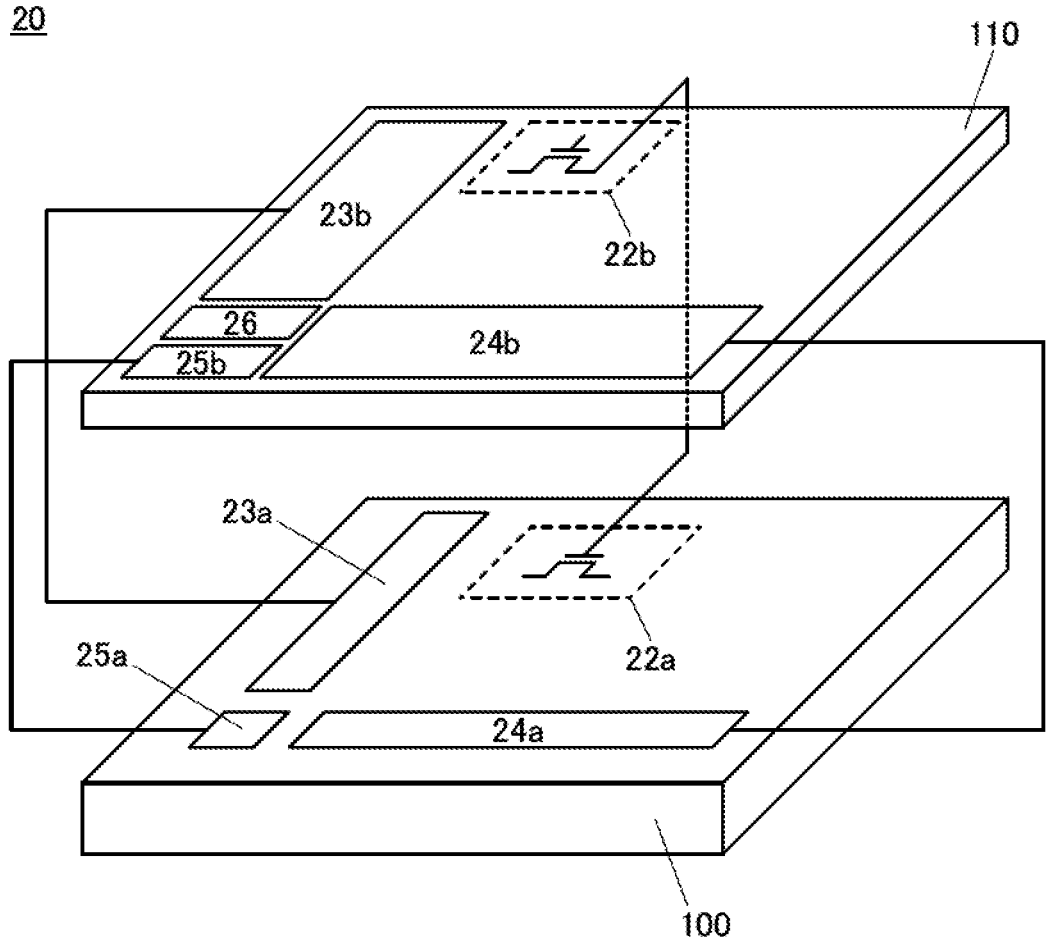
FIG. 4 illustrates a configuration example of a display portion.

Although FIG. 3 illustrates an example in which a transistor in the pixel 22 is formed using the semiconductor substrate 100, the configuration of the pixel 22 is not limited thereto. For example, a circuit 22a including one transistor of the pixel 22 can be formed on the semiconductor substrate 100, and a circuit 22b including the other transistor of the pixel 22 can be formed over the insulating layer 110 as illustrated in FIG. 4. The transistor Tr11 in FIG. 2B-1 can be formed over the insulating layer 110 and the transistor Tr12 in FIG. 2B-1 can be formed using the semiconductor substrate 100, for example.

The transistor Tr11 is preferably a transistor having a low off-state current because the transistor Tr11 has a function of holding charge. The transistor Tr12 is preferably a transistor capable of high-speed operation because the transistor Tr12 has a function of supplying a current for controlling whether the light-emitting element LE emits light or not. Thus, the pixel 22 capable of storing a video signal for a long time and operating at high speed can be formed by using the OS transistor formed over the insulating layer 110 as the transistor Tr11 and the transistor formed on the semiconductor substrate 100 as the transistor Tr12.

Figure 5:
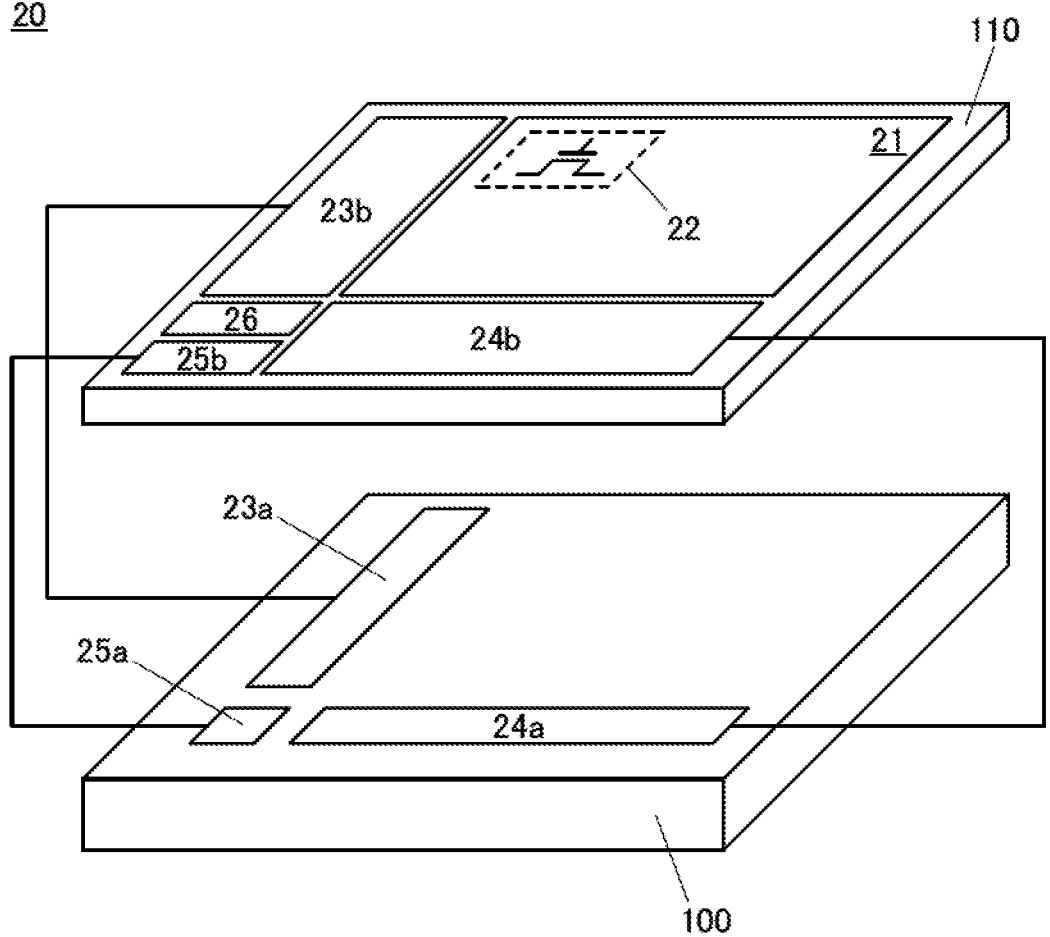
FIG. 5 illustrates a configuration example of a display portion.

Alternatively, all the transistors in the pixel 22 can be provided over the insulating layer 110 as illustrated in FIG. 5. In the case where the transistors Tr11 and Tr12 in FIG. 2B-1 are OS transistors or the transistor Tr21 in FIG. 2B-2 is an OS transistor, for example, the pixel portion 21 is provided over the insulating layer 110 as illustrated in FIG. 5. With this configuration, an additional space can be provided on the semiconductor substrate 100, so that the circuit 23a, the circuit 24a, and the circuit 25a can have higher performance or another circuit can be added.

In the case where the transistor Tr11 or Tr21 is an OS transistor, a video signal can be held in the pixel 22 for an extremely long time. Consequently, when there is no change in the video displayed on the display portion 21, or when the change is below a certain level, the frequency of updating a video signal can be extremely low. The frequency of updating a video signal is more than or equal to once every day and less than 0.1 times every second, preferably more than or equal to once every hour and less than once every second, more preferably more than or equal to once every 30 seconds and less than once every second, for example.

As described above, in one embodiment of the present invention, the display portion 20 is formed using transistors provided using the semiconductor substrate 100 and transistors provided over the insulating layer 110, whereby circuits in the display portion 20 can have higher withstand voltage, higher operation speed, and higher reliability or the circuit can be miniaturized.

<Configuration Example of Driver Circuit>

Figure 6A:
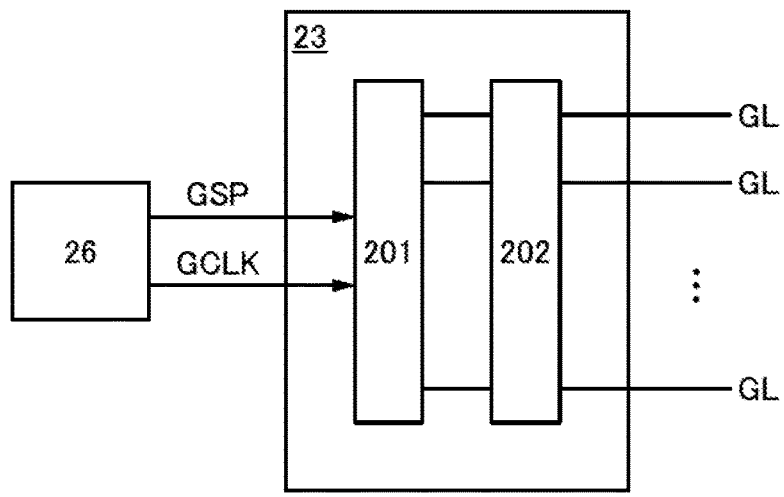
FIGS. 6A and 6B illustrate a configuration example of a driver circuit.

FIG. 6A illustrates a configuration example of the driver circuit 23. The driver circuit 23 includes a shift register 201 and a buffer 202. When a timing signal (a start pulse GSP, a clock signal GCLK, or the like) is supplied to the shift register 201, a selection signal is supplied from the driver circuit 23 to the wiring GL. The shift register 201 and the buffer 202 are formed using transistors. The timing signal amplified by the level shifter 26 is input to the shift register 201 as the start pulse GSP.

FIG. 6A illustrates a configuration in which the timing signals amplified by the level shifter 26 are input to the shift register 201 as the start pulse GSP and the clock signal GCLK. In this case, OS transistors with high withstand voltage are preferably used for the shift register 201 and the buffer 202 in addition to the level shifter 26.

Alternatively, the level shifter 26 may be omitted and a signal output from the shift register 201 may be amplified by the buffer 202. In this case, the buffer 202 also functions as a level shifter, so that the buffer 202 is preferably formed using an OS transistor with high withstand voltage. On the contrary, since the shift register 201 does not need high withstand voltage, a circuit capable of operating at a constant voltage can be used. Thus, the shift register 201 can be formed as the circuit 23a and the buffer 202 can be formed as the circuit 23b in FIGS. 3 to 5, for example.

Alternatively, the buffer 202 may be used as the level shifter 26 in FIG. 1. In this case, the level shifter 26 is included in the driver circuit 23.

Figure 6B:
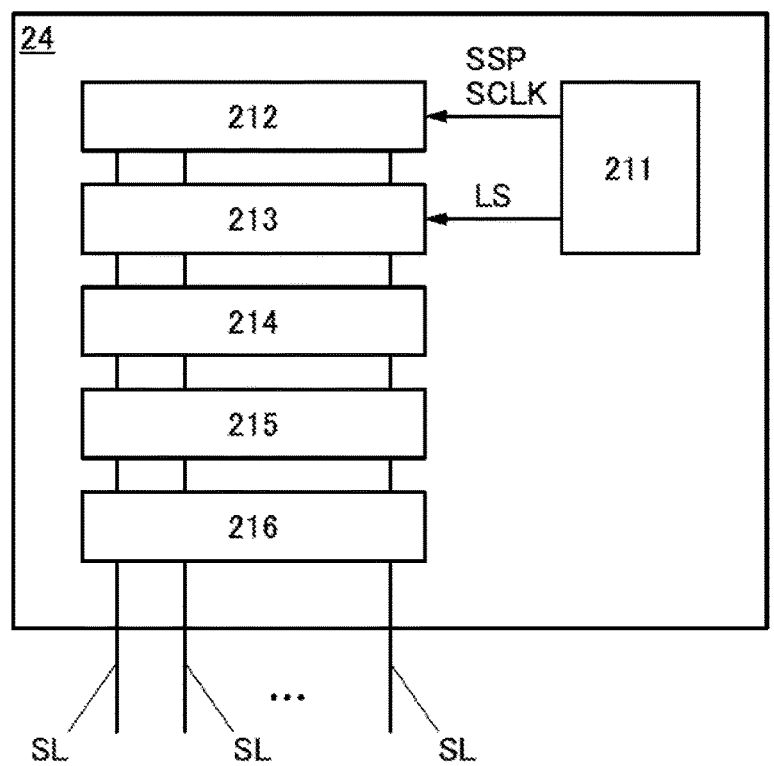

FIG. 6B illustrates a configuration example of the driver circuit 24. The driver circuit 24 includes a controller 211, a shift register 212, a latch circuit 213, a level shifter 214, a pass transistor logic circuit 215, and an amplifier circuit 216.

The controller 211 has a function of controlling the operation of the shift register 212 and the latch circuit 213. Specifically, the controller 211 has a function of generating various signals such as a start pulse SSP and a clock signal SCLK for controlling the operation of the shift register 212. In addition, the controller 211 has a function of generating various signals such as a latch signal LS for controlling the operation of the latch circuit 213.

The shift register 212 has a function of controlling timing of sampling of a video signal in the latch circuit 213 in accordance with various control signals such as the start pulse SSP and the clock signal SCLK. Specifically, the shift register 212 generates a sampling signal in accordance with various control signals such as the start pulse SSP and the clock signal SCLK and outputs it to the latch circuit 213.

The latch circuit 213 has a function of sampling and holding a video signal. Specifically, the latch circuit 213 samples a video signal in accordance with the sampling signal generated in the shift register 212 and holds the video signal. Then, the latch circuit 213 outputs the held video signal to the level shifter 214 in accordance with the latch signal LS supplied from the controller 211.

The level shifter 214 has a function of changing the potential level of the video signal output from the latch circuit 213. That is, the level shifter 214 has a level shift function.

The pass transistor logic circuit 215 has a function of converting the video signal whose level is shifted in the level shifter 214 from a digital signal to an analog signal. The video signal input to the pass transistor logic circuit 215 includes data on the polarity of the potential supplied to the wiring SL. The pass transistor logic circuit 215 has a function of determining the polarity of the potential of the video signal in accordance with the data on the polarity when converting the video signal from a digital signal to an analog signal.

The amplifier circuit 216 has a function of converting the signal input from the pass transistor logic circuit 215 and outputting it to the wiring SL.

The voltage handled by the driver circuit 24 is lower than the voltage handled by the driver circuit 23 in many cases, and the driver circuit 24 preferably operates at high speed. Thus, the circuits in the driver circuit 24 are preferably provided on the semiconductor substrate 100 in FIGS. 3 to 5. Note that in the case where high withstand voltage of the level shifter 214 and/or the amplifier circuit 216 has priority, those circuits can be formed using OS transistors provided over the insulating layer 110. This configuration allows the level shifter 214 and/or the amplifier circuit 216 to have higher withstand voltage. Accordingly, the controller 211, the shift register 212, the latch circuit 213, and the pass transistor logic circuit 215 can be collectively provided as the circuit 24a on the semiconductor substrate 100, and the level shifter 214 and the amplifier circuit 216 can be collectively provided as the circuit 24b over the insulating layer 110 in the display portion 20.

As described above, the driver circuit 23 or the driver circuit 24 can be formed using the transistor provided using the semiconductor substrate 100 and the transistor provided over the insulating layer 110.

<Configuration Example of Signal Generation Circuit>

Figure 7:
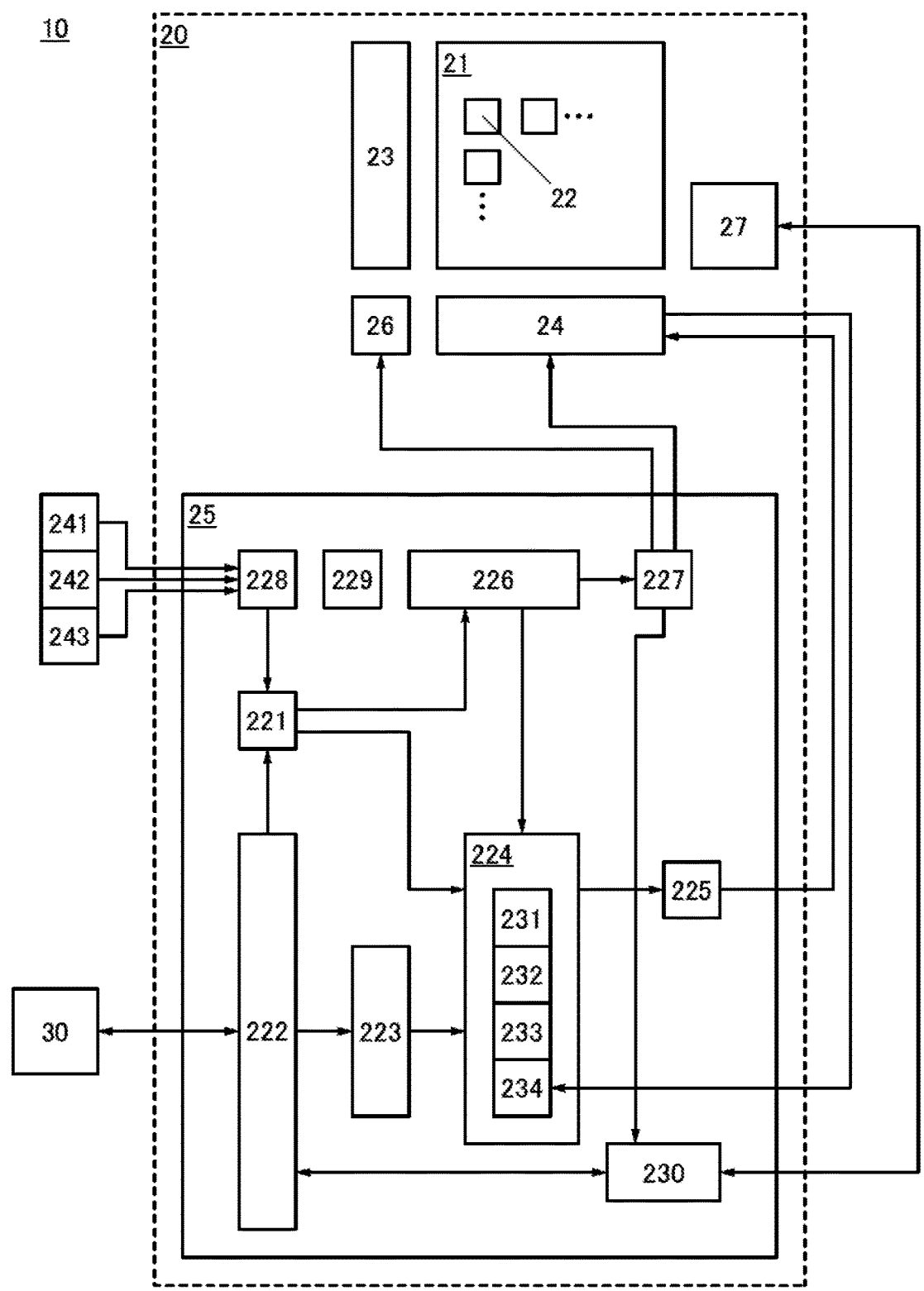
FIG. 7 illustrates a configuration example of a signal generation circuit.

FIG. 7 illustrates a specific configuration example of the signal generation circuit 25. The signal generation circuit 25 illustrated in FIG. 7 includes a controller 221, an interface 222, a frame memory 223, an image processing circuit 224, a memory device 225, a register 226, a timing controller 227, a sensor controller 228, a clock generation circuit 229, and a touch sensor controller 230.

The controller 221 has a function of controlling the operation of various circuits in the signal generation circuit 25. Specifically, the controller 221 has a function of generating a controlling signal for controlling the operation of a circuit such as the image processing circuit 224 or the register 226.

Note that the controller 221 may have a function of controlling power supply to the various circuits in the signal generation circuit 25. For example, when video is not displayed on the display portion 21, when there is no change in the displayed video, or the like, the controller 221 can stop the power supply to a circuit that is not required to operate (hereinafter such an operation is also referred to as power gating).

The interface 222 has a function of communicating with the host 30. Specifically, the interface 222 has a function of receiving a signal output from the host 30. Examples of the signal output from the host 30 to the signal generation circuit 25 include a signal including image data and various control signals. The interface 222 has a function of transmitting the signal generated in the signal generation circuit 25 to the host 30.

The frame memory 223 has a function of storing image data input to the signal generation circuit 25. In the case where image data input from the host 30 to the signal generation circuit 25 is compressed, compressed data is stored in the frame memory 223. The compressed data output from the frame memory 223 is decompressed by a decoder and then output to the image processing circuit 224. Alternatively, the decoder can be provided between the frame memory 223 and the interface 222.

The image processing circuit 224 has a function of performing image processing. Specifically, the image processing circuit 224 has a function of generating a video signal by performing various correction processing on image data. Examples of the correction processing performed in the image processing circuit 224 include processing in which the brightness of video is adjusted (dimming treatment), processing in which a color tone of video is adjusted (toning treatment), and gamma correction. FIG. 7 illustrates a configuration example in which the image processing circuit 224 includes a dimming circuit 231 having a function of performing dimming treatment, a toning circuit 232 having a function of performing toning treatment, and a gamma correction circuit 233 having a function of performing gamma correction.

The memory device 225 has a function of temporarily storing the video signal generated by the image processing circuit 224 and can be used as a line buffer. The video signal is output from the memory device 225 to the driver circuit 24.

The register 226 has a function of storing data used for the operation of the signal generation circuit 25. Specifically, the register 226 has a function of storing data used for various processing performed by the controller 221, a parameter used for image processing performed by the image processing circuit 224, a parameter used for generation of a timing signal by the timing controller 227, or the like The parameter used for image processing is output from the register 226 to the image processing circuit 224, and the image processing circuit 224 performs image processing on the basis of the parameter. The parameter used for generation of a timing signal is output from the register 226 to the timing controller 227, and the timing controller 227 generates a timing signal on the basis of the parameter. Accordingly, the content of image processing and the waveform of the timing signal can be controlled by changing the parameters stored in the register 226.

More specifically, the content of processing performed by the dimming circuit 231, the toning circuit 232, and the gamma correction circuit 233 can be controlled by changing parameters input to the circuits. When the content of processing is changed, the parameters stored in the register 226 are newly output to the dimming circuit 231, the toning circuit 232, and the gamma correction circuit 233.

The image processing circuit 224 may include a memory device for storing the parameter input from the register 226. In this case, an OS transistor is preferably used for the memory device. Accordingly, even in a period in which power supply to the image processing circuit 224 is stopped, the parameter can be held. In addition, after the power supply is restarted, image processing can be quickly restarted.

The timing controller 227 has a function of generating timing signals used in the driver circuit 23, the driver circuit 24, the touch sensor controller 230, and the like. The waveform of the timing signal is determined on the basis of the parameter stored in the register 226. The level of a timing signal input to the driver circuit 23 is shifted by the level shifter 26.

The sensor controller 228 has a function of generating a detection signal on the basis of the information detected by sensors connected to the sensor controller 228. For example, the sensor controller 228 can be connected to an optical sensor 241, an open/close sensor 242, and an acceleration sensor 243 as illustrated in FIG. 7. The optical sensor 241 has a function of detecting external light to generate a signal in accordance with the intensity of external light. The open/close sensor 242 has a function of detecting opening and closing of the display portion 20 to generate a signal in accordance with the opening and closing in the case where the display portion 20 is a foldable portable information terminal or the like. The acceleration sensor 243 has a function of detecting inclination of the display portion 20 to generate a signal in accordance with the inclination. A sensor used for measurement on the inclination is not limited to the acceleration sensor 243 and can be a gyro sensor, for example.

The sensor controller 228 generates a control signal on the basis of the signal generated by the optical sensor 241, the open/close sensor 242, or the acceleration sensor 243. The control signal generated by the sensor controller 228 is output to the controller 221. The controller 221 can control the dimming treatment performed by the image processing circuit 224 in accordance with the input control signal.

The clock generation circuit 229 has a function of generating a clock signal used in the signal generation circuit 25.

As illustrated in FIG. 7, a touch sensor unit 27 that has a function of detecting information on a touch (hereinafter also referred to as touch information), such as the presence or absence of a touch or the position of a touch may be provided in the display portion 20. In this case, the touch sensor controller 230 can be provided in the signal generation circuit 25.

The touch sensor controller 230 has a function of controlling the operation of the touch sensor unit 27. A signal including touch information detected by the touch sensor unit 27 is processed in the touch sensor controller 230 and transmitted to the host 30 through the interface 222. The host 30 can generate image data reflecting the touch information and transmit the image data to the signal generation circuit 25. Note that the signal generation circuit 25 may reflect the touch information in the image data. The touch sensor controller 230 may be provided in the touch sensor unit 27.

When the pixel 22 includes a light-emitting element, the driver circuit 24 may include a circuit (a current detection circuit) that has a function of detecting a current flowing through the light-emitting element. In this case, an EL correction circuit 234 may be provided in the image processing circuit 224. The EL correction circuit 234 has a function of correcting image data on the basis of the current flowing through the light-emitting element to adjust the luminance of the light-emitting element.

The image processing circuit 224 may include another processing circuit such as an RGB-RGBW conversion circuit depending on the specifications of the display portion 20. The RGB-RGBW conversion circuit has a function of converting image data of red, green, and blue (RGB) into image signals of red, green, blue, and white (RGBW). That is, in the case where the display portion 20 includes pixels of four colors of RGBW, power consumption can be reduced by displaying a white (W) component in the image data using the white (W) pixel. Note that in the case where the display portion 20 includes pixels of four colors of RGBY, an RGB-RGBY (red, green, blue, and yellow) conversion circuit can be used, for example.

As illustrated in FIGS. 3 to 5, the signal generation circuit 25 can be formed using the transistor provided on the semiconductor substrate 100 and the transistor provided over the insulating layer 110. Therefore, memory devices or the like, which store data, in the frame memory 223, the memory device 225, the register 226, and/or the image processing circuit 224 can be formed using OS transistors over the insulating layer 110 and the other circuits can be formed on the semiconductor substrate 100. Each of the circuits in the signal generation circuit 25 illustrated in FIG. 7 may be formed using the transistor provided on the semiconductor substrate 100 and the transistor provided over the insulating layer 110.

[Parameter]

In the image processing in the image processing circuit 224, input image data X is corrected (e.g., dimmed, toned, or gamma corrected) and correction data Y is generated. Any method can be employed for the correction depending on the content or accuracy of the correction. Correction by a table method and correction by a function approximation method are described here as examples.

Figure 8A:
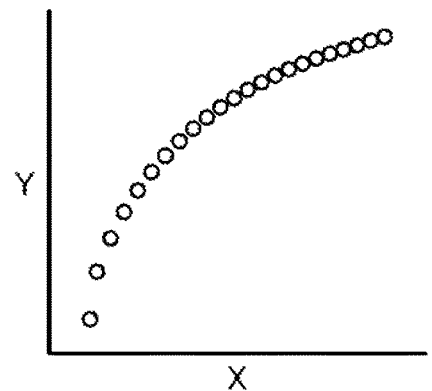
FIGS. 8A to 8C each show an example of correction.

In a table method, as illustrated in FIG. 8A, the correction data Y corresponding to the image data X that may be input to the image processing circuit 224 is prepared in advance, and the correction data Y corresponding to the input image data X is output. When this method is employed, a look-up table that lists the correspondence between the image data X and the correction data Y is stored in the register 226 as a parameter.

Since a look-up table is used in a table method, a relatively large number of parameters are necessary for correction. However, the correction data Y corresponding to the image data X can be independently set, which leads to high-accuracy correction.

Figure 8B:
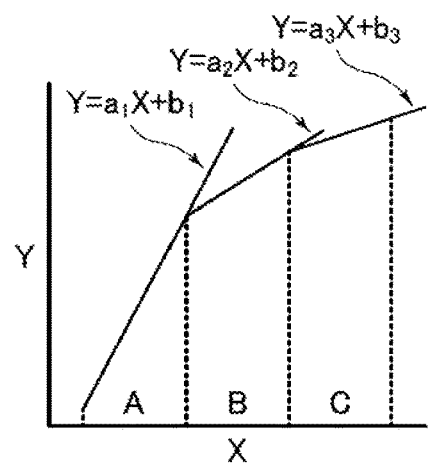

When the correction data Y corresponding to the image data X can be empirically determined in advance, in contrast, a function approximation method can be used. In a function approximation method, the range of the image data X that may be input to the image processing circuit 224 is divided into a plurality of regions, and the relation between the image data X and the correction data Y is defined with an approximate expression in each region. In FIG. 8B, the range of X is divided into regions A, B, and C, and the relation between the image data X and the correction data Y in each region is approximated with a straight line. When the image data X is input to the image processing circuit 224, the correction data Y is calculated on the basis of an approximate line of the region where the input image data X belongs.

When a function approximation method is used, which is shown in FIG. 8B, the number of divided regions, values $a_1$, $a_2$, $a_3$, $b_1$, $b_2$, and $b_3$ for defining straight lines, and the like are stored in the register 226 as correction parameters.

In a function approximation method, the correction data Y is calculated by approximation; thus, the accuracy of the correction by a function approximation method is lower than that of the correction by a table method. However, the number of parameters necessary for correction is smaller in a function approximation method than in a table approximation method, which can reduce the amount of data stored in the register 226.

Note that the number of divided regions used in a function approximation method is not limited. The larger the number of divided regions is, the higher the accuracy of correction can be; the smaller the number of divided regions is, the easier the correction can be. Although approximation using a linear function is described here, approximation using a nonlinear function may be employed.

As described above, the image processing circuit 224 can perform image processing with the use of the parameters stored in the register 226.

Figure 8C:
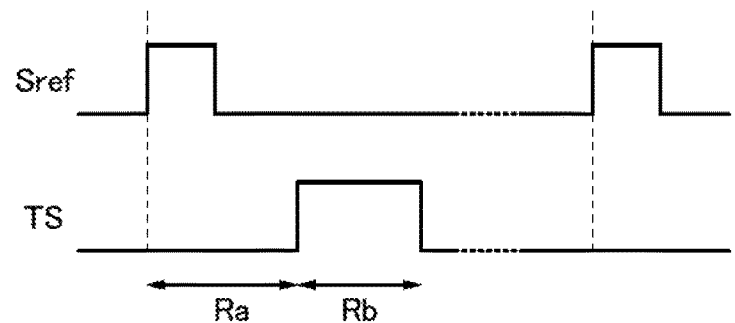

In addition, the timing controller 227 can generate a timing signal with the use of the parameters stored in the register 226. FIG. 8C shows an operation example of the timing controller 227 that generates a timing signal. A signal Sref is a reference signal input to the timing controller 227 and a signal TS is a timing signal generated by the timing controller 227.

The timing controller 227 can change the waveform of the signal TS by setting the timing at which the signal TS changes from low level to high level and the timing at which the signal TS changes from high level to low level with the reference signal Sref as a reference. Setting of the timing is performed using parameters input from the register 226. In FIG. 8C, Ra is a parameter that defines a period in which the reference signal Sref is set to high level and then the signal TS is set to low level, and Rb is a parameter that defines a period in which the signal TS remains at high level after the signal TS is set to high level after the period corresponding to Ra. Therefore, the waveform of the timing signal generated by the timing controller 227 can be changed by changing the parameter input from the register 226.

Note that a parameter other than the above parameters can be stored in the register 226. Examples of another parameter that can be stored in the register 226 include the data in the EL correction circuit 234, luminance and tones of video and energy saving settings (time taken to make display dark or turn off display) that are determined by a user, and the sensitivity of the touch sensor controller 230.

[Power Gating]

When there is no change in image data input from the host 30, or when the change is below a certain level, the controller 221 can stop power supply to some circuits in the signal generation circuit 25 (e.g., the frame memory 223, the image processing circuit 224, the memory device 225, the register 226, and the timing controller 227). In this case, a signal that indicates no change in the image data is transmitted from the host 30 to the signal generation circuit 25 and power gating can be performed by the controller 221 on the basis of the signal, for example.

Note that a circuit subjected to the power gating is not limited to the circuits in the signal generation circuit 25. For example, power gating may be performed on the driver circuit 23, the driver circuit 24, or the level shifter 26.

In the case where power gating is performed on the frame memory 223, the memory device 225, or the register 226, these memory devices are preferably formed using OS transistors. Accordingly, even in a period in which power supply is stopped, stored data can be held. In addition, after the power supply is restarted, generation of a video signal can be quickly restarted. Note that when the image processing circuit 224 includes a memory device for storing a parameter, the memory device is also formed using an OS transistor, preferably.

The memory device formed using an OS transistor of the circuits in the signal generation circuit 25 can be provided over the insulating layer 110 in FIGS. 3 to 5, and the other circuits can be provided on the semiconductor substrate 100. With this configuration, the signal generation circuit 25 can be formed on the same substrate as the pixel portion 21, the driver circuit 23, the driver circuit 24, and the level shifter 26, so that transmission and reception of a video signal and a timing signal can be performed quickly.

[Configuration Example of Memory Device]

FIG. 9A illustrates a configuration example of a memory device 250 that can be used as a memory device in the frame memory 223, the memory device 225, or the image processing circuit 224. The memory device 250 includes a control portion 251, a cell array 252, and a peripheral circuit 253. The peripheral circuit 253 includes a sense amplifier circuit 254, a driver circuit 255, a main amplifier 256, and an input/output circuit 257.

The control portion 251 has a function of controlling the memory device 250. For example, the control portion 251 has a function of controlling the driver circuit 255, the main amplifier 256, and the input/output circuit 257.

A plurality of wirings WL and CSEL are connected to the driver circuit 255. The driver circuit 255 generates signals output to a plurality of wirings WL and CSEL.

The cell array 252 includes a plurality of memory cells 258. The memory cells 258 are connected to wirings WL, LBL (or LBLB), and BGL. The wiring WL is a word line. The wirings LBL and LBLB are local bit lines. Although a folded-bit-line method is employed for the configuration of the cell array 252 in the example of FIG. 9A, an open-bit-line method can also be employed.

FIG. 9B illustrates a configuration example of the memory cell 258. The memory cell 258 includes a transistor MW1 and a capacitor CS1. The memory cell 258 has a circuit configuration similar to that of a memory cell for a dynamic random access memory (DRAM). The transistor MW1 in this example is a transistor having a back gate. The back gate of the transistor MW1 is connected to a wiring BGL. A potential $V_{bg}$ is input to the wiring BGL.

The transistor MW1 is an OS transistor. Since an OS transistor has an extremely low off-state current, the frequency of refresh operation of the memory device 250 can be reduced because leakage of charge from the capacitor CS1 can be suppressed by forming the memory cell 258 using an OS transistor. The memory device 250 can retain image data for a long time even when power supply is stopped. Moreover, by setting the potential $V_{bg}$ to a negative potential, the threshold voltage of the transistor MW1 can be shifted to the positive potential side and thus the retention time of the memory cell 258 can be increased.

Here, an off-state current refers to a current that flows between a source and a drain of a transistor in an off state. The off-state current of an OS transistor normalized on the channel width can be, for example, lower than or equal to $10 \times 10^{-21}$ A/μm (10 zA/μm) with a source-drain voltage of 10 V at room temperature (approximately 25° C.). It is preferable that the off-state current of the OS transistor used as the transistor MW1 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the off-state current is preferably lower than or equal to $1 \times 10^{-15}$ A, lower than or equal to $1 \times 10^{-18}$ A, or lower than or equal to $1 \times 10^{-21}$ A at 85° C.

A metal oxide contained in a channel region of an OS transistor is preferably an oxide semiconductor containing at least one of indium (In) and zinc (Zn). Typical examples of the metal oxide include an In oxide, a Zn oxide, an In—Zn oxide, and an In-M-Zn oxide (element M is Al, Ti, Ga, Y, Zr, La, Ce, Nd, or Hf). A reduction in impurities serving as electron donors, such as hydrogen, and a reduction in oxygen vacancies can make a metal oxide i-type (intrinsic) or substantially i-type. Such a metal oxide can be referred to as a highly purified metal oxide. The carrier density of the metal oxide can be, for example, lower than $8 \times 10^{15}$ cm$^{-3}$, preferably lower than $1 \times 10^{11}$ cm$^{-3}$, further preferably lower than $1 \times 10^{10}$ cm$^{-3}$ and higher than or equal to $1 \times 10^{-9}$ cm$^{-3}$.

The metal oxide has a large energy gap. Electrons are unlikely to be excited, and the effective mass of a hole is large. Thus, an avalanche breakdown and the like are less likely to occur in some cases in an OS transistor than in a Si transistor. Since hot-carrier degradation or the like due to the avalanche breakdown is inhibited, the OS transistor has high drain withstand voltage and can be driven at high drain voltage. Thus, when the OS transistor is used as the transistor MW1, the range of potentials to be held in the capacitor CS1 can be widened.

The cell array 252 is stacked over the sense amplifier circuit 254. The sense amplifier circuit 254 includes a plurality of sense amplifiers SA. The sense amplifiers SA are electrically connected to adjacent wirings LBL and LBLB (a pair of local bit lines), wirings GBL and GBLB (a pair of global bit lines), and a plurality of wirings CSEL. The sense amplifiers SA have a function of amplifying the potential difference between the wirings LBL and LBLB.

In the sense amplifier circuit 254, one wiring GBL is provided for four wirings LBL, and one wiring GBLB is provided for four wirings LBLB. However, the configuration of the sense amplifier circuit 254 is not limited to the configuration example of FIG. 9A.

The main amplifier 256 is connected to the sense amplifier circuit 254 and the input/output circuit 257. The main amplifier 256 has a function of amplifying the potential difference between the wirings GBL and GBLB. The main amplifier 256 is not necessarily provided.

The input/output circuit 257 has a function of outputting a potential corresponding to a write data to the wirings GBL and GBLB or the main amplifier 256 and a function of outputting the potentials of the wirings GBL and GBLB or an output potential of the main amplifier 256 to the outside as read data. The sense amplifier SA from which data is read and the sense amplifier SA to which data is written can be selected using the signal of the wiring CSEL. Therefore, there is no need to provide a selection circuit such as a multiplexer in the input/output circuit 257. Thus, the input/output circuit 257 can have a simple circuit configuration and a small occupied area.

As described above, with use of an OS transistor for the frame memory 223, image data can be held even in a period during which power supply is stopped. Therefore, in the case where power gating is performed on the memory device in the frame memory 223, the image processing circuit 224, or the memory device 225, generation of a video signal can be started before image data is input from the host 30 when power supply is restarted. That is, a video signal can be generated from the image data held in the memory device, so that power gating that enables quick start can be performed.

Note that the memory device 250 illustrated in FIGS. 9A and 9B can be provided in the image processing circuit 224 in FIG. 7. In this case, parameters used in the dimming circuit 231, the toning circuit 232, and the gamma correction circuit 233 can be stored in the memory device 250 in the image processing circuit 224. The parameters can be held in the memory device 250 in the image processing circuit 224 even in a period during which power supply to the image processing circuit 224 is stopped.

The transistors included in the circuits other than the memory cell 258 may be transistors other than an OS transistor, for example, transistors whose channel regions are formed in a semiconductor substrate. In this case, the memory cell 258 can be provided over the insulating layer 110 in FIGS. 3 to 5 and the other circuits can be provided on the semiconductor substrate 100.

The memory device 250 illustrated in FIGS. 9A and 9B can also be used as the memory device 33 in FIG. 1.

[Configuration Example of Register]

Figure 10:
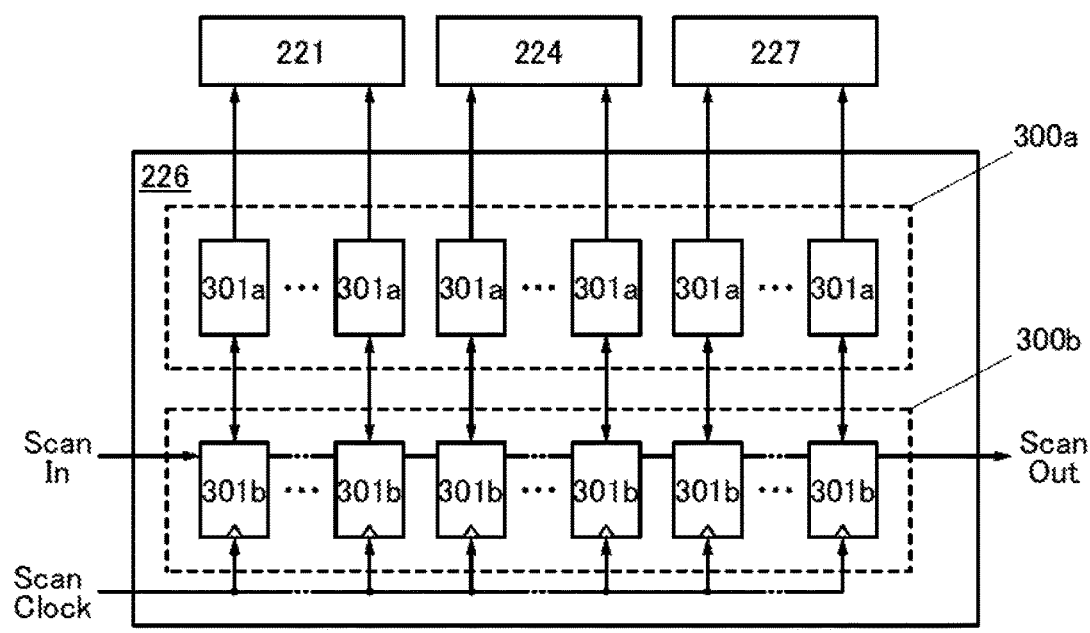
FIG. 10 illustrates a configuration example of a register.

FIG. 10 illustrates a specific configuration example of the register 226. The register 226 illustrated in FIG. 10 includes a register portion 300a and a register portion 300b. The register portion 300a includes a plurality of registers 301a. The register portion 300b includes a plurality of registers 301b. A scan chain register is formed by a plurality of registers 301b. Input data (data Scan In) and a scan clock signal (a signal Scan Clock) are input to the register portion 300b.

The register 301a is a volatile register. There is no particular limitation on the circuit configuration of the register 301a, and a latch circuit, a flip-flop circuit, or the like is used as long as data can be stored. Data is input to the controller 221, the image processing circuit 224, and the timing controller 227 from the register 301a corresponding to each of those. Then, the content of the processing of the controller 221, the image processing circuit 224, and the timing controller 227 is controlled in accordance with the data supplied from the register portion 300a.

The register 301b is preferably a nonvolatile register which does not lose data even when power is broken. Here, the register 301b is provided with a memory circuit including an OS transistor to be nonvolatile. Thus, data stored in the register 301b can be held even in a period during which power supply to the register 301b is stopped.

To update data stored in the register 226, first, data in the register portion 300b are changed. After the data in the registers 301b of the register portion 300b are rewritten, the data are loaded into the registers 301a of the register portion 300a at the same time. Accordingly, the controller 221, the image processing circuit 224, and the timing controller 227 can perform various kinds of processing using the data which are updated at the same time. The operation of the signal generation circuit 25 can be stable because simultaneity can be maintained in updating data.

In addition, owing to the register portion 300a and the register portion 300b, data in the register portion 300b can be updated even during operation of the image processing circuit 224 and the timing controller 227. Thus, the parameter stored in the register 226 can be changed in accordance with display conditions on a real-time basis, which leads to an effective reduction in power consumption.

By using a nonvolatile register as the register 301b, a parameter can be held in the register 226 even in a period during which power supply to the register 226 is stopped. At the time when power supply to the register 226 is stopped, power supply is stopped after data is stored (saved) in the register 301b. After the power supply is restored, normal operation is restarted after data that is stored in the registers 301b are restored (loaded) in the register 301a. Note that in the case where the data stored in the register 301a and the data stored in the register 301b do not match each other, it is preferable to save the data of the register 301a in the register 301b and then store the data again in the retention circuit of the register 301b. For example, while updated data is inserting in the register portion 300b, the data do not match each other.

Figure 11:
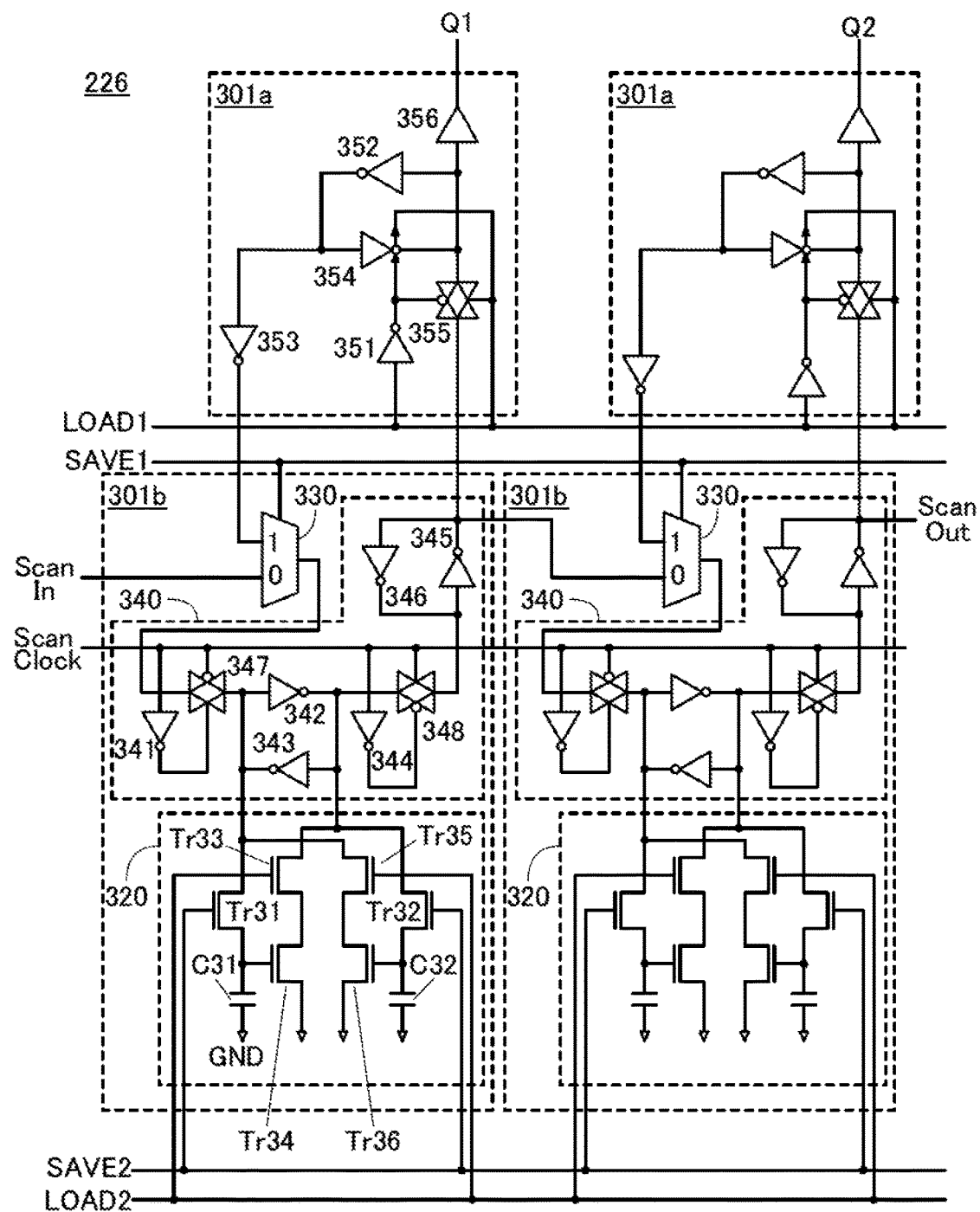
FIG. 11 illustrates a configuration example of a register.

FIG. 11 illustrates an example of a circuit configuration of the register 301a and the register 301b. FIG. 11 illustrates two registers 301b of the register portion 300b and corresponding two registers 301a.

The register 301a includes a retention circuit 320, a selector 330, and a flip-flop circuit 340. The selector 330 and the flip-flop circuit 340 constitute a scan flip-flop circuit.

A signal SAVE2 and a signal LOAD2 are input to the retention circuit 320. The retention circuit 320 includes a transistor Tr31, a transistor Tr32, a transistor Tr33, a transistor Tr34, a transistor Tr35, a transistor Tr36, a capacitor C31, and a capacitor C32. The transistor Tr31 and the transistor Tr32 are OS transistors. The transistor Tr31 and the transistor Tr32 may each be an OS transistor having a back gate.

A 3-transistor gain cell is formed by the transistor Tr31, the transistor Tr33, the transistor Tr34, and the capacitor C31. In a similar manner, a 3-transistor gain cell is formed by the transistor Tr32, the transistor Tr35, the transistor Tr36, and the capacitor C32. The two gain cells store complementary data held in the flip-flop circuit 340. One of a source and a drain of the transistor Tr31 is connected to the capacitor C31, and one of a source and a drain of the transistor Tr32 is connected to the capacitor C32. When the transistors Tr31 and Tr32, which are OS transistors here, are turned off, the charges accumulated in the capacitors C31 and C32 can be held for a long time. Thus, the data held in the register 226 is saved into the capacitors C31 and C32, whereby the data can be held for a long time in the register 226 even when power supply is stopped.

The transistors other than the transistors Tr31 and Tr32 can be formed using transistors whose channel regions are formed in a semiconductor substrate. Therefore, the transistors Tr31 and Tr32 can be provided over the insulating layer 110 in FIGS. 3 to 5, and the other transistors can be provided on the semiconductor substrate 100.

The retention circuit 320 stores complementary data held in the flip-flop circuit 340 in response to the signal SAVE2 and loads the held data in the flip-flop circuit 340 in response to the signal LOAD2.

An output terminal of the selector 330 is connected to an input terminal of the flip-flop circuit 340, and an input terminal of the register 301a is connected to a data output terminal. The flip-flop circuit 340 includes an inverter 341, an inverter 342, an inverter 343, an inverter 344, an inverter 345, an inverter 346, an analog switch 347, and an analog switch 348. The conduction state of each of the analog switch 347 and the analog switch 348 is controlled by a signal Scan Clock. The flip-flop circuit 340 is not limited to the circuit configuration in FIG. 11 and a variety of flip-flop circuits 340 can be employed.

An output terminal of the register 301a is connected to one of two input terminals of the selector 330, and an output terminal of the flip-flop circuit 340 in the previous stage is connected to the other input terminal of the selector 330. Note that data is input from the outside of the register 226 to the input terminal of the selector 330 in the previous stage of the register portion 300b.

The register 301a includes an inverter 351, an inverter 352, an inverter 353, a clocked inverter 354, an analog switch 355, and a buffer 356. The register 301a loads the data of the flip-flop circuit 340 on the basis of a signal LOAD1. The transistors of the register 301a may be formed using Si transistors.

Figure 12:
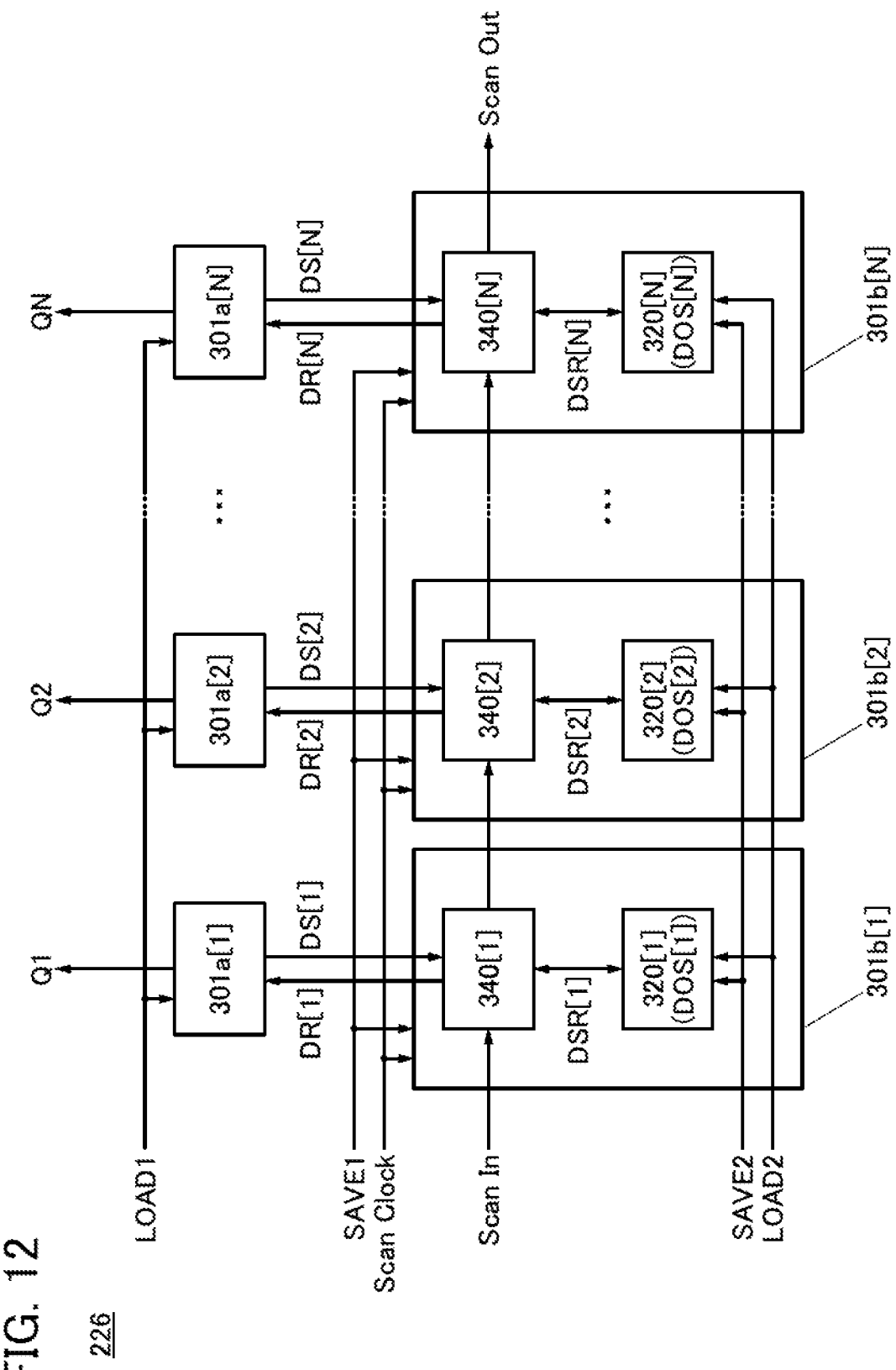
FIG. 12 illustrates a configuration example of a register.

Next, an operation example of the register 226 is described. FIG. 12 simply shows a configuration of the register 226 shown in FIG. 11. Described here is a case where the register 226 includes N registers 301a (301a[1] to 301a[N], N is an integer of 2 or more), N retention circuits 320 (320[1] to 320[N]), and N flip-flop circuit 340 (340[1] to 340[N]).

In FIG. 12, data DR indicates data output from the flip-flop circuit 340 to the register 301a, data DS indicates data output from the register 301a to the flip-flop circuit 340, data DSR indicates data input and output between the flip-flop circuit 340 and the retention circuit 320, and data DOS indicates data stored in the retention circuit 320. In addition, data Q1 to QN are output from the registers 301a[1] to 301a[N]. The data Q1 to QN correspond to parameters or the like output from the register 226.

Figure 13:
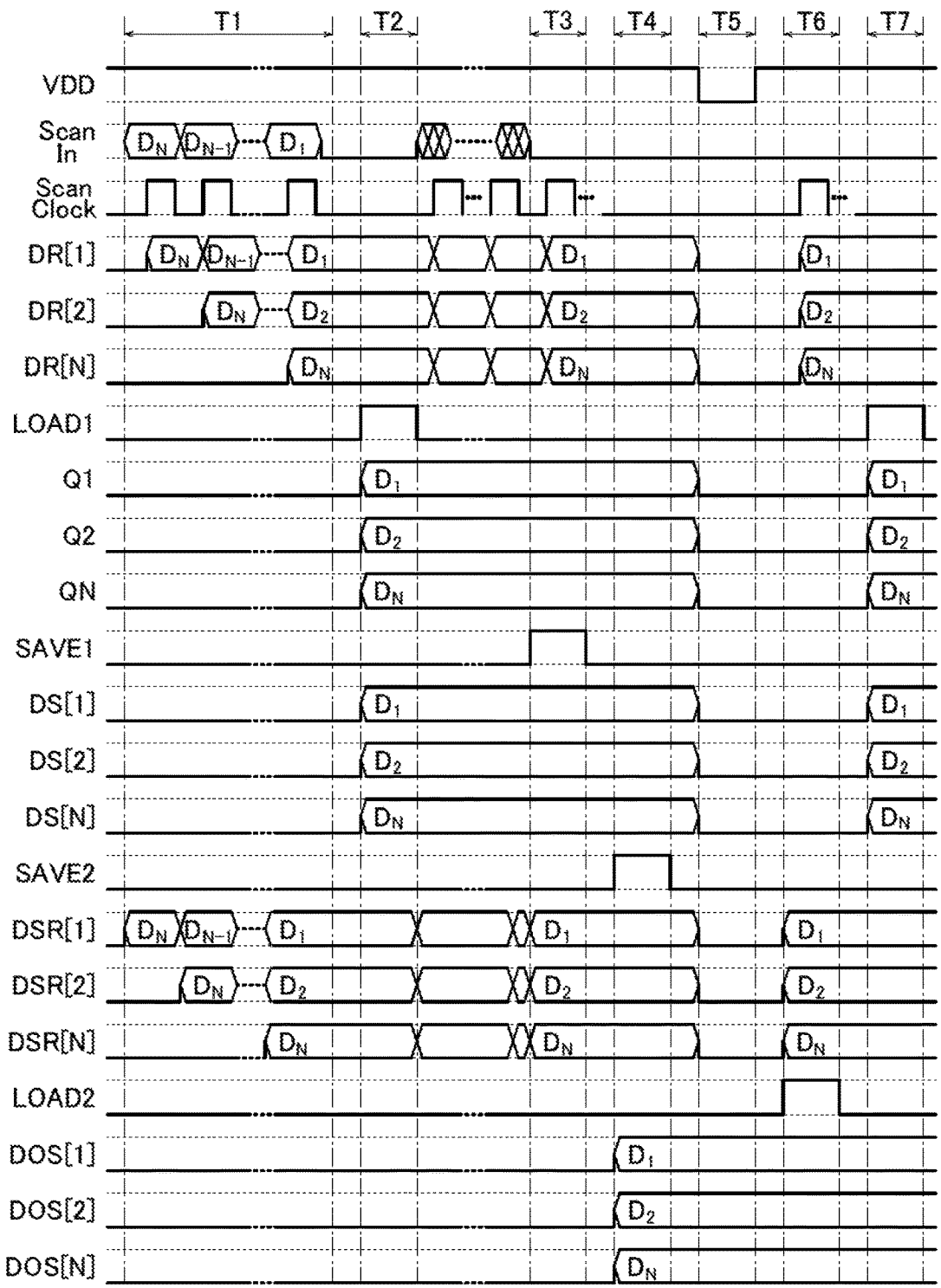
FIG. 13 is a timing chart.

FIG. 13 is a timing chart showing the operation example of the register 226 shown in FIG. 12. Described as an example is a case where the data $D_1$ to $D_N$ are stored in the flip-flop circuits 340[1] to 340[N].

First, in a period T1, the data $D_N$ to $D_1$ are sequentially input as the data Scan In, and the data $D_1$ to $D_N$ are stored in the flip-flop circuits 340[1] to 340[N]. As a result, the data $D_1$ to $D_N$ are output as the data DR[1] to DR[N] and the DSR[1] to DSR[N].

Next, in a period T2, the signal LOAD1 becomes high level. Thus, the data $D_1$ to $D_N$ output as the data DR[1] to DR[R] are stored in the registers 301a[1] to 301a[N]. As a result, the data $D_1$ to $D_N$ are output as the data Q1 to QN and data DS[1] to DS[N]. The data sequentially input as the data Scan In are output at one time as the data Q1 to QN. Thus, the parameters output from the register 226 are changed at one time.

Next, in a period T3, the signal SAVE1 becomes high level. Thus, the data $D_1$ to $D_N$ output as the data DS[1] to DS[R] are stored in the flip-flop circuits 340[1] to 340[N]. As a result, the data $D_1$ to $D_N$ are output as the data DR[1] to DR[N] and the data DSR[1] to DSR[N].

Note that as shown in FIG. 13, even when the data Scan In is changed and the data stored in the flip-flop circuits 340[1] to 340[N] are changed in a period between the period T2 and the period T3, the data Q1 to QN are not changed. Owing to the operation in the period T3, the data stored in the flip-flop circuits 340[1] to 340[N] can be overwritten with the data Q1 to QN, and the data stored in the registers 301a[1] to 3014[N] can be consistent with the data the data stored in the flip-flop circuits 340[1] to 340[N]. As a result, the data can be saved with the consistency maintained even when data saving which is described later is performed while the data stored in the flip-flop circuits 340[1] to 340[N] are updated. Moreover, recovery of the saved data can be performed at high speed.

Next, in a period T4, the signal SAVE2 becomes high level. Thus, the data $D_1$ to $D_N$ output as the data DSR[1] to DSR[N] are stored in the retention circuits 320[1] to 320[N]. In other words, the data stored in the flip-flop circuits 340[1] to 340[N] are saved in the retention circuits 320[1] to 320[N]. As a result, the data DOS[1] to DOS[N] becomes the data $D_1$ to $D_N$. Specifically, the potentials of the electrodes of the capacitors C31 and C32 in FIG. 11 become potentials corresponding to the data $D_1$ to $D_N$.

Next, in a period T5, the supply of a power supply potential VDD to the register 226 is stopped, so that data output from the registers 301a, the retention circuits 320, and the flip-flop circuits 340 are stopped. Note that the data DOS[1] to DOS[N] stored in the retention circuits 320 are held even in the period during which the power supply to the register 226 is stopped. Specifically, the potentials corresponding to the data $D_1$ to $D_N$ are held in the capacitors C31 and C32 in FIG. 11.

Next, in a period T6, the power supply to the register 226 is restarted and the signal LOAD2 becomes high level. At that time, the data $D_1$ to $D_N$ stored in the retention circuits 320 are output as the data DSR[1] to DSR[N] and stored in the flip-flop circuits 340[1] to 340[N]. In other words, the data saved in the retention circuits 320[1] to 320[N] are recovered in the flip-flop circuits 340[1] to 340[N]. As a result, the data $D_1$ to $D_N$ are output as the data DR[1] to DR[N].

Next, in a period T7, the signal LOAD1 becomes high level. Thus, the data $D_1$ to $D_N$ output as the data DR[1] to DR[N] are stored in the registers 301a[1] to 301a[N]. As a result, the data $D_1$ to $D_N$ are output as the data Q1 to QN and the data DS[1] to DS[N]. Then, the data recovered from the retention circuits 320[1] to 320[N] are output to the outside as the data Q1 to QN.

As described above, the register 226 can change the output to the outside at one time in accordance with the data sequentially input. In addition, the register 226 can retain the saved data in the period during which power supply is stopped.

<Configuration Example of Level Shifter>

Next, a configuration example of the level shifter is described. A level shifter described below is formed using the buffer 410 and the differential amplifier 420 and can be used as the level shifter 26 in FIG. 1.

[Buffer]

Figure 14A:
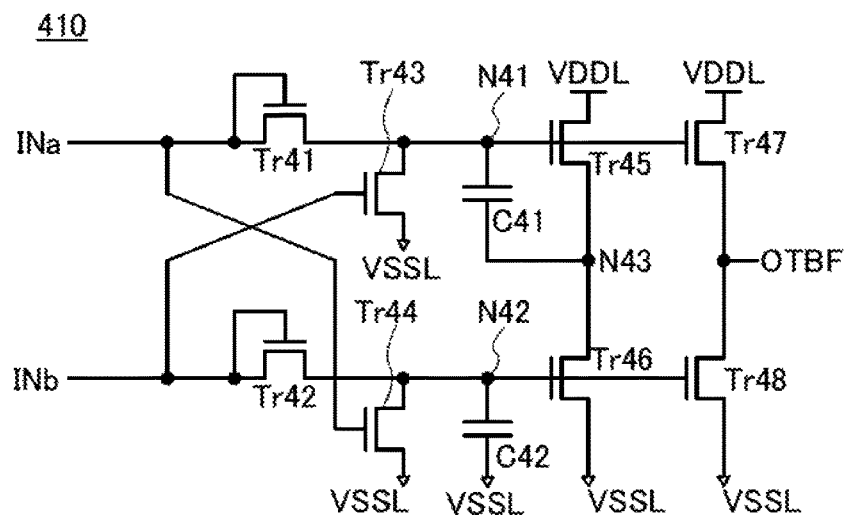
FIGS. 14A and 14B illustrate a configuration example and an operation example of a buffer.

FIG. 14A illustrates a configuration example of a buffer 410 used for a level shifter. The buffer 410 includes transistors Tr41 to Tr48, a capacitor C41, and a capacitor C42. Note that a node to which one terminal of the capacitor C41 and a gate of the transistor Tr45 are connected is referred to as a node N41. In addition, a node to which one terminal of the capacitor C42 and a gate of the transistor Tr46 are connected is referred to as a node N42.

The wiring VDDL is a wiring to which the potential VDD is supplied, and the wiring VSSL is a wiring to which the potential VSS is supplied. Note that the potential VDD is higher than the potential VSS.

Next, an operation example of the buffer 410 is described.

Figure 14B:
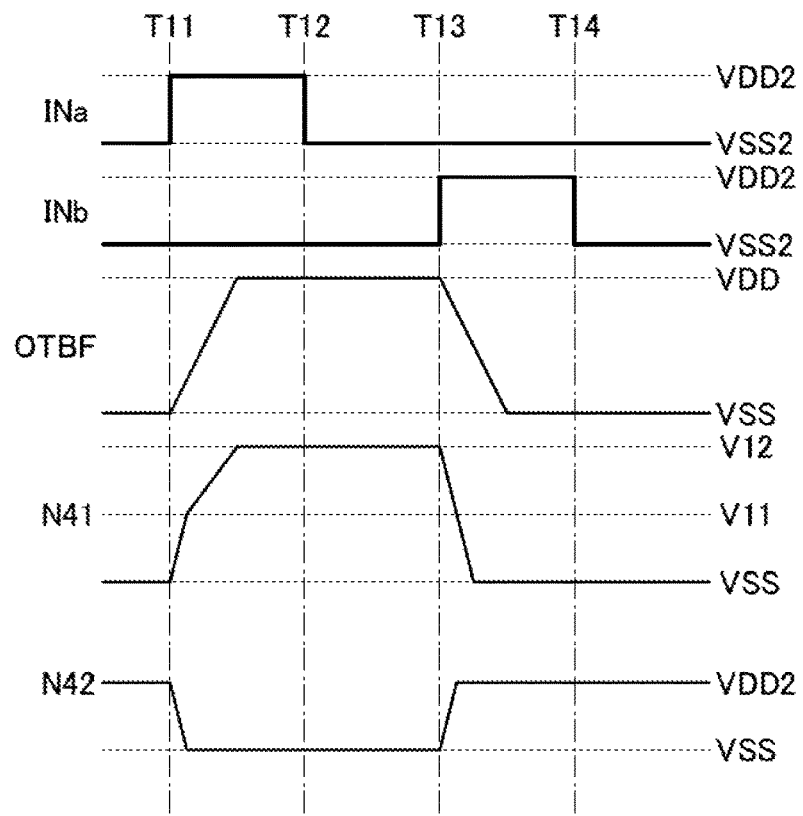

FIG. 14B is a timing chart showing an operation example of the buffer 410. The timing chart shows changes in potentials of the input terminal INa, the input terminal INb, the output terminal OTBF, the node N41, and the node N42 from a time T11 to a time T14.

To the input terminal INa, either a potential VSS2 as the low-level potential or a potential VDD2 as the high-level potential is applied. To the input terminal INb, either the potential VSS2 or the potential VDD2 is applied. The potential VSS2 is lower than the potential VSS or equivalent to the potential VSS. The potential VDD2 is a potential lower than the potential VDD. From the output terminal OTBF, either the potential VDD or the potential VSS is output depending on the potentials of the input terminal INa and the input terminal INb.

At the time T11, the potential VDD2 is input to the input terminal INa, and the potential VSS2 is input to the input terminal INb. The transistor Tr41 has a diode-connected structure. Thus, the potential of the node N41 increases (up to V11 in FIG. 14B). Since the potential VDD2 is applied to a gate of the transistor Tr44, the transistor Tr44 is turned on, and the potential of the node N42 decreases to the potential VSS. Since the potential VSS is applied to a gate of the transistor Tr43, the transistor Tr43 is turned off.

Here, the node N41 and the transistor Tr45 are focused on. Since the transistor Tr45 is in an on state, the potential of a node N43 gradually increases. In addition, since the transistor Tr46 is in an off state, the potential of the node N41 also increases (up to V12 in FIG. 14B). In other words, the potential of the gate of the transistor Tr45 increases, and accordingly, the amount of on-state current flowing through the transistor Tr45 increases. Thus, the potential of the node N43 increases to the potential VDD.

Since the potential of a gate of the transistor Tr47 is equivalent to the potential of the node N41, the amount of on-state current flowing through the transistor Tr47 increases with an increase in the potential of the node N43. Since the node N42 has the potential VSS, the transistor Tr48 is in an off state. Thus, the potential VDD is output from the output terminal OTBF.

At the time T12, the potential VSS2 is input to the input terminal INa. In addition, the potential VSS2 is input continuously since before the time T12 to the input terminal INb. The transistor Tr41 is in an off state due to the potential VSS2 input from the input terminal INa, and the transistor Tr42 is continuously in an off state due to the potential VSS2 input from the input terminal INb. In addition, since the potential VSS2 is input to the gate of the transistor Tr44, the transistor Tr44 is turned off. By the above operation, the node N41 and the node N42 are in a floating state, and the potentials of the node N41 and the node N42 are held. Thus, the potential output from the output terminal OTBF is not changed.

At the time T13, the potential VSS2 is input continuously since before the time T13 to the input terminal INa. The potential VDD2 is input to the input terminal INb. The transistor Tr42 has a diode-connected structure. Thus, the potential of the node N42 increases. The potential VDD2 is input to the gate of the transistor Tr43 from the input terminal INb, and accordingly the transistor Tr43 is turned on. The potential of the node N41 decreases to the potential VSS. The potential VDD2 is input to the gate of the transistor Tr46 from the input terminal INb, and accordingly the transistor Tr46 is turned on, and the potential of the node N43 decreases to the potential VSS.

Here, the transistor Tr48 is focused on. The potential VDD2 is input to a gate of the transistor Tr48 from the input terminal INb, and accordingly the transistor Tr48 is turned on. The potential output from the output terminal OTBF gradually decreases to the potential VSS.

At the time T14, the potential VSS2 is input continuously since before the time T14 to the input terminal INa. In addition, the potential VSS2 is input to the input terminal INb. The transistor Tr41 is continuously in an off state due to the potential VSS2 input from the input terminal INa, and the transistor Tr42 is in an off state due to the potential VSS2 input from the input terminal INb. Moreover, the potential VSS2 is input to the gate of the transistor Tr43, and accordingly, the transistor Tr43 is turned off. By the above operation, the node N41 and the node N42 are in a floating state, and the potentials of the node N41 and the node N42 are held. Thus, the potential output from the output terminal OTBF is not changed.

When the buffer 410 has a circuit configuration illustrated in FIG. 14A, the potential VDD or the potential GND can be output from the output terminal OTBF depending on the input potentials of the input terminal INa and the input terminal INb.

Note that the potential of the node N43 of the buffer 410 is not affected by the potential of the output terminal OTBF (e.g., the potential applied to the output terminal OTBF from the outside of the buffer 410). Thus, the potential that is stable can be output from the buffer 410.

[Differential Amplifier]

Figure 15A:
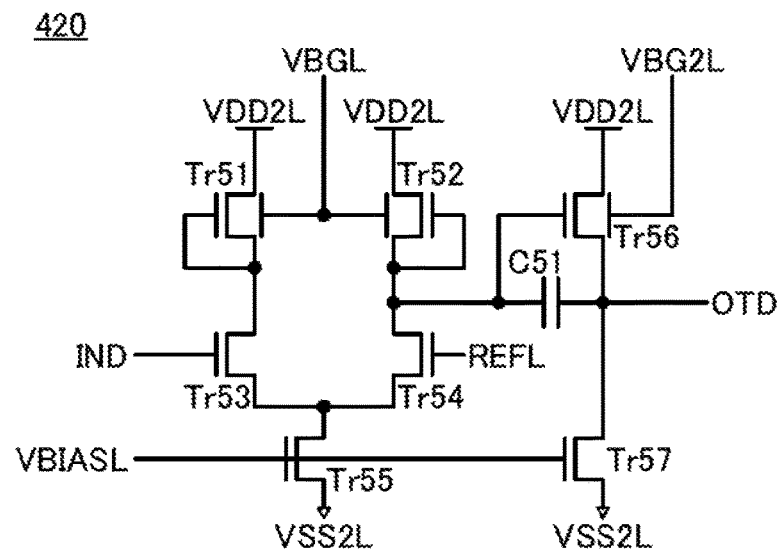
FIGS. 15A and 15B illustrate a configuration example and an operation example of a differential amplifier.

FIG. 15A illustrates a configuration example of a differential amplifier 420 used for a level shifter. The differential amplifier 420 includes transistors Tr51 to Tr57 and a capacitor C51.

Figure 15B:
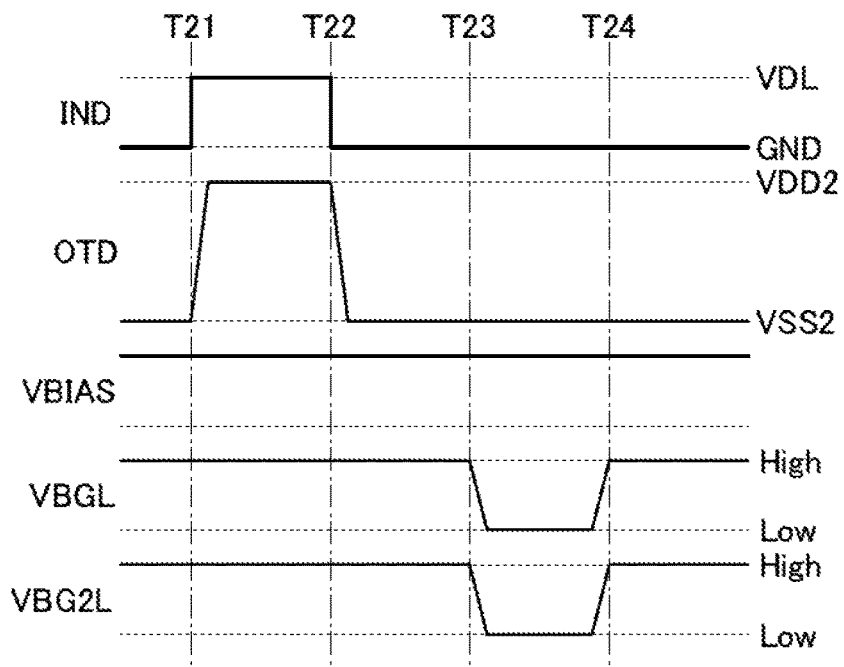

FIG. 15B is a timing chart showing the operation example of the differential amplifier 420. The timing chart shows changes in potentials of the input terminal IND, the output terminal OTD, the wiring VBIASL, the wiring VBGL, and the wiring VBG2L from a time T21 to a time 124.

To the input terminal IND, either a potential VDL as a high-level potential or the potential GND as a low-level potential is applied.

The wiring REFL is a wiring that supplies a reference potential, and the reference potential is compared with a potential input to the input terminal IND. In accordance with the comparison results, a potential output from the output terminal OTD is fixed to be either the potential VDD2 or the potential VSS2. Although there is a case where a potential that is lower than the potential VDD2 and higher than the potential VSS2 is output from the output terminal OTD, the potential output from the output terminal OTD is defined as the potential VDD2 or the potential VSS2 for convenience. Note that in this operation example, the reference potential is lower than the potential VDL and higher than the potential GND. For example, the reference potential may be assumed to be (potential VDL+potential GND)/2 and supplied from the wiring REFL.

The wiring VBGL is a wiring that supplies a potential to the back gates of the transistor Tr51 and the transistor Tr52. In particular, the potential of the wiring VBGL is set to high, whereby the transistor Tr51 and the transistor Tr52 each function as a current source. Specifically, a second terminal of the transistor Tr51 and the gate thereof have the same potential, and accordingly the voltage between a gate and a source of the transistor Tr51 is 0 V. At this time, the potential of the back gate of the transistor Tr51 is set to high, whereby the voltage-current characteristics of the transistor Tr51 can be shifted negatively and current flows when voltage is not applied to a gate of the transistor Tr51 (hereinafter, this state is referred to as normally-on state). Thus, even when the voltage between the gate and the source of the transistor Tr51 is 0 V, current flows from a first terminal to the second terminal of the transistor Tr51. The second terminal of the transistor Tr51 has a potential lower than the potential VDD2 by the threshold voltage of the transistor Tr51.

Furthermore, the voltage between a gate and a source of the transistor Tr52 is 0 V. Thus, the potential of the back gate of the transistor Tr52 is set to a high potential as in the above case, whereby the current flows from a first terminal to a second terminal of the transistor Tr52. The second terminal of the transistor Tr52 has a potential lower than the potential VDD2 by the threshold voltage of the transistor Tr52.

The wiring VBG2L is a wiring that supplies a potential to the back gate of the transistor Tr56. In particular, the potential of the wiring VBG2L is set to a high-level potential, whereby the transistor Tr56 functions as a current source. Specifically, when the potential of the back gate of the transistor Tr56 is set to a high-level potential, the transistor Tr56 can be in a normally-on state. Thus, even when the voltage between a gate and a source of the transistor Tr56, that is, the potential held at the capacitor C51, is 0 V, the current flows to the transistor Tr56.

The wiring VBIASL is a wiring that supplies an adjust potential so that the differential amplifier 420 operates appropriately.

At the time T21, the potential VDL is input to the input terminal IND. A high-level potential (denoted by High in FIG. 15B) is input to the wiring VBGL and the wiring VBG2L.

At this time, the potential of a gate of the transistor Tr53 is the potential VDL, which is higher than the reference potential of a gate of the transistor Tr54. Thus, the on-state current of the transistor Tr53 is higher than that of the transistor Tr54.

The on-state current of the transistor Tr55 is determined by the adjust potential applied to a gate of the transistor Tr55 and the potential of the source thereof. By Kirchhoff's low, the on-state current of the transistor Tr55 is equal to the sum of the on-state current of the transistor Tr53 and the on-state current of the transistor Tr54.

Since the high-level potential is applied to each of the back gates of the transistor Tr51 and the transistor Tr52, each of the transistor Tr51 and the transistor Tr52 functions as a current source. The on-state current of the transistor Tr54 is lower than that of the transistor Tr53, and thus, charge is held at one terminal of the capacitor C51. The one terminal of the capacitor C51 has a potential lower than the potential VDD2 by the threshold voltage of the transistor Tr52 (VDD2−$V_{th}$).

Here, the transistor Tr56 is focused on. The potential of the gate of the transistor Tr56 is substantially equivalent to that of the first terminal of the capacitor C51, i.e., VDD2−$V_{th}$. In addition, a high-level potential is applied to the back gate of the transistor Tr56, which makes the transistor Tr56 be in a normally-on state. Thus, the current flows to the transistor Tr56.

Since the adjust potential is applied to a gate of the transistor Tr57, the transistor Tr57 is turned on, and the current flows to the transistor Tr57. The on-state current of the transistor Tr56 is higher than that of the transistor Tr57 because VDD2−$V_{th}$ is applied to the gate of the transistor Tr56, and the high-level potential is applied to the back gate of the transistor Tr56. Thus, the potential output from the output terminal OTD is the potential VDD2.

At the time T22, the potential GND is input to the input terminal IND. The high-level potential is input continuously since before the time T22 to the wiring VBGL and the wiring VBG2L.

At this time, the potential of the gate of the transistor Tr53 is the potential GND, and accordingly, the on-state current of the transistor Tr53 is lower than that of the transistor Tr54. Although the transistor Tr53 becomes in an off state depending on the size of the transistor Tr53, in this operation, the on-state current lower than that of the transistor Tr54 flows in the transistor Tr53.

As described above, the on-state current of the transistor Tr55 is equal to the sum of the on-state current of the transistor Tr53 and the on-state current of the transistor Tr54. However, the on-state current of the transistor Tr54 is higher than that of the transistor Tr53, and the charge held at the first terminal of the capacitor C51 is discharged; accordingly, the potential of the one terminal of the capacitor C51 decreases to the potential close to the potential VSS2.

Here, the transistor Tr56 is focused on. The potential of the gate of the transistor Tr56 is substantially equivalent to the potential of the first terminal of the capacitor C51, that is, the potential close to the potential VSS2. Thus, the on-state current of the transistor Tr56 is lower than that immediately before the time T22.

Since the adjust potential is applied to the gate of the transistor Tr57, the transistor Tr57 is in an on state, and the current flows from a first terminal to a second terminal of the transistor Tr57 continuously since before the time T22. The on-state current of the transistor Tr57 is higher than that of the transistor Tr56, and thus, the potential output from the output terminal OTD is the potential VSS2.

At the time T23, the low-level potential is applied to the wiring VBGL and the wiring VBG2L. That is, the low-level potential is applied to each of the back gates of the transistor Tr51, the transistor Tr52, and the transistor Tr56, and accordingly, each of the transistor Tr51, the transistor Tr52, and the transistor Tr56 becomes in an off state. By this operation, the shoot-through current flowing through the transistor Tr51, the transistor Tr52, and the transistor Tr56 is reduced, and the power consumption of the differential amplifier 420 can be reduced. In other words, in the case where the potential of the input terminal IND is the potential GND, the potentials of the wiring VBGL and the wiring VBG2L are set to the low-level potential, whereby lower power consumption can be achieved.

[Level Shifter]

Figure 16A:
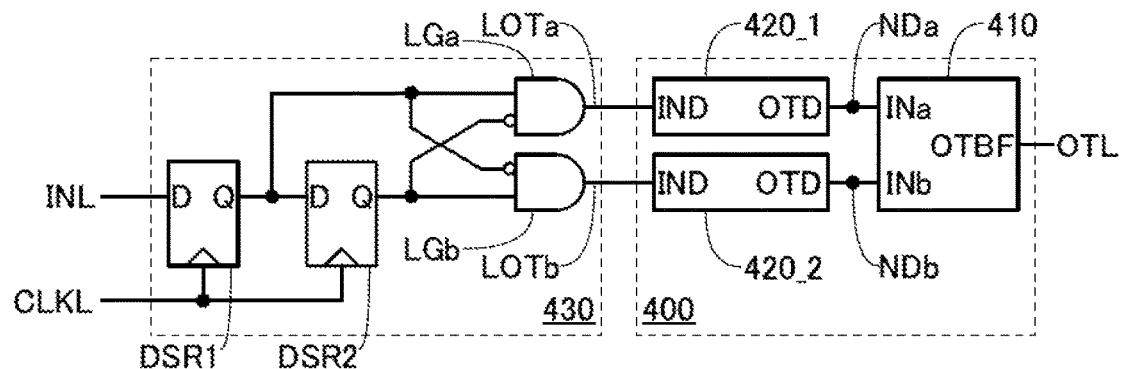
FIGS. 16A and 16B illustrate a configuration example and an operation example of a level shifter.

Next, a configuration example of the level shifter 400 using the buffer 410 and the differential amplifier 420 is described. FIG. 16A illustrates a configuration example of a level shifter 400 and a logic circuit 430. The logic circuit 430 is a circuit that generates an input signal to the level shifter 400.

The logic circuit 430 includes a flip-flop circuit DSR1, a flip-flop circuit DSR2, an AND circuit LGa, and an AND circuit LGb. The AND circuit LGa and the AND circuit LGb each have a function of inverting a logic of a signal input to a second input terminal. As an actual configuration, an inverter may be electrically connected to one of two input terminals of the AND circuit.

The wiring INL is a wiring that supplies an input signal to the logic circuit 430, and the wiring CLKL is a wiring that supplies a clock signal to drive the logic circuit 430.

In the case where a potential of a signal input to the wiring INL is shifted, the logic circuit 430 is synchronized with a clock signal and has a function of outputting pulse signals from an output terminal LOTa and an output terminal LOTb.

The level shifter 400 includes a differential amplifier 420_1, a differential amplifier 420_2, and the buffer 410. For each of the differential amplifier 420_1 and the differential amplifier 420_2, the differential amplifier 420 described above can be used. Note that a node to which the output terminal OTD of the differential amplifier 420_1 and the input terminal INa of the buffer 410 are connected is referred to as a node NDa, and a node to which the output terminal OTD of the differential amplifier 420_2 and the input terminal INb of the buffer 410 are connected is referred to as a node NDb.

Figure 16B:
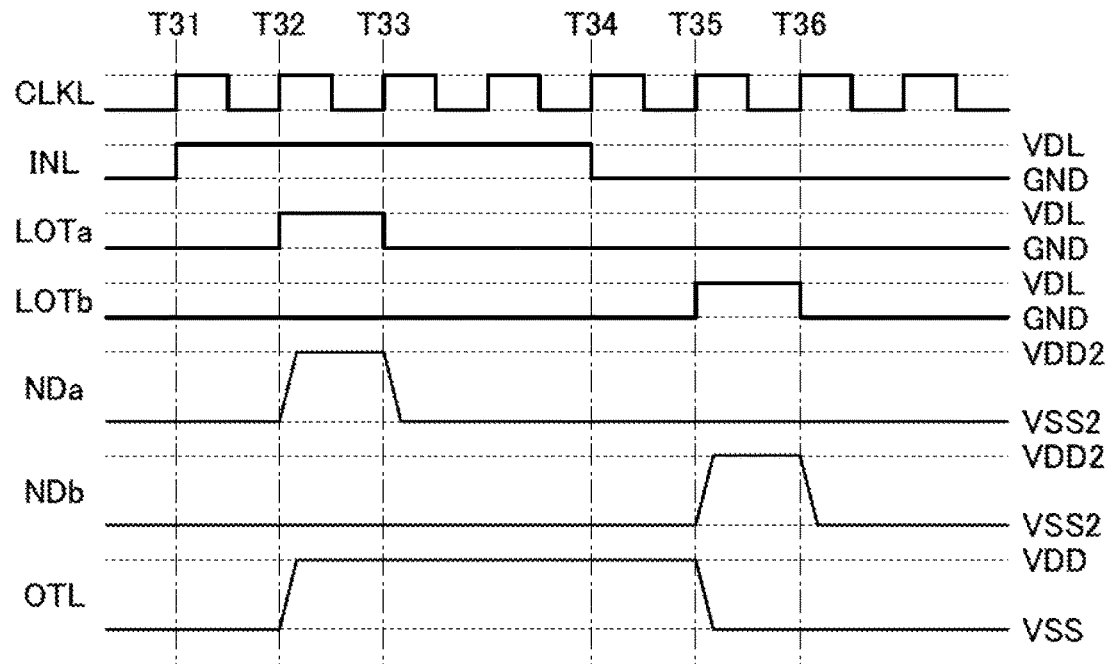

Next, an operation example of the level shifter 400 and the logic circuit 430 is described. FIG. 16B is a timing chart showing an operation example of the level shifter 400 and the logic circuit 430. The timing chart shows changes in potentials of the wiring CLKL, the wiring INL, the output terminal LOTa, the output terminal LOTb, the node NDa, the node NDb, and the wiring OTL from a time T31 to a time T36.

At the time T31, a signal whose potential level is shifted from a low-level potential L (GND) to a high-level potential H (VDL) is input to the wiring INL.

At the time T32, the logic circuit 430 outputs a pulse signal of the high-level potential H (VDL) from the output terminal LOTa in synchronization with the rising edge of the first clock signal after the transition of the signal. As a result, the high-level potential H (VDL) is input to the input terminal IND of the differential amplifier 420_1, and accordingly, the potential VDD2 is output from the output terminal OTD of the differential amplifier 420_1. Thus, the potential of the node NDa is the potential VDD2.

In contrast, the low-level potential L (GND) is output from the output terminal LOTb, and the low-level potential L (GND) is input to the input terminal of the differential amplifier 420_2. Thus, the potential VSS2 is output from the output terminal OTD of the differential amplifier 420_2, and the potential of the node NDb is the potential VSS2.

From the above, the potential VDD2 is input to the input terminal INa of the buffer 410, and the potential VSS2 is input to the input terminal INb of the buffer 410. By inputting the potential VDD2 to the input terminal INa and inputting the potential VSS2 to the input terminal INb, the potential VDD is output from the output terminal OTBF of the buffer 410. Thus, the potential VDD is output from the wiring OTL.

The length of the pulse signal output from the output terminal LOTa corresponds to one cycle of the clock signal input to the wiring CLKL. Thus, the pulse signal output from the output terminal LOTa at the time T33 decreases to the low-level potential L (GND), and the potentials of the output terminal OTD of the differential amplifier 420_1 and the node NDa decrease to the potential VSS2. Note that the potential output from the output terminal OTBF of the buffer 410 is the potential VDD continuously since before the time T33. Thus, the potential VDD is output from the wiring OTL.

At the time T34, a signal whose potential level is shifted from the high-level potential H (VDL) to the low-level potential L (GND) is input to the wiring INL.

At the time T35, the logic circuit 430 outputs a pulse signal with the high-level potential H (VDL) from the output terminal LOTb in synchronization with the rising edge of the first clock signal after the transition of the signal. As a result, the high-level potential H (VDL) is input to the input terminal IND of the differential amplifier 420_2, and accordingly, the potential VDD2 is output from the output terminal OTD of the differential amplifier 420_2. Thus, the potential of the node NDb becomes the potential VDD2.

In contrast, the low-level potential L (GND) is output from the output terminal LOTa, and the low-level potential L (GND) is input to the input terminal of the differential amplifier 420_1. Thus, the potential VSS2 is output from the output terminal OTD of the differential amplifier 420_1, and the potential of the node NDa becomes the potential VSS2.

From the above, the potential VSS2 is input to the input terminal INa of the buffer 410, and the potential VDD2 is input to the input terminal INb of the buffer 410. By inputting the potential VSS2 to the input terminal INa and inputting the potential VDD2 to the input terminal INb, the potential VSS is output from the output terminal OTBF of the buffer 410. Thus, the potential VSS is output from the wiring OTL.

The length of the pulse signal output from the output terminal LOTb corresponds to one cycle of the clock signal input to the wiring CLKL. Thus, the pulse signal output from the output terminal LOTb decreases to the low-level potential L (GND) at the time T36, and accordingly the potentials of the output terminal OTD of the differential amplifier 420_2 and the node NDb decrease to the potential VSS2. Note that the potential output from the output terminal OTBF of the buffer 410 is the potential VSS continuously since before the time T36. Thus, the potential VSS is output from the wiring OTL.

When the input signal to the level shifter 400 is generated in the logic circuit 430, the level of the input potential is shifted higher or lower. Note that the level shifter 400 may be used to shift the level of a timing signal input to a gate driver of a liquid crystal element.

The buffer 410 illustrated in FIG. 14A and the differential amplifier 420 illustrated in FIG. 15A are preferably formed using OS transistors. Accordingly, the level shifter 400 with high withstand voltage can be formed. The level shifter 400 can be provided over the insulating layer 110 as the level shifter 26 in FIGS. 3 to 5.

The logic circuit 430 is preferably provided on the semiconductor substrate 100 in FIGS. 3 to 5. Accordingly, the circuit size of the logic circuit 430 can be reduced. The logic circuit 430 may be provided in the signal generation circuit 25.

The level shifter 400 can be used for the buffer 202 in FIG. 6A or the level shifter 214 or the amplifier circuit 216 in FIG. 6B in addition to the level shifter 26 in FIG. 1.

As described above, in one embodiment of the present invention, various circuits in the display portion 20 can be formed using transistors provided on the semiconductor substrate 100 and OS transistors provided over the insulating layer 110. As a result, the display portion 20 can have higher reliability, higher withstand voltage, and higher operation speed or the display portion 20 can be miniaturized.

This embodiment can be combined with any of the other embodiments as appropriate.

Embodiment 2

In this embodiment, other configuration examples of the display system described in the above embodiment is described. Specifically, a display system capable of performing image processing utilizing a neural network is described.

<Configuration Examples of Display System>

Figure 17:
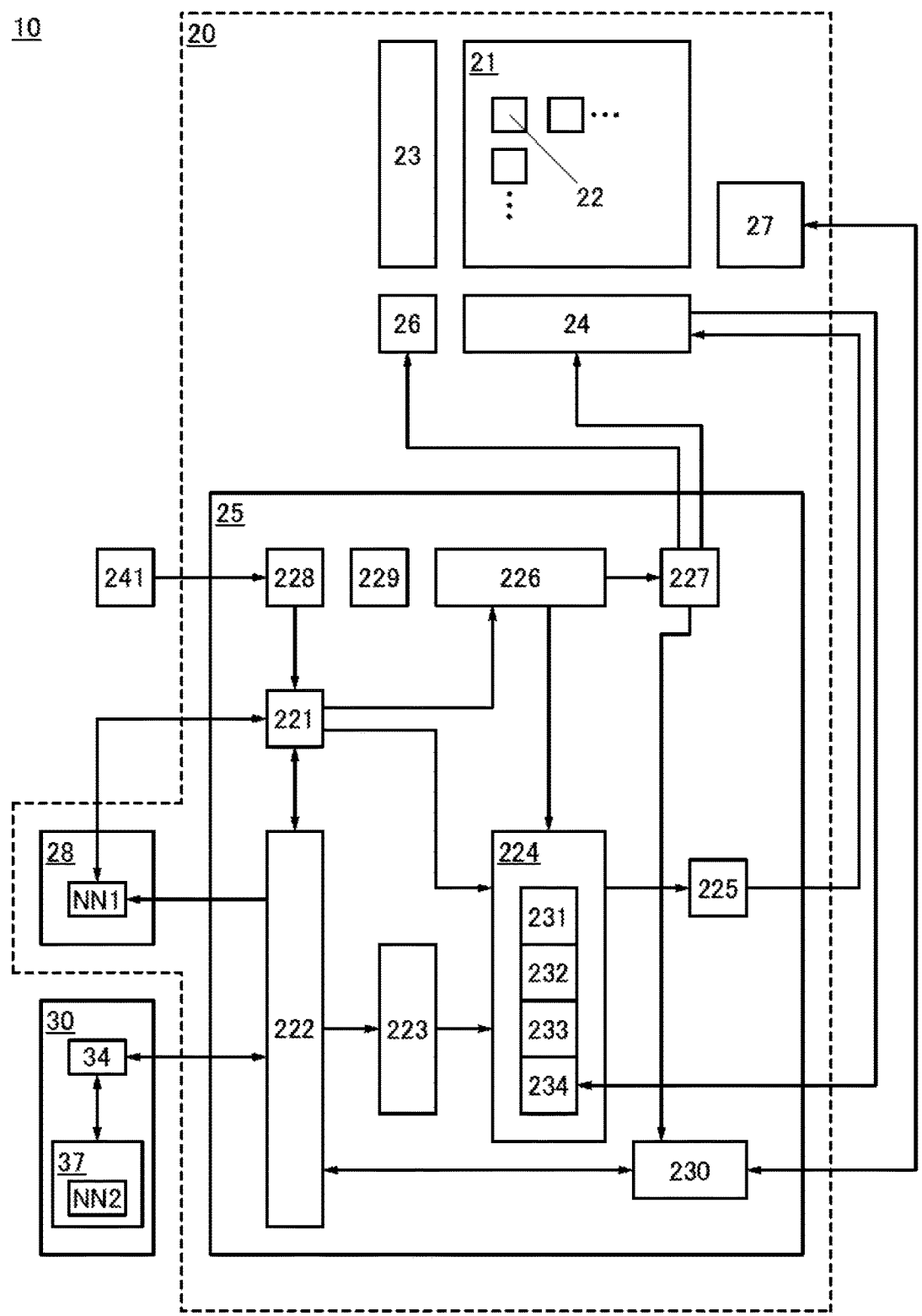
FIG. 17 illustrates a configuration example of a display system.

FIG. 17 illustrates a configuration example of the display system 10. The display system 10 illustrated in FIG. 17 is different from that in FIG. 7 in that the display portion 20 includes an arithmetic circuit 28 and that software 37 is stored in the host 30.

The arithmetic circuit 28 has a function of generating a signal for correcting a video signal in accordance with an ambient environment. Specifically, the arithmetic circuit 28 constitutes a neural network NN1 that has a function of generating a parameter on the basis of the information of an environment where video displayed on the pixel portion 21 is seen (hereinafter also referred to as environmental information). The parameter is used for image processing performed by the image processing circuit 224. Note that the neural network NN1 has already learned the environmental information as learning data and a predetermined parameter as teacher data.

Examples of the environmental information include the intensity of external light, the incident angle of external light, inclination of the display portion 20, distance between the display portion 20 and eyes of a user, and a frame rate of video.

Data corresponding to the environmental information (hereinafter also referred to as environmental data) is input to the neural network NN1. The neural network NN1 has a function of outputting a parameter for displaying video suitable for an environment by performing arithmetic operation using the environmental data as input data. The parameter is input to the image processing circuit 224 through the controller 221 and used for the dimming circuit 231, the toning circuit 232, or the gamma correction circuit 233.

In the case where the intensity of external light is used as the environmental information, for example, the environmental data can be generated by the sensor controller 228. Specifically, the optical sensor 241 detects the intensity of external light and the sensor controller 228 generates the environmental data on the basis of the detection result and outputs the environmental data to the controller 221. Then, the controller 221 outputs the environmental data to the arithmetic circuit 28. In this way, the environmental data is input to the neural network NN1. After that, the neural network NN1 performs arithmetic operation using the environmental data as input data and outputs a parameter used for image processing. As a result, the image processing circuit 224 can perform image processing using the parameter generated by the neural network NN1. Note that the arithmetic circuit 28 may be provided in the signal generation circuit 25

The software 37 included in the host 30 constitutes a neural network NN2 that has a function of performing supervised learning in addition to a function similar to that of the neural network NN1. Specifically, the neural network NN2 has a function of performing learning using the environmental data as input data and a parameter for image processing as teacher data. Note that the parameter used as teacher data is a parameter used for displaying video in accordance with user's preference and used for the dimming circuit 231, the toning circuit 232, or the gamma correction circuit 233, for example.

Learning in the neural network NN2 can be performed when the user adjusts the setting (brightness, color tone, or the like) of video displayed on the display portion 20 as appropriate in a predetermined environment, for example. Here, the neural network NN2 performs learning using the environmental data (learning data) corresponding to the predetermined environment and a parameter (teacher data) corresponding to the setting of the video adjusted by the user. As a result, the neural network NN2 can output a parameter for displaying video in accordance with user's preference on the basis of the environmental data.

In the case where the intensity of external light is used as the environmental information, for example, the environmental data corresponding to the intensity of external light is generated by using the optical sensor 241 and the sensor controller 228 and input to the neural network NN2 through the interface 222 and the interface 34. In addition, a parameter corresponding to the setting of video specified by a user with the intensity of external light is input to the neural network NN2 through the interface 222 and the interface 34.

The neural network NN2 performs learning using the environmental data as input data and the parameter as teacher data. As a result, the weight coefficient of the neural network NN2 is updated. The updated weight coefficient is output to the arithmetic circuit 28 through the interface 222 and used as the weight coefficient of the neural network NN1. Accordingly, the result of learning in the neural network NN2 can be reflected in the neural network NN1.

As described above, learning in the neural network can be performed with use of the software 37 while the neural network calculates a parameter with use of hardware (the arithmetic circuit 28). Accordingly, the arithmetic circuit 28 does not need hardware that constitutes a neural network with a learning function. In other words, the circuit size of the neural network NN1 can be reduced, so that the neural network NN1 is easily mounted on a semiconductor substrate. Thus, the configuration of the display portion 20 can be simplified.

The configuration of the neural network NN1 corresponds to that of the neural network NN2. Alternatively, the neural network NN1 is formed so that an error between outputs from the neural network NN1 and the neural network NN2 is in a certain range. In the case where both of the neural network NN1 and the neural network NN2 are hierarchical perceptron neural networks, for example, the neural networks NN1 and NN2 have the same number of layers and the same number of neurons included in each layer.

The host 30 performs processing using the processor 31, the graphics processing unit (GPU) 32, the memory device 33, or the like (see FIG. 1) when the host 30 executes the software 37. Alternatively, the software 37 may include another software such as an Internet browser or software for reproducing videos in addition to the neural network.

The display system 10 including the above-described neural network with a learning function can estimate user's preference in the setting of video and perform image processing on the basis of the estimation.

Figure 18:
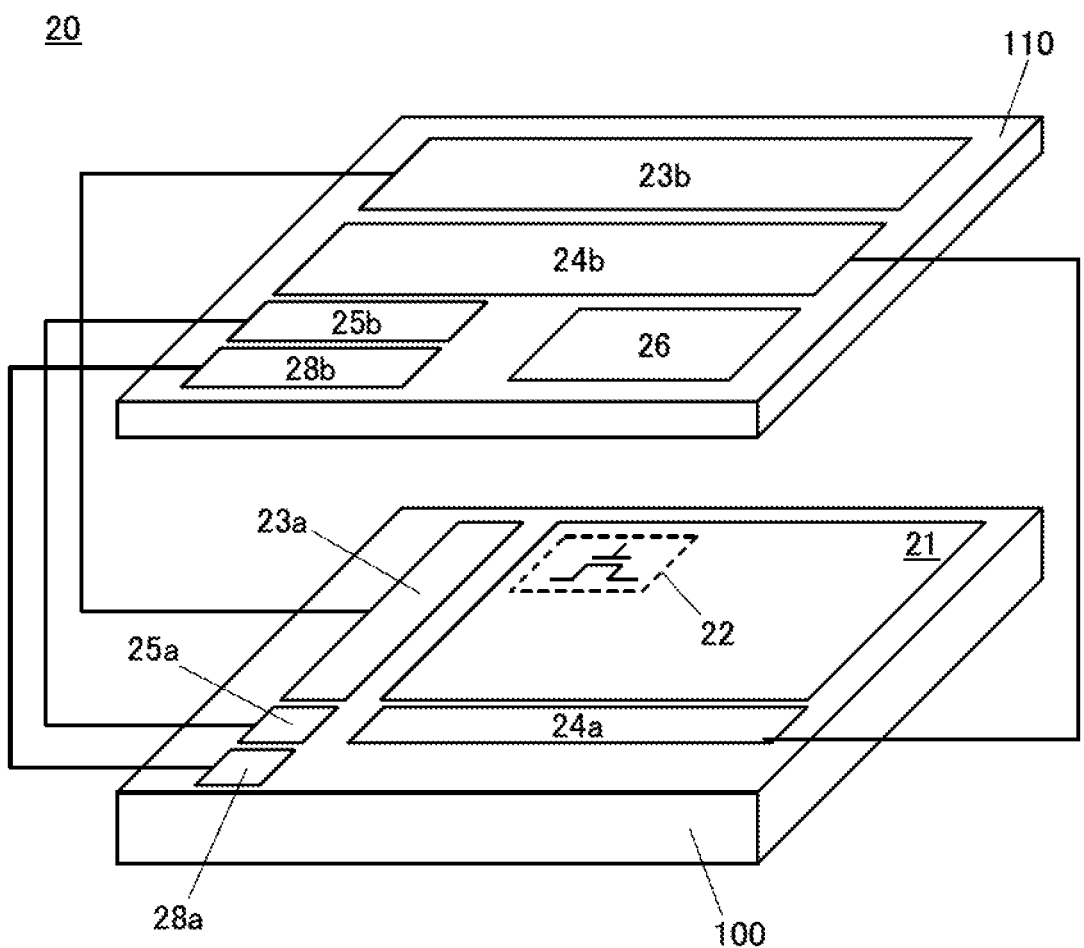
FIG. 18 illustrates a configuration example of a display system.

The arithmetic circuit 28 can be formed by a transistor provided on a semiconductor substrate and a transistor provided over an insulating layer. Specifically, the arithmetic circuit 28 can be formed by a circuit 28a provided on the semiconductor substrate 100 and a circuit 28b provided over the insulating layer 110, as illustrated in FIG. 18. An OS transistor that holds electric charge can be provided in the circuit 28b and another transistor can be provided in the circuit 28a, for example.

<Neural Network>

Next, a configuration example of a neural network that can be used as each of the neural networks NN1 and NN2 is described.

A neural network is an information processing system modeled on a biological neural network. A computer having a higher performance than a conventional Neumann computer is expected to be provided by utilizing the neural network, and in these years, a variety of researches on a neural network formed over an electronic circuit have been carried out.

In the neural network, units which resemble neurons are connected to each other through units which resemble synapses. By changing the connection strength, a variety of input patterns are learned, and pattern recognition, associative storage, or the like can be performed at high speed.

For example, a product-sum operation circuit described later is used as a feature extraction filter for convolution or a fully connected arithmetic circuit, whereby the feature amount can be extracted using a convolutional neural network (CNN). Note that weight coefficients of the feature extraction filter can be set using random numbers.

Figure 19:
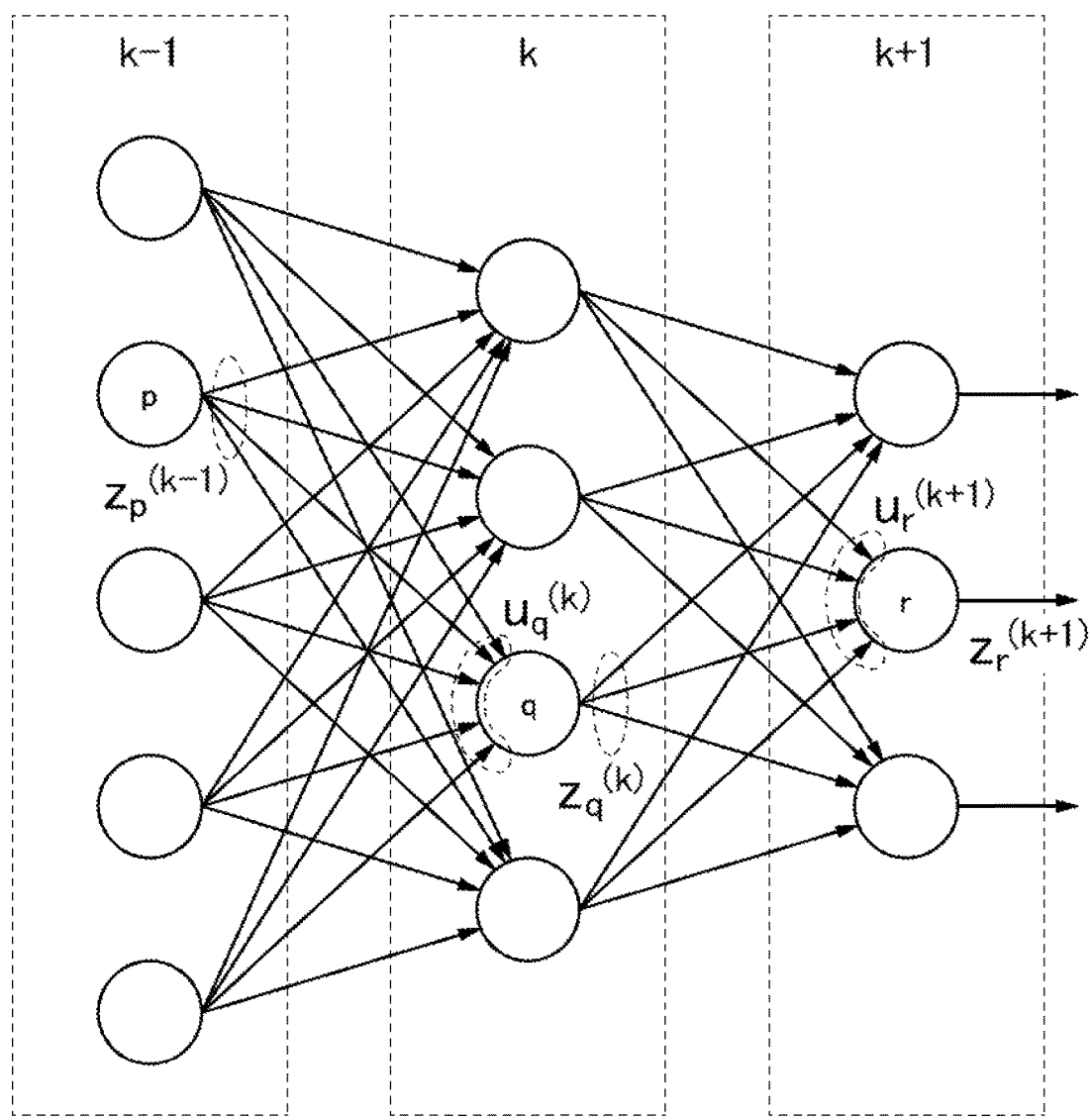
FIG. 19 illustrates a configuration example of a neural network.

A hierarchical neural network will be described as a kind of neural networks. FIG. 19 is a diagram showing an example of a hierarchical neural network. A (k−1)-th layer (k is an integer greater than or equal to 2) includes P neurons (P is an integer greater than or equal to 1). A k-th layer includes Q neurons (Q is an integer greater than or equal to 1). A (k+1)-th layer includes R neurons (R is an integer greater than or equal to 1).

The product of an output signal $z_p^{(k-1)}$ of the p-th neuron (p is an integer greater than or equal to 1 and less than or equal to P) in the (k−1)-th layer and a weight coefficient $w_{qp}^{(k)}$ is input to the q-th neuron (q is an integer greater than or equal to 1 and less than or equal to Q) in the k-th layer. The product of an output signal $z_q^{(k)}$ of the q-th neuron in the k-th layer and a weight coefficient $w_{rq}^{(k+1)}$ is input to the r-th neuron (r is an integer greater than or equal to 1 and less than or equal to R) in the (k+1)-th layer. The output signal of the r-th neuron in the (k+1)-th layer is $z_r^{(k+1)}$.

In this case, the summation $u_q^{(k)}$ of signals input to the q-th neuron in the k-th layer is expressed by the following formula.

[Formula 1]

$$u_q^{(k)} = \Sigma w_{qp}^{(k)} z_p^{(k-1)} \quad (1.1)$$

The output signal $z_q^{(k)}$ from the q-th neuron in the k-th layer is expressed by the following formula.

[Formula 2]

$$z_q^{(k)} = f(u_q^{(k)}) \quad (1.2)$$

Figure 22A:
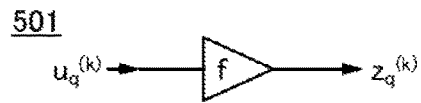
FIGS. 22A to 22D each illustrate a configuration example of a circuit.

A function $f(u_q^{(k)})$ is an activation function. A step function, a linear ramp function, a sigmoid function, or the like can be used as the function $f(u_q^{(k)})$ Product-sum operation of Formula (1.1) can be performed with a product-sum operation circuit to be described later. Formula (1.2) can be calculated with a circuit 501 illustrated in FIG. 22A, for example.

Note that the activation function may be the same among all neurons or may be different among neurons. Furthermore, the activation function in one layer may be the same as or different from that in another layer.

Figure 20:
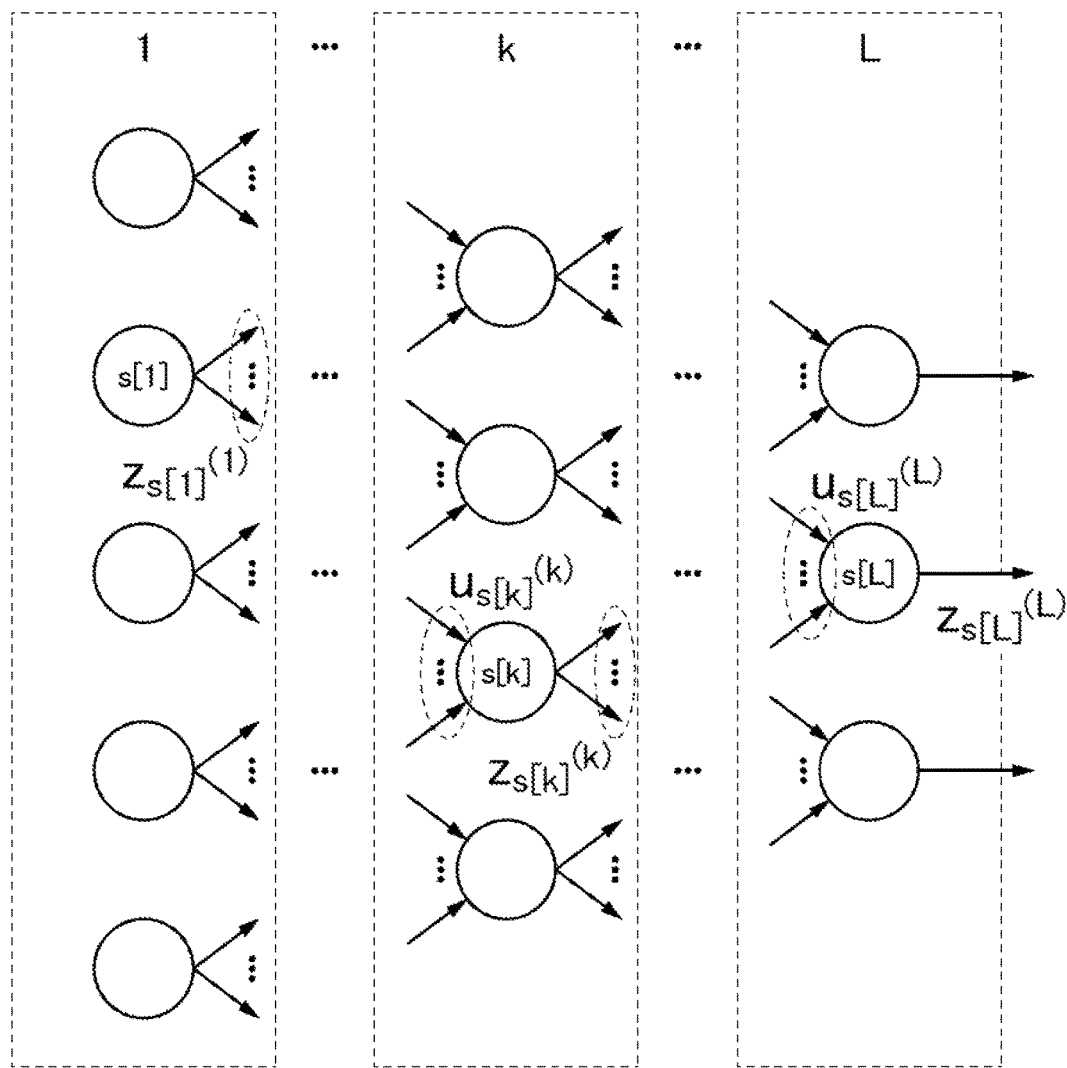
FIG. 20 illustrates a configuration example of a neural network.

Here, a hierarchical neural network including L layers (here, L is an integer greater than or equal to three) in total shown in FIG. 20 is described (that is, here, k is an integer greater than or equal to two and less than or equal to (L−1)). A first layer is an input layer of the hierarchical neural network, an L-th layer is an output layer of the hierarchical neural network, and second to (L−1)-th layers are hidden layers.

The first layer (input layer) includes P neurons, the k-th layer (hidden layer) includes Q[k] neurons (here, Q[k] is an integer greater than or equal to 1), and the L-th layer (output layer) includes R neurons.

An output signal of the s[1]-th neuron in the first layer (here, s[1] is an integer greater than or equal to 1 and less than or equal to P) is $z_{s[1]}^{(1)}$, an output signal of the s[k]-th neuron in the k-th layer (here, s[k] is an integer greater than or equal to 1 and less than or equal to Q[k]) is $z_{s[k]}^{(k)}$, and an output signal of the s[L]-th neuron in the L-th layer (here, s[L] is an integer greater than or equal to 1 and less than or equal to R) is $z_{s[L]}^{(L)}$.

The product $u_{s[k]}^{(k)}$ of an output signal $z_{s[k-1]}^{(k-1)}$ of the s[k−1]-th neuron in the (k−1)-th layer and a weight coefficient $w_{s[k]s[k-1]}^{(k)}$ (here, s[k−1] is an integer greater than or equal to 1 and less than or equal to Q[k−1]) is input to the s[k]-th neuron in the k-th layer. The product $u_{s[L]}^{(L)}$ of an output signal $z_{s[L-1]}^{(L-1)}$ of the s[L−1]-th neuron in the (L−1)-th layer and a weight coefficient $w_{s[L]s[L-1]}^{(L)}$ (here, s[L−1] is an integer greater than or equal to 1 and less than or equal to Q[L−1]) is input to the s[L]-th neuron in the L-th layer.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other, in functions of the hierarchical neural network.

Figure 21:
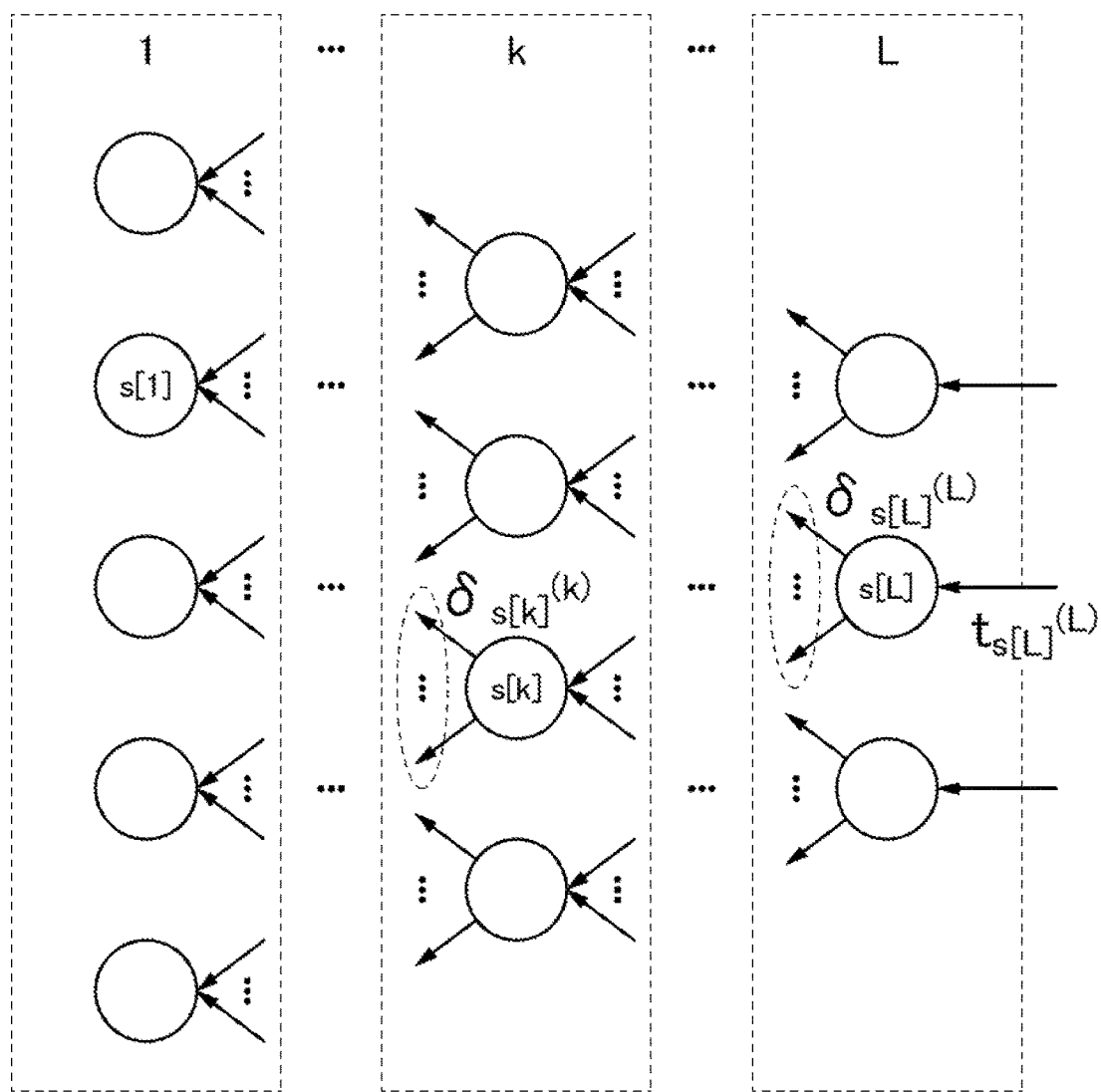
FIG. 21 illustrates a configuration example of a neural network.

A learning method using backpropagation will be described as a specific example of supervised learning. FIG. 21 is a diagram illustrating a learning method using backpropagation. Backpropagation is a method for changing a weight coefficient so that an error between an output of a hierarchical neural network and teacher data becomes small.

For example, assume that input data is input to the s[1]-th neuron in the first layer and output data $z_{s[L]}^{(L)}$ is output from the s[L]-th neuron in the L-th layer. Here, error energy E can be expressed using output data $z_{s[L]}^{(L)}$ and a teacher signal $t_{s[L]}^{(L)}$, when a teacher signal for the output data $z_{s[L]}^{(L)}$ is $t_{s[L]}^{(L)}$.

The update amount of a weight coefficient $w_{s[k]s[k-1]}^{(k)}$ of the s[k]-th neuron in the k-th layer with respect to the error energy E is set to $\partial E/\partial w_{s[k]s[k-1]}^{(k)}$, whereby the weight coefficient can be updated. Here, when an error $\delta_{s[k]}^{(k)}$ of the output value $z_{s[k]}^{(k)}$ of the s[k]-th neuron in the k-th layer is defined as $\partial E/\partial u_{s[k]}^{(k)}$, $\delta_{s[k]}^{(k)}$ and $\partial E/\partial w_{s[k]s[k-1]}^{(k)}$ can be expressed by the following respective formulae.

[Formula 3]

$$\delta_{s[k]}^{(k)} = \sum_{s[k+1]} \delta_{s[k+1]}^{(k+1)} \cdot w_{s[k+1]s[k]}^{(k+1)} \cdot f'(u_{s[k]}^{(k)}) \quad (1.3)$$

-continued

[Formula 4]

$$\frac{\partial E}{\partial w_{s[k]s[k-1]}^{(k)}} = \delta_{s[k]}^{(k)} \cdot z_{s[k-1]}^{(k-1)} \quad (1.4)$$

Figure 22B:
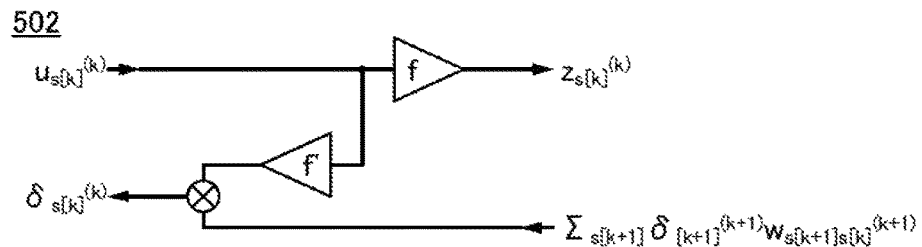
Figure 22C:
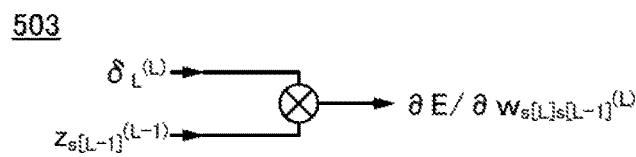

A function $f'(u_{s[k]}^{(k)})$ is the derivative of an output function of the neuron. Formula (1.3) can be calculated with a circuit 502 illustrated in FIG. 22B, for example. Formula (1.4) can be calculated with a circuit 503 illustrated in FIG. 22C, for example. The derived function of the output function can be obtained by connecting an arithmetic circuit, which can execute a desired derived function, to an output terminal of an operational amplifier.

For example, $\Sigma \delta_{s[k+1]}^{(k+1)} \cdot w_{s[k+1]-[k]}^{(k+1)}$ in Formula (1.3) can be calculated with a product-sum operation circuit to be described later.

Here, when the (k+1)-th layer is an output layer, or the L-th layer, $\delta_{s[L]}^{(L)}$ and $\partial E/\partial w_{s[L]s[L-1]}^{(L)}$ can be expressed by the following respective formulae.

[Formula 5]

$$\delta_{s[L]}^{(L)} = (z_{s[L]}^{(L)} - t_{s[L]}) \cdot f'(u_{s[L]}^{(L)}) \quad (1.5)$$

[Formula 6]

$$\frac{\partial E}{\partial w_{s[L]s[L-1]}^{(L)}} = \delta_{s[L]}^{(L)} \cdot z_{s[L-1]}^{(L-1)} \quad (1.6)$$

Figure 22D:
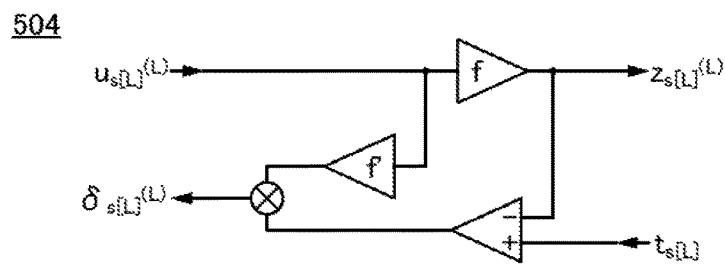

Furthermore, Formula (1.5) can be calculated with a circuit 504 illustrated in FIG. 22D. Formula (1.6) can be calculated with the circuit 503 illustrated in FIG. 22C.

That is to say, the errors $\delta_{s[k]}^{(k)}$ and $\delta_{s[L]}^{(L)}$ of all neuron circuits can be calculated by Formulae (1.1) to (1.6). Note that the update amounts of weight coefficients are set on the basis of the errors $\delta_{s[k]}^{(k)}$ and $\delta_{s[L]}^{(L)}$, predetermined parameters, and the like.

By using the above-described neural network, the display system 10 illustrated in FIG. 17 can be formed.

<Operation Example of Display System>

Next, operation examples of the display system 10 illustrated in FIG. 17 are described. Here, a case where the intensity of external light detected by the optical sensor 241 is used as environmental data is described as an example.

Figure 23:
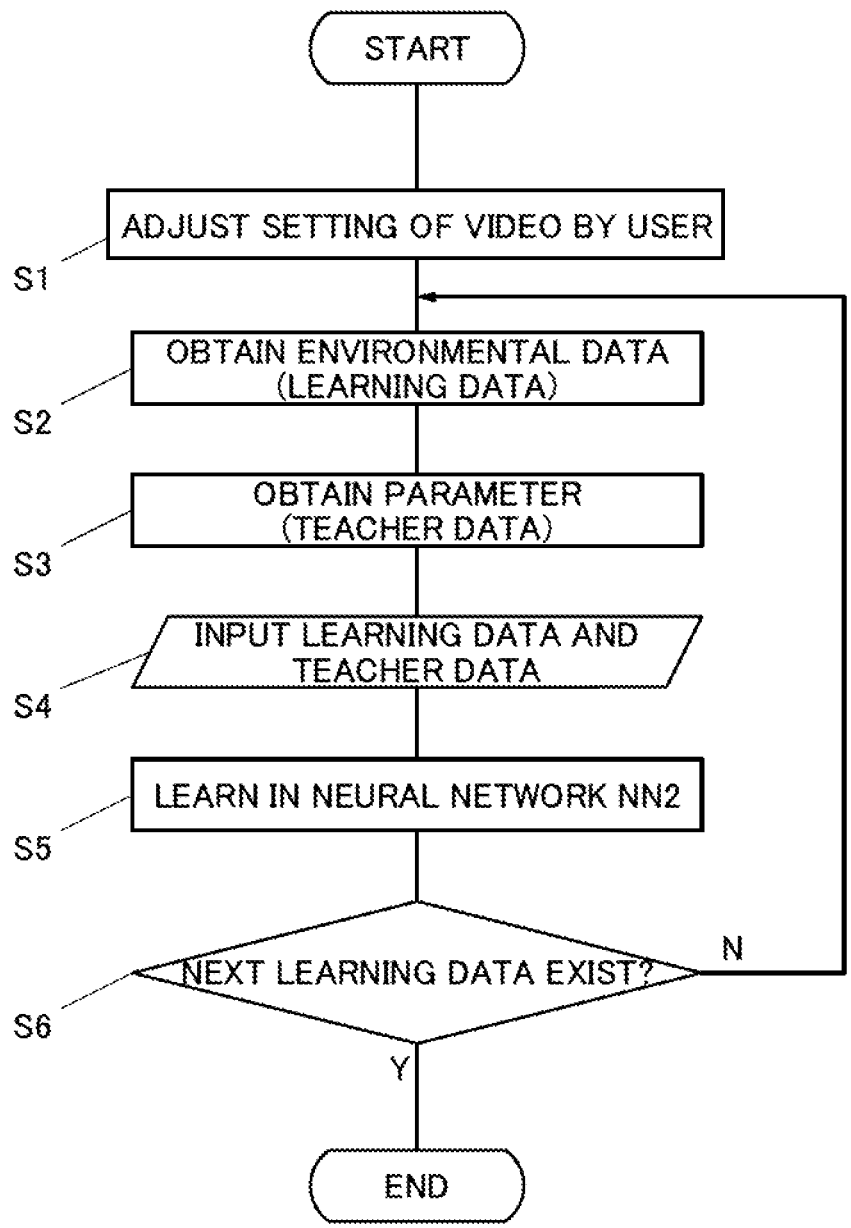
FIG. 23 is a flow chart.
Figure 24:
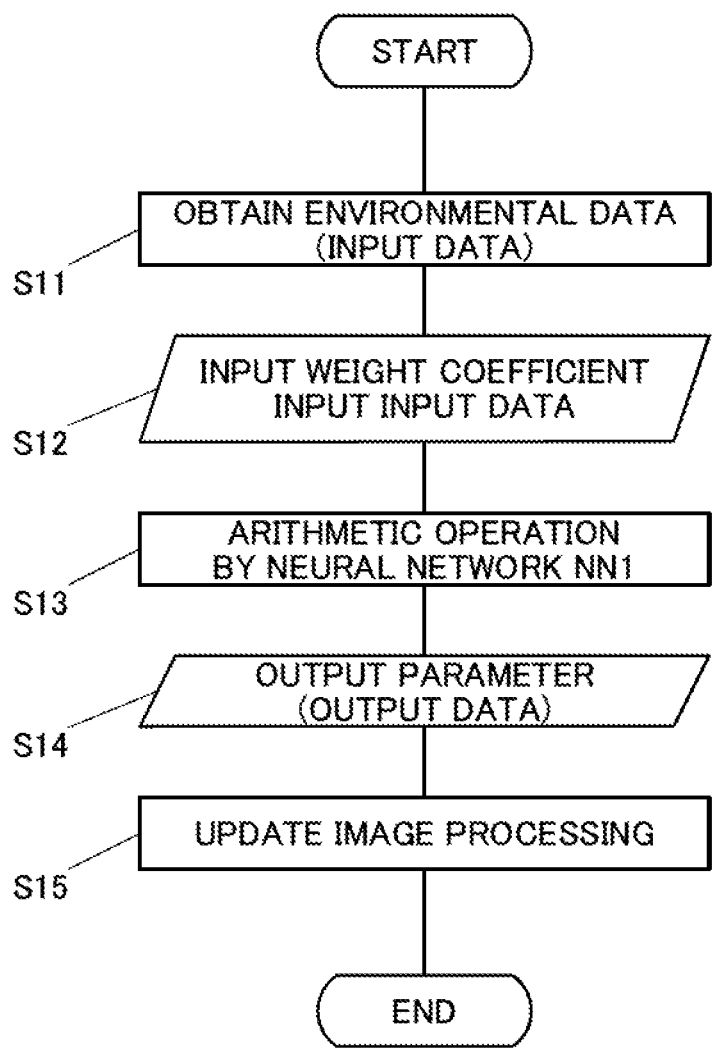
FIG. 24 is a flow chart.

FIG. 23 and FIG. 24 are flow charts showing operation examples of the display system 10. FIG. 23 shows an operation example in which learning is performed in the neural network NN2, and FIG. 24 shows an operation example in which a parameter used for image processing is changed with use of the neural network NN1.

[Learning]

First, a user adjusts video displayed on the display portion 20 in a predetermined environment (Step S1). The user adjusts the setting such as luminance or tones of the video manually in accordance with user's preference, for example. Note that a method for adjusting the video is not particularly limited. For example, an operation button or the like (not illustrated) provided on the display portion 20 may be used, or information may be input with the touch sensor unit 27.

Next, the environmental data on the environment where the setting of the video is adjusted by the user in Step S1 is obtained (Step S2). For example, data corresponding to the intensity of external light is generated with use of the optical sensor 241 and the sensor controller 228. The data corresponding to the intensity of external light corresponds to learning data used for learning in the neural network NN2.

Then, a parameter used for image processing is obtained (Step S3). Specifically, a parameter for image processing that is used in the image processing circuit 224 when the video whose setting is adjusted by the user is displayed in Step S1 is obtained. The parameter corresponds to teacher data used for learning in the neural network NN2. The parameter is read from a memory device of the controller 221, the register 226, or the like.

Next, learning data and teacher data are input from the signal generation circuit 25 to the host 30 (Step S4). The learning data and the teacher data are temporarily stored in a memory device or the like of the host 30. Then, the neural network NN2 constituted by the software 37 performs learning using the learning data and the teacher data input from the signal generation circuit 25 (Step S5).

Specifically, the environmental data is input to neurons of an input layer of the neural network NN2, which is formed in the software 37 as a program, as learning data. In this manner, learning in the neural network NN2 is performed.

The initial values of the weight coefficients of the neural network NN2 may be random numbers. The initial values of the weight coefficients might affect the speed of learning (e.g., the convergent rate of weight coefficients and the prediction accuracy of the neural network). Thus the initial values of the weight coefficients may be changed when the learning speed is low.

When the environmental data is input to the neural network NN2, the neural network NN2 performs arithmetic operation and the operation result is output from an output layer. In the case where a difference between the output data and the teacher data is out of the allowable range, weight coefficients are updated using the teacher data. Note that the above-described backpropagation or the like can be used to update the weight coefficients.

After the weight coefficients are updated, the environmental data is input to the neural network NN2 again and arithmetic operation is performed. Arithmetic operation and update of the weight coefficients are repeated until the error between the output data output from the neural network NN2 and the teacher data falls within the allowable range. Note that the allowable range of an error can be set freely.

When the error between the output data output from the neural network NN2 and the teacher data finally falls within the allowable range, learning is completed. Then, the weight coefficients of the neural network NN2 are stored in the memory device of the controller 221, the memory device of the host 30, or the like together with the learning data and the teacher data.

After that, when there is next learning data (NO in Step S6), environmental data is obtained again (Step S2). In the case where learning continues, the user may adjust the setting of the video again (Step S1). On the contrary, when there is no next learning data (YES in Step S6), learning is completed and the weight coefficients of the neural network NN2 are determined.

By the above operation, learning in the neural network is achieved. Although the intensity of external light is used as environmental information here, environmental information used for learning in the neural network is not limited thereto. For example, the incident angle of external light detected by the optical sensor 241 or the orientation or inclination of the display portion 20 detected by an acceleration sensor or a gyroscope sensor may be used instead of or in addition to the intensity of external light.

[Change in Parameter]

Next, operation of changing a parameter, which is used for image processing, performed by using the result of the learning through the operation from Step S1 to Step S8 is described. FIG. 24 shows an operation example in which a parameter is changed.

First, environmental data is obtained in a manner similar to that of Step S2 in FIG. 23 (Step S11). The obtained environmental data is used as an input data for the neural network NN1.

Next, a weight coefficient is input to the neural network NN1. Specifically, the weight coefficient of the neural network NN2 obtained by the learning in Step S5 in FIG. 23 is input from the host 30 to the arithmetic circuit 28 through the interface 222 and applied to the neural network NN1. In this way, the weight coefficient of the neural network NN1 is updated and the result of learning in the neural network NN2 is reflected in the neural network NN1

The environmental data obtained in Step S11 is input to the arithmetic circuit 28. Accordingly, the environmental data is input to neurons of an input layer of the neural network NN1.

Then, arithmetic operation (Step S13) is performed by the neural network NN1 on the basis of the weight coefficient and the environmental data input to the neural network NN1 in Step S12. A parameter used in the image processing circuit 224 is obtained as output data by this arithmetic operation. Examples of the parameter include a parameter used in the dimming circuit 231, a parameter used in the toning circuit 232, or a parameter used in the gamma correction circuit 233.

Then, the parameter obtained by the arithmetic operation by the neural network NN1 is output to the register 226 through the controller 221 (Step S14). The parameter stored in the register 226 is output to the image processing circuit 224, whereby the content of image processing performed by the image processing circuit 224 is updated (Step S15). After that, a video signal is generated using the updated image processing circuit 224 and video is displayed on the pixel portion 21.

Through the above operation, the content of image processing can be changed with use of the parameter obtained by the neural network NN1.

When learning in the neural network is performed by the software on the host 30 side and the result of the learning is reflected in the neural network NN1 constituted by the arithmetic circuit 28 as described above, the arithmetic circuit 28 does not need hardware that constitutes a neural network with a learning function. Thus, the configuration of the display portion 20 can be simplified. Furthermore, the neural network NN1 can efficiently output a parameter.

<Product-Sum Operation Circuit>

Next, a configuration example of a semiconductor device that can be used as a product-sum operation circuit for constructing the above-described neural network will be described.

Figure 25:
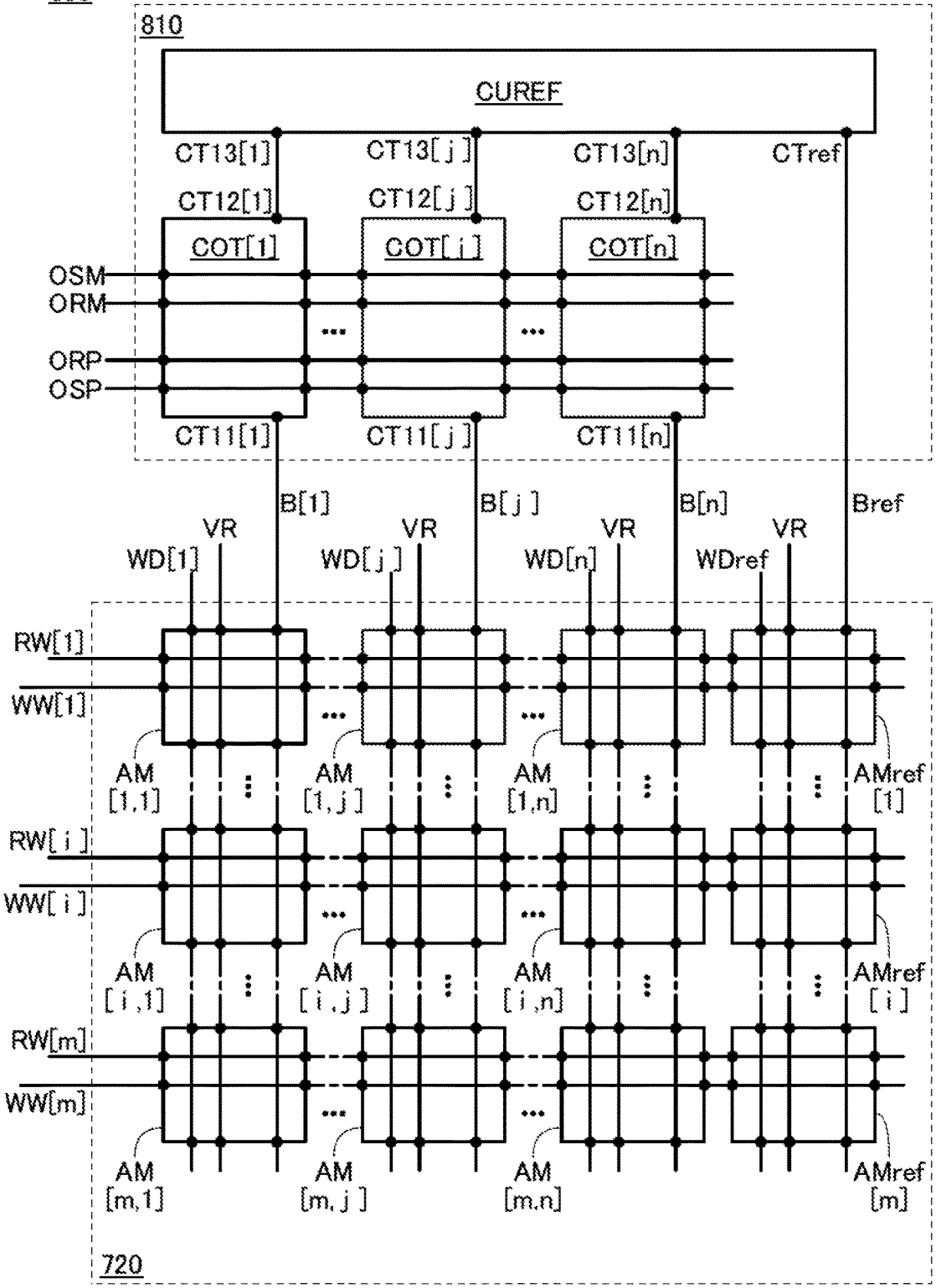
FIG. 25 illustrates a configuration example of a semiconductor device.

FIG. 25 is a block diagram of a semiconductor device 800 that can be used as a product-sum operation circuit. The semiconductor device 800 includes an offset circuit 810 and a memory cell array 720.

The offset circuit 810 includes column output circuits COT[1] to COT[n] (here, n is an integer greater than or equal to 1) and a power supply circuit CUREF.

In the memory cell array 720, m (m is an integer greater than or equal to 1) memory cells AM are arranged in the column direction and n memory cells AM are arranged in the row direction; that is, m×n memory cells AM are provided.

The total number of the memory cells AM and the memory cells AMref arranged in a matrix in the memory cell array 720 is m×(n+1). In particular, in the memory cell array 720 in FIG. 25, the memory cell AM positioned in an i-th row and a j-th column is denoted by a memory cell AM[i,j] (i is an integer greater than or equal to 1 and less than or equal to m, and j is an integer greater than or equal to 1 and less than or equal to n), and the memory cell AMref positioned in the i-th row is denoted by a memory cell AMref[i].

The memory cell AM retains a potential corresponding to the first analog data, and the memory cell AMref retains a predetermined potential. Note that the predetermined potential is a potential necessary for the product-sum operation, and in this specification, data corresponding to this predetermined potential is referred to as reference analog data in some cases.

The column output circuit COT[j] includes a terminal CT11[j] and a terminal CT12[j]. The power supply circuit CUREF includes terminals CT13[1] to CT13[n] and a terminal CTref.

The wiring ORP is connected to the column output circuits COT[1] to COT[n]. The wiring OSP is connected to the column output circuits COT[1] to COT[n]. A wiring ORM is connected to the column output circuits COT[1] to COT[n]. A wiring OSM is connected to the column output circuits COT[1] to COT[n]. The wirings ORP, OSP, ORM, and OSP are each a wiring for supplying a control signal to the offset circuit 810.

The terminal CT11[j] of the column output circuit COT[j] is connected to the wiring B[j].

The terminal CTref of the power supply circuit CUREF is connected to the wiring Bret. In addition, the terminal CT13[j] of the power supply circuit CUREF is connected to the terminal CT12[j] of the column output circuit COT[j].

The memory cell AM[i,j] is connected to a wiring RW[i], a wiring WW[i], a wiring WD[j], the wiring B[j], and a wiring VR.

The memory cell AMref[i] is connected to the wiring RW[i], the wiring WW[i], a wiring WDref, the wiring Bref, and the wiring VR.

The wiring WW[i] functions as a wiring for supplying a selection signal to the memory cells AM[i,1] to AM[i,n] and the memory cell AMref[i]. The wiring RW[i] functions as a wiring for supplying either a reference potential or a potential corresponding to the second analog data to the memory cells AM[i,1] to AM[i,n] and the memory cell AMref[i]. The wiring WD[j] functions as a wiring for supplying writing data to the memory cells AM in the j-th column. The wiring VR functions as a wiring for supplying a predetermined potential to the memory cells AM or the memory cells AMref when data is read out from the memory cells AM or the memory cells AMref.

The wiring B[j] functions as a wiring for supplying a signal from the column output circuit OUT[j] to the memory cells AM in the j-th column in the memory cell array 720.

The wiring Bref functions as a wiring for supplying a signal from the power supply circuit CUREF to the memory cells AMref[1] to AMref[m].

In the semiconductor device 800 in FIG. 25, only the following components are shown: the offset circuit 810; the memory cell array 720; the column output circuit COT[1]; the column output circuit COT[j]; the column output circuit COT[n]; the power supply circuit CUREF; the terminal CT11[1]; the terminal CT11[j]; the terminal CT11 [n]; the terminal CT12[1]; the terminal CT12[n]; the terminal CT13 [1]; the terminal CT13[j]; the terminal CT13[n]; the terminal CTref; the memory cell AM[1,1]; the memory cell AM[i,1];

the memory cell AM[m,1]; the memory cell AM[1,j]; the memory cell AM[i,j]; the memory cell AM[m,j]; the memory cell AM[1,n]; the memory cell AM[i,n]; a memory cell AM[m,n]; the memory cell AMref[1]; the memory cell AMref[i]; the memory cell AMref[m]; the wiring OSP; the wiring ORP; the wiring ORM; the wiring OSM; the wiring B[1]; the wiring B[j]; the wiring B[n]; the wiring Bref; the wiring WD[1]; the wiring WD[j]; the wiring WD[n]; the wiring WDref; the wiring VR; a wiring RW[1]; the wiring RW[i]; the wiring RW[m]; the wiring WW[1]; the wiring WW[i]; and the wiring WW[m]. Other circuits, wirings, elements, and reference numerals thereof are not shown.

The configuration of the semiconductor device 800 in FIG. 25 is just an example. Depending on circumstances or conditions or as needed, the configuration of the semiconductor device 800 can be changed. For example, depending on a circuit configuration of the semiconductor device 800, one wiring may be provided to serve as the wiring WD[j] and the wiring VR. Alternatively, depending on a circuit configuration of the semiconductor device 800, one wiring may be provided to serve as the wiring ORP and the wiring OSP, or one wiring may be provided to serve as the wiring ORM and the wiring OSM.

[Offset Circuit]

Figure 26:
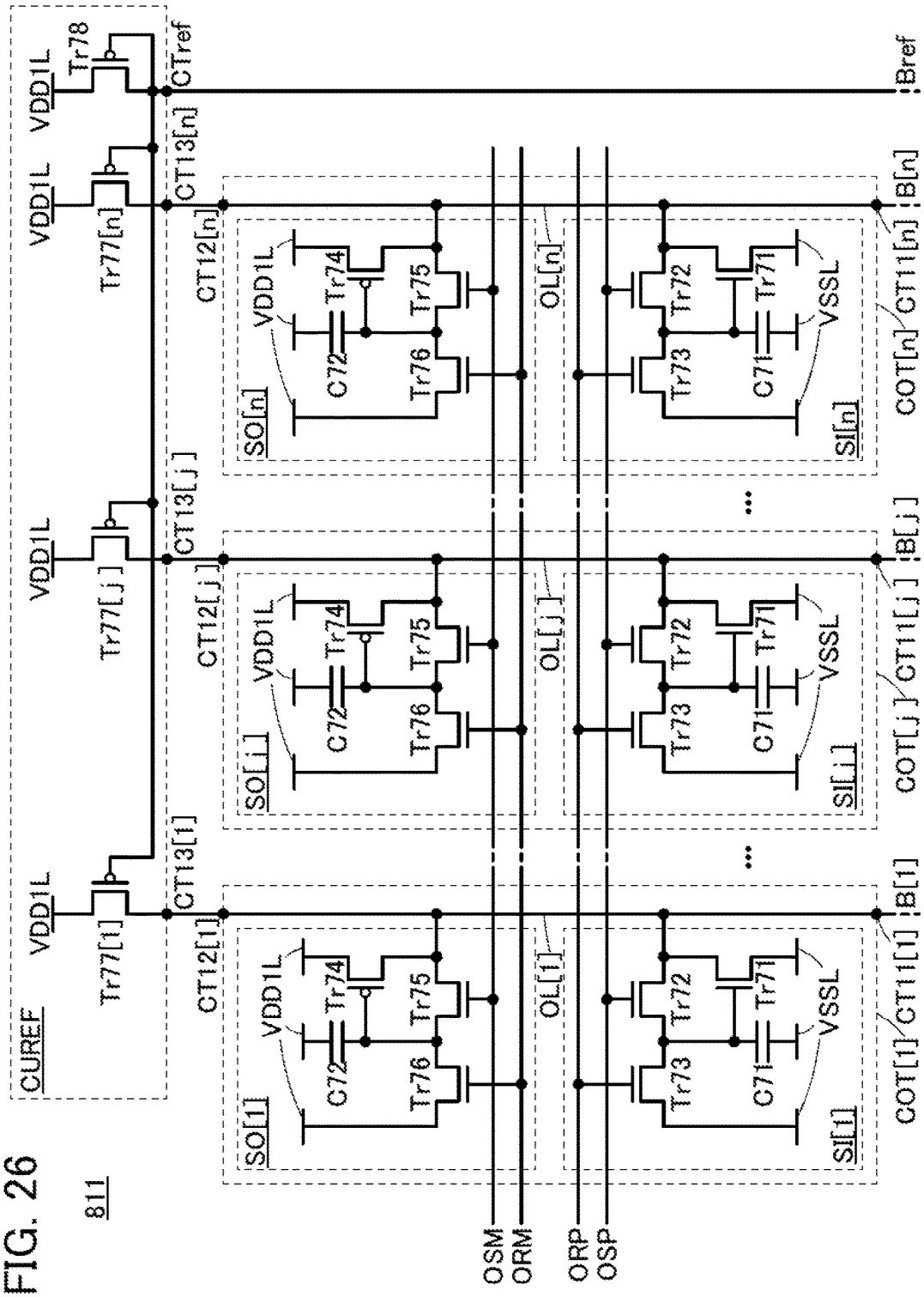
FIG. 26 illustrates a configuration example of an offset circuit.

Next, an example of a circuit configuration that can be applied for the offset circuit 810 is described. FIG. 26 shows an offset circuit 811 as an example of the offset circuit 810.

The offset circuit 811 is electrically connected to the wiring VDD1L and the wiring VSSL for supplying a power supply voltage. Specifically, each of the column output circuits COT[1] to COT[n] are electrically connected to the wiring VDD1L and the wiring VSSL, and the current supply circuit CUREF is electrically connected to the wiring VDD1L. The wiring VDD1L supplies the high-level potential. The wiring VSSL supplies the low-level potential.

The circuit configuration of the inside of the column output circuit COT[j] is described first. The column output circuit COT[j] includes a circuit SI[j], a circuit SO[j], and a wiring OL[j]. In addition, the circuit SI[j] includes transistors Tr71 to Tr73 and a capacitor C71, and the circuit SO[j] includes transistors Tr74 to Tr76 and a capacitor C72. The transistors Tr71 to Tr73, the transistor Tr75, and the transistor Tr76 are n-channel transistors, and the transistor Tr74 is a p-channel transistor.

In the circuit SI[j] of the column output circuit COT[j], a first terminal of the transistor Tr71 is connected to the wiring OL[j], a second terminal of the transistor Tr71 is connected to the wiring VSSL, and a gate of the transistor Tr71 is connected to a first terminal of the capacitor C71. A first terminal of a transistor Tr72 is connected to the wiring OL[j], a second terminal of the transistor Tr72 is connected to the first terminal of the capacitor C71, and a gate of the transistor Tr72 is connected to the wiring OSP. A first terminal of the transistor Tr73 is connected to the first terminal of the capacitor C71, a second terminal of the transistor Tr73 is connected to the wiring VSSL, and a gate of the transistor Tr73 is connected to the wiring ORP. A second terminal of the capacitor C71 is connected to the wiring VSSL. With such a configuration of the circuit SI[j], the circuit SI[j] functions as a current generation circuit discharging current that is to flow in the wiring OL[j].

In the circuit SO[j] of the column output circuit COT[j], a first terminal of the transistor Tr74 is connected to the wiring OL[j], a second terminal of the transistor Tr74 is connected to the wiring VDD1L, and a gate of the transistor Tr74 is connected to a first terminal of the capacitor C72. A first terminal of the transistor Tr75 is connected to the wiring OL[j], a second terminal of the transistor Tr75 is connected to a first terminal of the capacitor C72, and a gate of the transistor Tr75 is connected to the wiring OSM. A first terminal of the transistor Tr76 is connected to the first terminal of the capacitor C72, a second terminal of the transistor Tr76 is connected to the wiring VDD1L, and a gate of the transistor Tr76 is connected to the wiring ORM. A second terminal of the capacitor C72 is connected to the wiring VDD1L. With such a configuration of the circuit SO[j], the circuit SO[j] functions as a current generation circuit discharging current that is to flow in the wiring OL[j].

Note that the each of transistors Tr71 to Tr73, transistor Tr75, and the transistor Tr76 is preferably an OS transistor. Each of channel formation regions of the transistors Tr71 to Tr73, transistor Tr75, and the transistor Tr76 preferably includes CAC-OS described in Embodiment 3.

The OS transistor has a characteristic of extremely low off-state current. Thus, when the OS transistor is in an off state, the amount of leakage current flowing between a source and a drain can be extremely small. With use of the OS transistors as the transistors Tr71 to Tr73, the transistor Tr75 and the transistor Tr76, the leakage current of each of the transistors Tr71 to Tr73, the transistor Tr75 and the transistor Tr76 can be suppressed, which enables the product-sum operation circuit to have high accuracy in some cases.

Next, an internal structure of the current supply circuit CUREF is described. The current supply circuit CUREF includes transistors Tr77[1] to Tr77[n] and a transistor Tr78. Note that each of the transistors Tr77[1] to Tr77[n] and the transistor Tr78 is a p-channel transistor.

A first terminal of the transistor Tr77[j] is connected to the terminal CT13[j], a second terminal of the transistor Tr77[j] is connected to the wiring VDD1L, and a gate of the transistor Tr77[j] is connected to a gate of the transistor Tr78. A first terminal of the transistor Tr78 is connected to the terminal CTref, a second terminal of the transistor Tr78 is connected to the wiring VDD1L, and the gate of the transistor Tr78 is connected to the terminal CTref. In other words, the current supply circuit CUREF functions as a current mirror circuit.

Thus, the current supply circuit CUREF has a function of equalizing the amount of current flowing between a source and a drain of the transistor Tr78 and the amount of current between a source and a drain of the transistor Tr77[j] using a potential of the terminal CTref as a reference.

The wiring OL[j] is a wiring for electrically connecting the terminal CT11[j] and the terminal CT12[j] of the column output circuit COT[j].

In the offset circuit 811 shown in FIG. 26, only the following components are shown: the column output circuit COT[1]; the column output circuit COT[j]; the column output circuit COT[n]; the current supply circuit CUREF; a circuit SI[1]; the circuit SI[j]; a circuit SI[n]; a circuit SO[1]; the circuit SO[j]; a circuit SO[n]; the terminal CT11[1]; the terminal CT11[j]; the terminal CT11[n]; the terminal CT12[1]; the terminal CT12[j]; the terminal CT12[n]; the terminal CT13[1]; the terminal CT13[j]; the terminal CT13[n]; the terminal CTref; the transistor Tr71; the transistor Tr72; the transistor Tr73; the transistor Tr74; the transistor Tr75; the transistor Tr76; the transistor Tr77[1]; the transistor Tr77[j]; the transistor Tr77[n]; the transistor Tr78; the capacitor C71; the capacitor C72; the wiring OL[1]; the wiring OL[j]; the wiring OL[n]; the wiring ORP; the wiring OSP; the wiring ORM; the wiring B[1]; the wiring B[j]; the wiring B[n]; the wiring Bref; the wiring VDD1L: and the wiring VSSL. Other circuits, wirings, elements, and reference numerals thereof are not shown.

The configuration of the offset circuit 810 in FIG. 25 is not limited to the offset circuit 811 in FIG. 26. Depending on circumstances or conditions or as needed, the configuration of the offset circuit 811 can be changed.

[Memory Cell Array]

Figure 27:
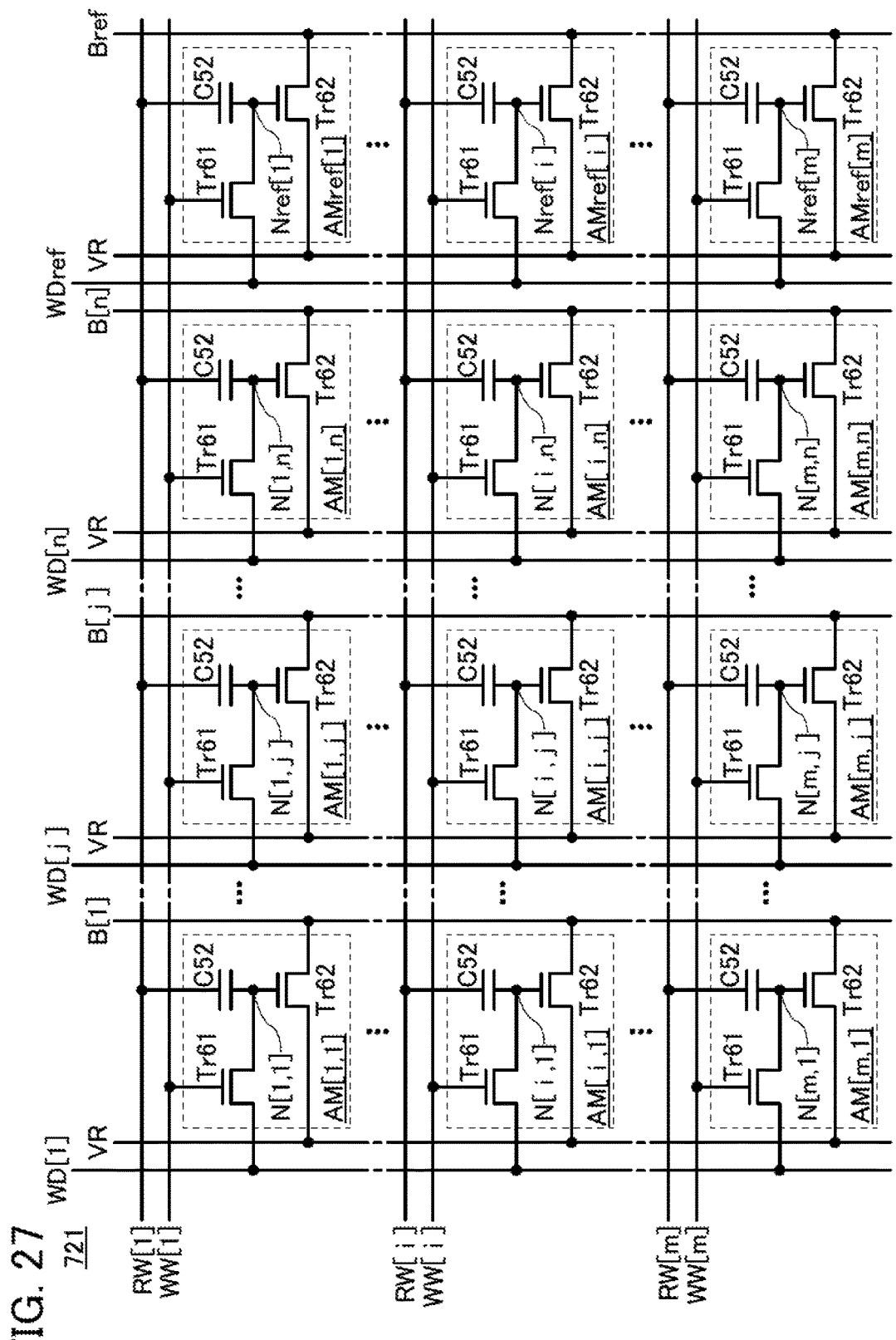
FIG. 27 illustrates a configuration example of a memory cell array.

Next, a circuit configuration example that can be employed in the memory cell array 720 will be described. FIG. 27 shows a memory cell array 721 as an example of the memory cell array 720.

The memory cell array 721 includes the memory cells AM and the memory cells AMref. Each of the memory cells AM included in the memory cell array 721 includes a transistor Tr61, a transistor Tr62, and a capacitor C52. The memory cells AMref[1] to AMref[m] each include the transistor Tr61, the transistor Tr62, and the capacitor C52.

For the connection structure in the memory cell array 721, the description will be made with a focus on the memory cell AM[i,j]. A first terminal of the transistor Tr61 is connected to a gate of the transistor Tr62 and a first terminal of the capacitor C52. A second terminal of the transistor Tr61 is connected to the wiring WD[j]. A gate of the transistor Tr61 is connected to the wiring WW[i]. A first terminal of the transistor Tr62 is connected to the wiring B[j], and a second terminal of the transistor Tr62 is connected to the wiring VR. A second terminal of the capacitor C52 is connected to the wiring RW[i].

In the memory cell AM[i,j], a connection portion of the first terminal of the transistor Tr61, the gate of the transistor Tr62, and the first terminal of the capacitor C52 is a node N[i,j]. In this embodiment, a potential corresponding to the first analog data is held at the node N[i,j].

Next, the explanation is made with a focus on the memory cell AMref[i]. The first terminal of the transistor Tr61 is connected to the gate of the transistor Tr62 and the first terminal of the capacitor C52. The second terminal of the transistor Tr61 is connected to the wiring WDref. A gate of the transistor Tr61 is connected to the wiring WW[i]. A first terminal of the transistor Tr62 is connected to the wiring Bref. The second terminal of the transistor Tr62 is connected to the wiring VR. A second terminal of the capacitor C52 is connected to the wiring RW[i].

In the memory cell AMref[i], a connection portion of the first terminal of the transistor Tr61, the gate of the transistor Tr62, and the first terminal of the capacitor C52 is a node Nref[i].

Each of the transistor Tr61 and the transistor Tr62 is preferably an OS transistor. In addition, each of channel formation regions of the transistors Tr61 and Tr62 preferably includes CAC-OS described in Embodiment 3.

With use of the OS transistors as the transistors Tr61 and Tr62, the leakage current of each of the transistors Tr61 and Tr62 can be suppressed, which enables the product-sum operation circuit to have high accuracy in some cases. Furthermore, with use of the OS transistor as the transistor Tr61, the amount of leakage current from a holding node to a writing word line can be extremely small when the transistor Tr61 is in an off state. In other words, frequencies of refresh operation at the retention node can be reduced; thus, power consumption of a semiconductor device can be reduced.

Note that the transistors Tr62, Tr71 to Tr74, Tr77[j], and Tr78 operate in a saturation region unless otherwise specified. In other words, the gate voltage, source voltage, and drain voltage of each of Tr62, Tr71 to Tr74, Tr77[j], and Tr78 are appropriately biased so that the transistors operate in the saturation region. Note that even in the case where the operation of the transistors Tr62, Tr71 to Tr74, Tr77[j], and Tr78 deviate from the operation in the ideal saturation region, the gate voltage, source voltage, and drain voltage of each of the transistor Tr62, Tr71 to Tr74, Tr77[j], and Tr78 are considered to be appropriately biased as long as the accuracy of output data is obtained within the desired range.

In the memory cell array 721 shown in FIG. 27, only the following components are shown: the memory cell AM[1,1]; the memory cell AM[i,j]; the memory cell AM[m,1]; the memory cell AM[1,j]; the memory cell AM[i,j]; the memory cell AM[m,j]; the memory cell AM[1,n]; the memory cell AM[i,n]; the memory cell AM[m,n]; the memory cell AMref [1]; the memory cell AMref[i]; the memory cell AMref[m]; the wiring RW[1]; the wiring RW[i]; the wiring RW[m]; the wiring WW[1]; the wiring WW[i]; the wiring WW[m]; the wiring WD[1]; the wiring WD[j]; the wiring WD[n]; the wiring WDref; the wiring B[1]; the wiring B[j]; the wiring B[n]; the wiring Bref; the wiring VR; a node N[1,1]; a node N[i,1]; a node N[m,1]; a node N[1,j]; the node N[i,j]; a node N[m,j]; a node N[1,n]; a node N[i,n]; a node N[m,n]; a node Nref[1]; the node Nref[i]; a node Nref[m]; the transistor Tr61; the transistor Tr62; and the capacitor C52. Other circuits, wirings, elements, and reference numerals thereof are not shown.

A circuit of the above-described semiconductor device 800 may be changed appropriately depending on circumstances or conditions or as needed in the range in which the function of the semiconductor device 800 is not lost.

[Operation Example]

An example of operation of the semiconductor device 800 will be described.

Figure 28:
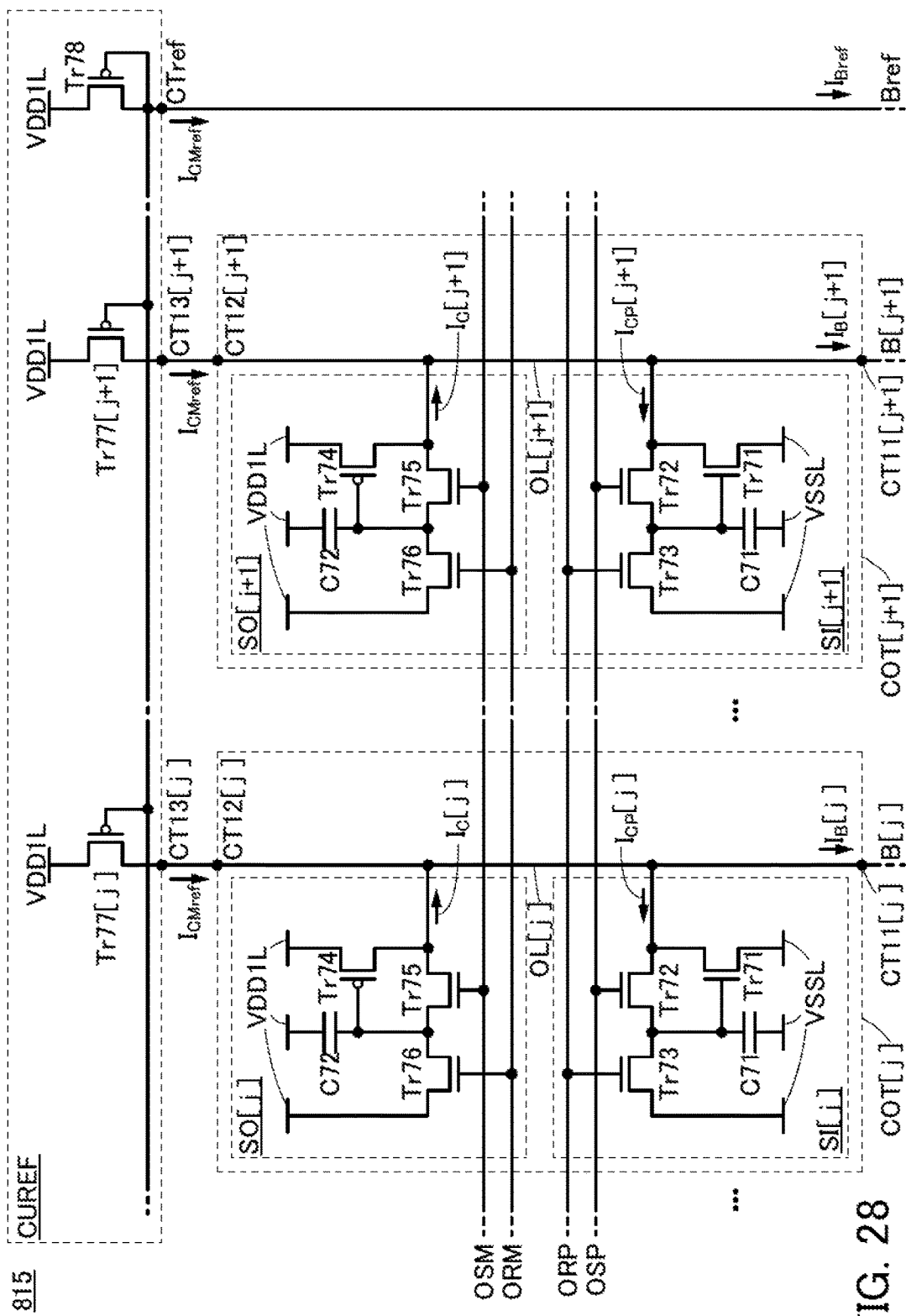
FIG. 28 illustrates a configuration example of an offset circuit.
Figure 29:
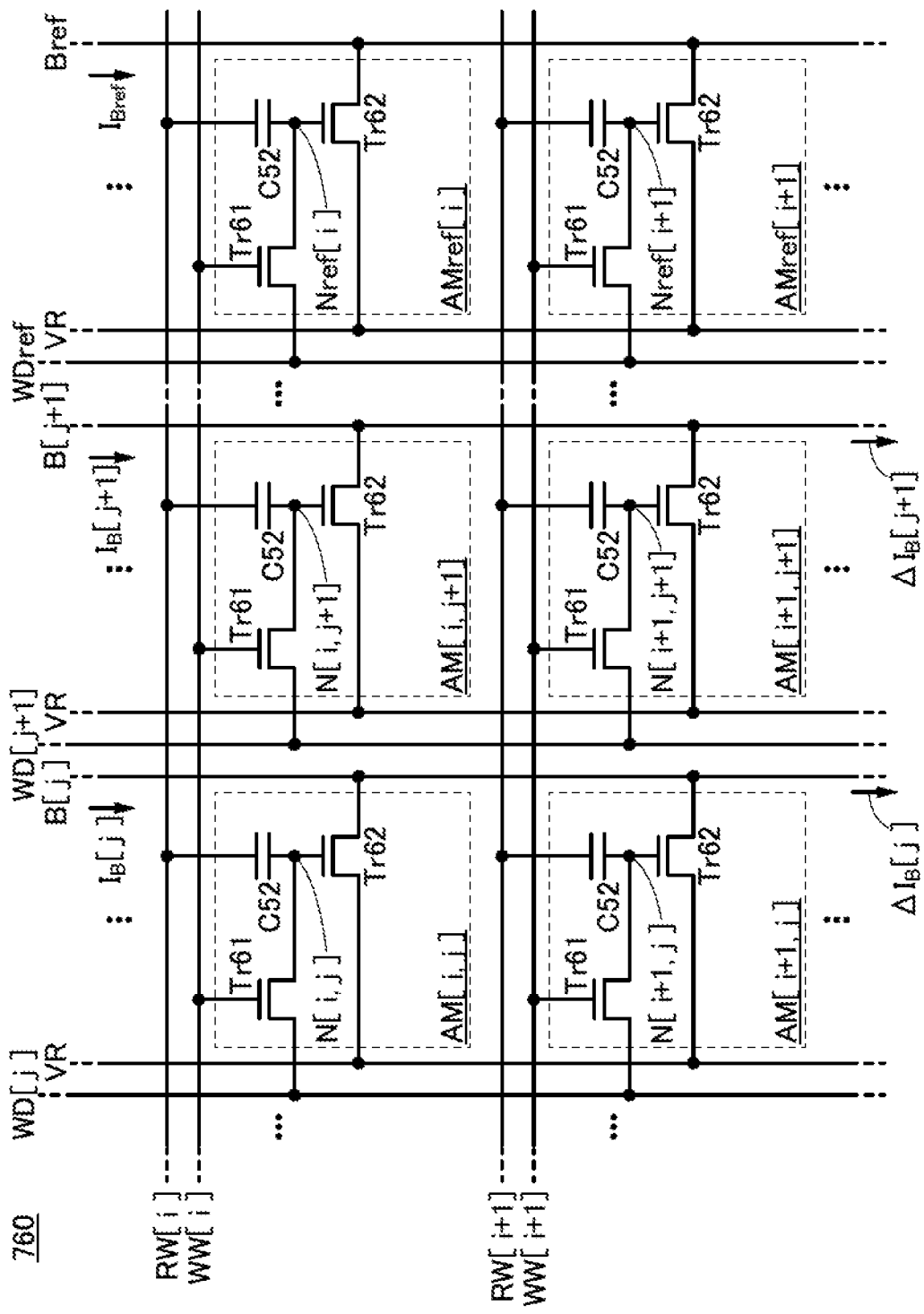
FIG. 29 illustrates a configuration example of a memory cell array.

Note that the semiconductor device 800 described in this operation example includes an offset circuit 815 shown in FIG. 28 as the offset circuit 810 and the memory cell array 760 shown in FIG. 29 as the memory cell array 720 of the semiconductor device 800.

The offset circuit 815 in FIG. 28 has the configuration similar to that of the offset circuit 811 in FIG. 26 and includes the column output circuit COT[j], the column output circuit COT[j+1], and the current supply circuit CUREF.

In the column output circuit COT[j] in FIG. 28, a current flowing from the first terminal of the transistor Tr74 or the first terminal of the transistor Tr75 in the circuit SO[j] to the wiring OL[j] is denoted by $I_C[j]$. In the column output circuit COT[j+1], a current flowing from the first terminal of the transistor Tr74 or the first terminal of the transistor Tr75 in a circuit SO[j−1] to the wiring OL[j+1] is denoted by $I_C[j+1]$. In the current supply circuit CUREF, a current flowing from the terminal CT13[j], a current flowing from a terminal CT13[j+1], and a current flowing from the terminal CTref are each denoted by $I_{CMref}$. Furthermore, in the column output circuit COT[j], a current flowing from the wiring OL[j] to the first terminal of the transistor Tr71 or the first terminal of the transistor Tr72 in the circuit SI[j] is denoted by $I_{CP}[j]$. In the column output circuit COT[j+1], a current flowing from the wiring OL[j+1] to the first terminal of the transistor Tr71 or the first terminal of the transistor Tr72 in the circuit SI[j+1] is denoted by $I_{CP}[j+1]$. Moreover, a current flowing from the terminal CT11[j] of the column output circuit COT[j] to the wiring B[j] is denoted by $I_B[j]$, and a current flowing from a terminal CT11[j+1] of the column output circuit COT[J+1] to the wiring B[j+1] is denoted by $I_B[j+1]$.

The memory cell array 760 illustrated in FIG. 29 has a configuration similar to that of the memory cell array 721 illustrated in FIG. 27. For the description of this operation example, FIG. 29 shows the memory cell AM[i,j], a memory cell AM[i+1,j], a memory cell AM[i,j+1], a memory cell AM[i+1,j+1], the memory cell AMref[i], and a memory cell AMref[i+1].

In FIG. 29, $I_B[j]$ denotes a current input from the wiring B[j], $I_B[j+1]$ denotes a current input from the wiring B[j+1], and $I_{Bref}$ denotes a current input from the wiring $B_{ref}$. In addition, $\Delta I_B[j]$ denotes a current output from the wiring B[j] and $\Delta I_B[j+1]$ denotes a current output from the wiring B[j+1].

Figure 30:
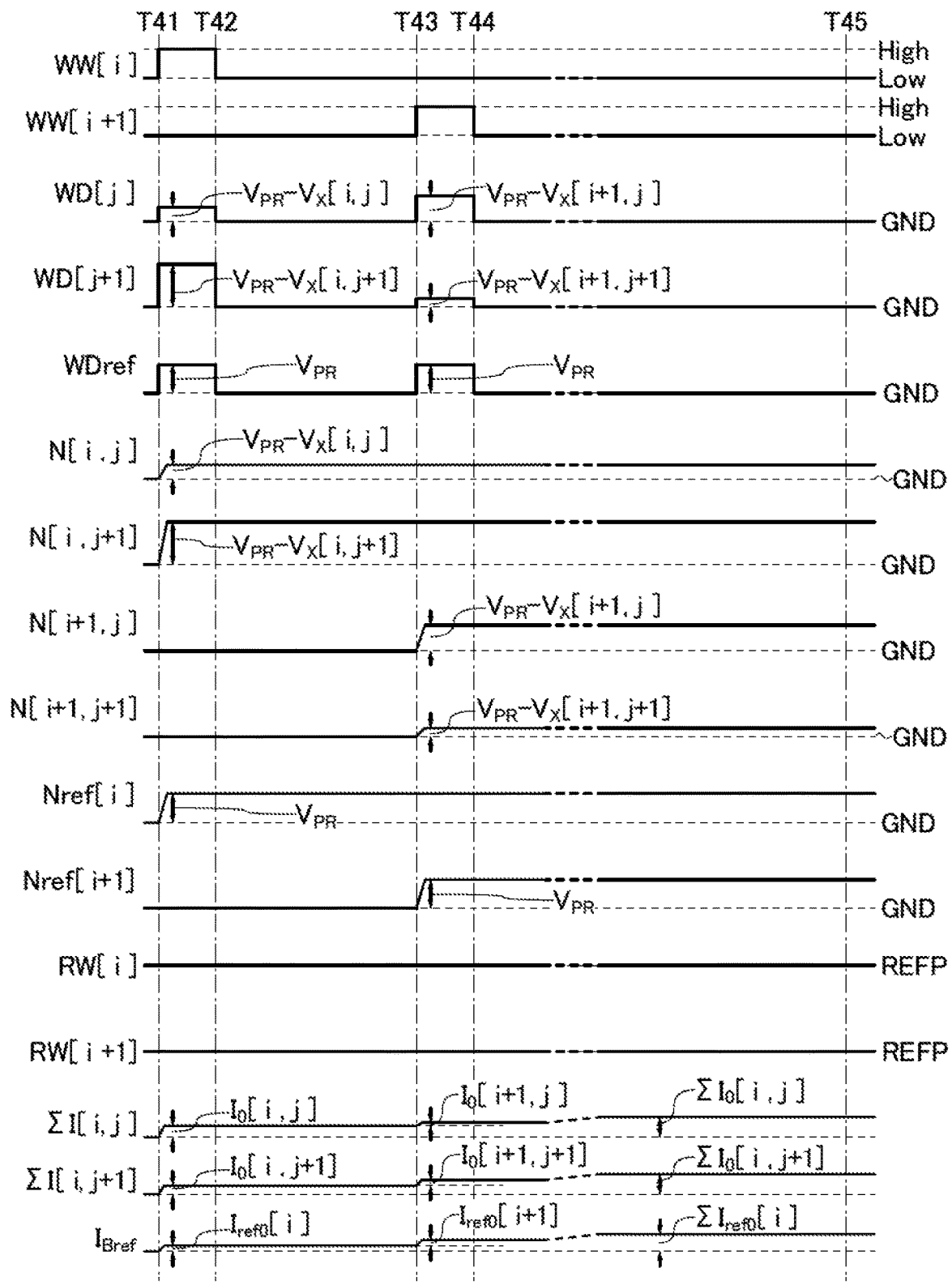
FIG. 30 is a timing chart.
Figure 31:
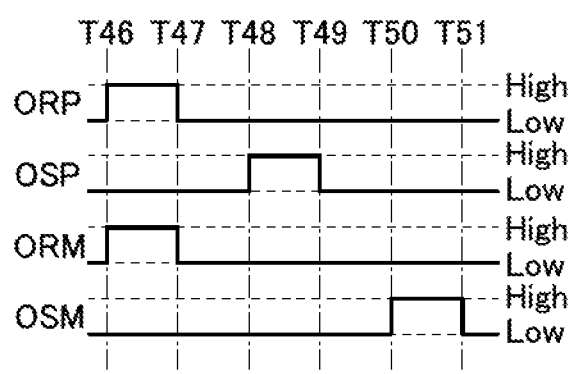
FIG. 31 is a timing chart.
Figure 32:
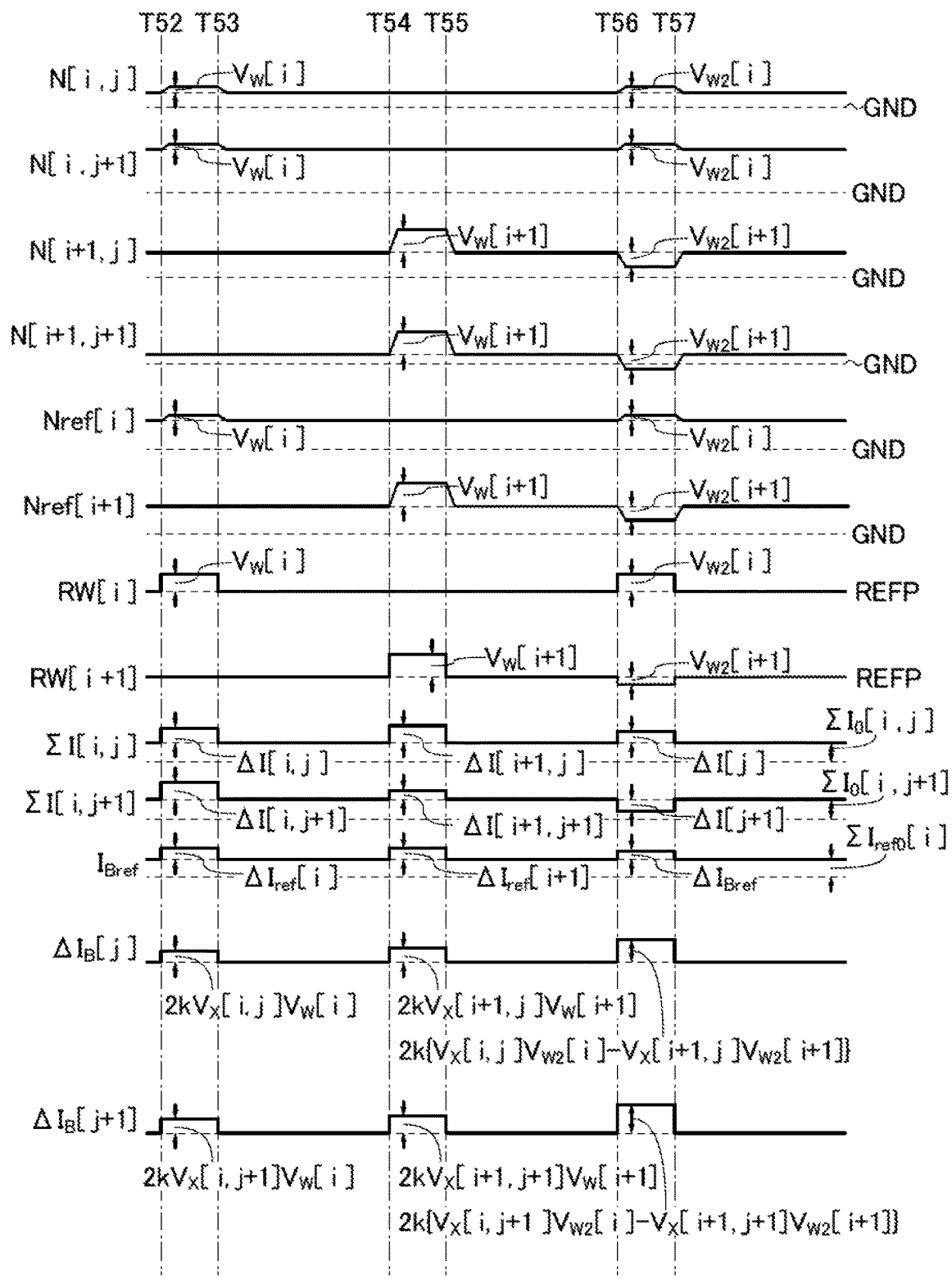
FIG. 32 is a timing chart.

FIG. 30 to FIG. 32 are timing charts showing the operation example of the semiconductor device 800. The timing chart in FIG. 30 shows changes in potentials during a period from Time T41 to Time T45 of the wiring WW[i], the wiring WW[i+1], the wiring WD[j], the wiring WD[j+1], the wiring WDref, the node N[i,j], the node N[i,j+1], the node N[i+1,j], the node N[i+1,j+1], the node Nref[i], the node Nref[i+1], the wiring RW[i], and the wiring RW[i+1]. This timing chart also shows the amount of changes in a current $\Sigma I[i,j]$, a current $\Sigma I[i,j+1]$, and a current $I_{Bref}$. Note that the current $\Sigma I[i,j]$ is a value of current flowing in the transistor Tr62 of the memory cell AM[i,j], which is obtained by summing over i from 1 to m, and the current $\Sigma I[i,j+1]$ is the sum of the amounts of current flowing in the transistor Tr62 of the memory cell AM[i,j+1], which is obtained by summing over i from 1 to m. In the timing chart of FIG. 30, the potentials of the wirings ORP, OSP, ORM, and OSM are constantly low-level potentials (not shown).

The timing chart in FIG. 31 shows the operation during the period after Time T45, which is shown in the timing chart in FIG. 30, to Time T51. The timing chart in FIG. 31 shows the changes in potentials during a period from Time T46 to Time T51 of the wirings ORP, OSP, ORM, and OSM. Note that in Time T46 to Time T51, the potentials of the wiring WW[i], the wiring WW[i+1], the wiring WD[j], the wiring WD[j+1], the wiring WDref, the node N[i,j], the node N[i,j+1], the node N[i+1,j], the node N[i+1,j+1], the node Nref[i], the node Nref[i+1], the wiring RW[i], and the wiring RW[i+1] and the amounts of the current $\Sigma I[i,j]$, the current $\Sigma I[i,j+1]$, and the current $I_{Bref}$ are not changed; thus, the changes in the potentials of the wirings and the nodes and in the currents are not shown in FIG. 31.

The timing chart in FIG. 32 shows the operation during the period after Time T52, which is shown in the timing chart in FIG. 31, to Time T57. The timing chart in FIG. 30 shows the changes in potentials during a period from Time T52 to Time T57 of the node N[i,j], the node N[i,j+1], the node N[i+1,j], the node N[i+1,j+1], the node Nref[i], the node Nref[i+1], the wiring RW[i], and the wiring RW[i+1] and the amounts of the current $\Sigma I[i,j]$, the current $\Sigma I[i,j+1]$, and the current $I_{Bref}$. The potentials of the wiring WW[i], the wiring WW[i+1], the wiring ORP, the wiring OSP, the wiring ORM, and the wiring OSM are kept at low level without any change, and the potentials of the wiring WD[j], the wiring WD[j+1], and the wiring WDref are kept at a ground potential without any change. Thus, in the timing chart in FIG. 32, the changes in potentials of the wiring WW[i], the wiring WW[i+1], the wiring WD[j], the wiring WD[j+1], the wiring WDref, the wiring ORP, the wiring OSP, the wiring ORM, and the wiring OSM are not shown. The timing chart in FIG. 32 also shows the changes in the amounts of the current $\Delta I_B[j]$ and the current $\Delta I_B[j+1]$, which are described later.

During a period from Time T41 to Time T42, the high-level potential (denoted by High in FIG. 30) is supplied to the wiring WW[i], and the low-level potential (denoted by Low in FIG. 30) is supplied to the wiring WW[i+1]. Furthermore, a potential higher than the ground potential (denoted by GND in FIG. 30) by $V_{PR}-V_X[i,j]$ is applied to the wiring WD[j], the potential higher than the ground potential by $V_{PR}-V_X[i,j+1]$ is applied to the wiring WD[j+1], and a potential higher than the ground potential by $V_{PR}$ is applied to the wiring WDref. Moreover, a reference potential (denoted by REFP in FIG. 30) is applied to the wiring RW[i] and the wiring RW[i+1].

The potential $V_X[i,j]$ and the potential $V_X[i,j+1]$ each correspond to the first analog data. The potential $V_{PR}$ corresponds to the reference analog data.

In this period, the high-level potential is supplied to the gates of the transistors Tr61 in the memory cell AM[i,j], the memory cell AM[i,j+1], and the memory cell AMref[i]; accordingly, the transistors Tr61 in the memory cell AM[i,j], the memory cell AM[i,j+1], and the memory cell AMref[i] are turned on. Thus, in the memory cell AM[i,j], the wiring WD[j] and the node N[i,j] are connected to each other, and the potential of the node N[i,j] is $V_{PR}-V_X[i,j]$. In the memory cell AM[i,j+1], the wiring WD[j+1] and the node N[i,j+1] are connected to each other, and the potential of the node N[i,j+1] is $V_{PR}-V_X[i,j+1]$. In the memory cell AMref[i], the wiring WDref and the node Nref[i] are connected to each other, and the potential of the node Nref[i] is $V_{PR}$.

A current flowing from the first to second terminal of the transistor Tr62 in each of the memory cell AM[i,j], the memory cell AM[i,j+1], and the memory cell AMref[i] is considered. The current $I_0[i,j]$ flowing from the wiring B[j] to the second terminal through the first terminal of the transistor Tr62 in the memory cell AM[i,j] can be expressed by the following formula.

[Formula 7]

$$I_0[i,j]=k(V_{PR}-V_X[i,j]-V_{th})^2 \qquad (2.1)$$

In the formula, k is a constant determined by the channel length, the channel width, the mobility, the capacitance of a gate insulating film, and the like of the transistor Tr62. Furthermore, $V_{th}$ is a threshold voltage of the transistor Tr62.

At this time, the current flowing from the terminal CT11[j] of the column output circuit COT[j] to the wiring B[j] is $I_0[i,j]$.

Similarly, the current $I_0[i,j+1]$ flowing from the wiring B[j+1] to the second terminal of the transistor Tr62 in the memory cell AM[i,j+1] through the first terminal thereof can be expressed by the following formula.

$$I_0[i,j+1]=k(V_{PR}-V_X[i,j+1]-V_{th})^2 \qquad \text{[Formula 8]}$$

At this time, the current flowing from the terminal CT11[j+1] of the column output circuit COT[j+1] to the wiring B[j+1] is $I_0[i,j+1]$.

The current $I_{ref0}[i]$ flowing from the wiring Bref to the second terminal of the transistor Tr62 in the memory cell AMref[i] through the first terminal thereof can be expressed by the following formula.

[Formula 9]

$$I_{ref0}[i]=k(V_{PR}-V_{th})^2 \qquad (2.2)$$

At this time, the current flowing from the terminal CTref of the current supply circuit CUREF to the wiring Bref is $I_{ref0}[i]$.

Note that since the low-level potential is supplied to the gates of the transistors Tr61 in the memory cell AM[i+1,j], the memory cell AM[i+1,j+1], and the memory cell AMref[i+1], the transistors Tr61 in the memory cell AM[i+1,j], the memory cell AM[i+1,j+1], and the memory cell AMref[i+1] are turned off. Thus, the potentials are not held at the node N[i+1,j], the node N[i+1, j+1], and the node Nref[i+1].

During a period from Time T42 to Time T43, the low-level potential is applied to the wiring WW[i]. At this time, the low-level potential is supplied to the gates of the transistors Tr61 in the memory cell AM[i,j], the memory cell AM[i,j+1], and the memory cell AMref[i], and accordingly, the transistors Tr61 in the memory cells AM[i,j], AM[i,j+1], and AMref[i] are turned off.

The low-level potential has been applied to the wiring WW[i+1] continuously since before Time T42. Thus, the transistors Tr61 in the memory cell AM[i+1,j], the memory cell AM[i+1,j+1], and the memory cell AMref[i+1] have been kept in an off state since before Time T42.

Since the transistors Tr61 in the memory cell AM[i,j], the memory cell AM[i,j+1], the memory cell AM[i+1,j], the memory cell AM[i+1,j+1], the memory cell AMref[i], and the memory cell AMref[i+1] are each in an off state as described above, the potentials at the node N[i,j], the node N[i,j+1], the node N[i+1,j], the node N[i+1, j+1], the node Nref[i], and the node Nref[i+1] are held in a period from Time T42 to Time T43.

In particular, as described above, when an OS transistor is used as each of the transistors Tr61 in the memory cell AM[i,j], the memory cell AM[i,j+1], the memory cell AM[i+1,j], the memory cell AM[i+1,j+1], the memory cell AMref[i], and the memory cell AMref[i+1], the amount of leakage current flowing between the source and the drain of each of the transistors Tr61 can be made small, which makes it possible to hold the potentials at the nodes for a long time.

During the period from Time T42 to Time T43, the ground potential is applied to the wiring WD[j], the wiring WD[j+1], and the wiring WDref Since the transistors Tr61 in the memory cell AM[i,j], the memory cell AM[i,j+1], the memory cell AM[i+1,j], the memory cell AM[i+1,j+1], the memory cell AMref[i], and the memory cell AMref[i+1] are each in an off state, the potentials held at the nodes in the memory cell AM[i,j], the memory cell AM[i,j+1], the memory cell AM[i+1,j], the memory cell AM[i+1,j+1], the memory cell AMref[i], and the memory cell AMref[i+1] are not rewritten by application of potentials from the wiring WD[j], the wiring WD[j+1], and the wiring WDref.

During a period from Time T43 to Time T44, the low-level potential is applied to the wiring WW[i], and a high-level potential is applied to the wiring WW[i+1]. Furthermore, the potential higher than the ground potential by $V_{PR}-V_X[i+1,j]$ is applied to the wiring WD[j], the potential higher than the ground potential by $V_{PR}-V_X[i+1,j+1]$ is applied to the wiring WD[j+1], and the potential higher than the ground potential by $V_{PR}$ is applied to the wiring WDref. Moreover, the reference potential is continuously being applied to the wiring RW[i] and the wiring RW[i+1] continuously since Time T42.

Note that the potential $V_X[i+1,j]$ and the potential $V_X[i+1,j+1]$ are each a potential corresponding to the first analog data.

In this period, the high-level potential is supplied to the gates of the transistors Tr61 in the memory cell AM[i+1,j], the memory cell AM[i+1,j+1], and the memory cell AMref[i+1], and accordingly, the transistors Tr61 in the memory cell AM[i+1,j], the memory cell AM[i+1,j+1], and the memory cell AMref[i+1] are each turned on. Thus, the node N[i+1,j] in the memory cell AM[i+1,j] is connected to the wiring WD[j], and the potential of the node N[i+1,j]

becomes $V_{PR}-V_X[i+1,j]$. In the memory cell AM[i+1,j+1], the wiring WD[j+1] and the node N[i+1,j+1] are connected to each other, and the potential of the node N[i+1,j+1] becomes $V_{PR}-V_X[i+1,j+1]$. In the memory cell AMref[i+1], the wiring WDref and the node Nref[i+1] are connected to each other, and the potential of the node Nref[i+1] becomes $V_{PR}$.

The current flowing from the first to second terminal of the transistor Tr62 in each of the memory cell AM[i+1,j], the memory cell AM[i+1,j+1], and the memory cell AMref[i+1] is considered. The current $I_0[i+1,j]$ flowing from the wiring B[j] to the second terminal through the first terminal of the transistor Tr62 in the memory cell AM[i+1,j] can be expressed by the following formula.

$$I_0[i+1,j]=k(V_{PR}-V_X[i+1,j]-V_{th})^2 \qquad \text{[Formula 10]}$$

At this time, the current flowing from the terminal CT11[j] of the column output circuit COT[j] to the wiring B[j] is $I_0[i,j]+I_0[i+1,j]$.

Similarly, the current $I_0[i+1,j+1]$ flowing from the wiring B[j+1] to the second terminal of the transistor Tr62 in the memory cell AM[i+1,j+1] through the first terminal thereof can be expressed by the following formula.

$$I_0[i+1,j+1]=k(V_{PR}-V_X[i+1,j+1]-V_{th})^2 \qquad \text{[Formula 11]}$$

At this time, the current flowing from the terminal CT11[j+1] of the column output circuit COT[j+1] to the wiring B[j+1] is $I_0[i,j+1]+I_0[i+1,j+1]$.

The current $I_{ref0}[i+1]$ flowing from the wiring Bref to the second terminal through the first terminal of the transistor Tr62 in the memory cell AMref[i+1] can be expressed by the following formula.

$$I_{ref0}[i-1]=k(V_{PR}-V_{th})^2 \qquad \text{[Formula 12]}$$

At this time, the current flowing from the terminal CTref of the current supply circuit CUREF to the wiring Bref is $I_{ref0}[i]+I_{ref0}[i+1]$.

During a period from Time T44 to Time T45, the potential corresponding to the first analog data is written to the rest of the memory cells AM, and the potential $V_{PR}$ is written to the rest of memory cells AMref, in a manner similar to that of the operation during the period from Time T41 to Time T42 and that of the operation during the period from Time T43 to Time T44. Thus, the sum of the amounts of current flowing in the transistors Tr62 in all of the memory cells AM corresponds to the amount of current flowing from the wiring B[j] that is denoted by $\Sigma I_0[i,j]$ ($\Sigma I_0[i,j]$ represents the summation of the current $I_0[i,j]$ over i from 1 to m).

Here, the description will be made with a focus on the current supply circuit CUREF. The sum of the amounts of current flowing through the transistors Tr62 in the memory cells AMref[1] to AMref[m] flows into the wiring Bref that is electrically connected to the terminal CTref of the current supply circuit CUREF. In other words, the current corresponding to $I_{Bref}=\Sigma I_{ref0}[i]$ (here, $\Sigma I_{ref0}[i]$ is the summation of $I_{ref0}[i]$ over i from 1 to m) flows into the wiring Bref; thus, the current is output to the first terminal from the second terminal of the transistor Tr78 in accordance with the potential of the terminal CTref of the current supply circuit CUREF.

In FIG. 30, the current that is output from the terminal CTref of the current supply circuit CUREF is denoted by $I_{CMref}$. In this specification, the current that is output from the terminal CTref of the current supply circuit CUREF before Time T49 is denoted by $I_{CMref0}$.

Therefore, the current $I_{CMref0}$ that is output from the terminal CTref of the current supply circuit CUREF can be represented by the following formula.

[Formula 13]

$$I_{CMref0} = I_{Bref} = \sum_i I_{ref0}[i] \qquad (2.3)$$

Note that in the current supply circuit CUREF, the potentials of the gates of the transistors Tr77[1] to Tr77[n] are each equal to the potential of the gate of the transistor Tr78 (potential of the terminal CTref); accordingly, the currents $I_{CMref0}$ output from the terminals CT13[1] to CT13[n] are equal to each other. The size and configuration of the transistors Tr77[1] to Tr77[n] and the transistor Tr78 are the same as each other.

A period from Time T46 to Time T51 is described with reference to FIG. 31. During the period from Time T46 to Time T47, the wiring ORP is set at the high-level potential, and the wiring ORM is set at the high-level potential. At this time, the high-level potential is supplied to the gates of the transistors Tr73 in the circuits SI[1] to SI[n], so that the transistors Tr73 are turned on. Thus, the low-level potential is supplied to the first terminals of the capacitors C71 in the circuits SI[1] to SI[n], and thus the potentials of the capacitors C51 are initialized. Moreover, the high-level potential is supplied to the gates of the transistors Tr76 in the circuits SO[1] to SO[n], so that the transistors Tr76 are turned on. Thus, the low-level potential is supplied to the first terminals of the capacitors C72 in the column output circuits OUT[1] to OUT[n], and thus the potentials of the capacitors C72 are initialized. When Time T46 starts, the low-level potential is supplied to the wiring OSP, so that the transistors Tr72 in the circuits SI[1] to SI[n] are turned off, and the low-level potential is supplied to the wiring OSM, so that the transistors Tr75 in the circuits SO[1] to SO[n] are turned off.

During a period from Time T47 to Time T48, the wirings ORP and ORM are each set to the low-level potential. At this time, the low-level potential is supplied to the gates of the transistors Tr73 in the circuits SI[1] to SI[n], so that the transistors Tr73 are turned off. Furthermore, the low-level potential is supplied to the gates of the transistors Tr76 in the circuits SO[1] to SO[n], so that the transistors Tr76 are turned off.

During a period from Time T48 to Time T49, the wiring OSP is set at the high-level potential. At this time, the high-level potential is applied to the gates of the transistors Tr72 in the circuits SI[1] to SI[n], so that the transistors Tr72 are brought into an on state. The current $I_B[j]$ output from the column output circuit COT[j] is $\Sigma I_0[i,j]$ (here, $\Sigma I_0[i,j]$ is the summation of $I_0[i,j]$ over i from 1 to m). When the current $I_{CMref0}$ is greater than the current $I_B[j]$, current flows into the first terminals of the capacitors C71 from the first terminals of the transistors Tr72 through the second terminals of the transistors Tr72, and positive potentials are held in the capacitors C71. Thus, the potentials of the gates of the transistors Tr71 are held, so that the current corresponding to the potentials of the gates of the transistors Tr71 flows between the sources and the drains of the transistors Tr71.

When Time T49 starts, the low-level potential is supplied to the wiring OSP, so that the transistors Tr72 in the circuits SI[1] to SI[n] are turned off. The potentials of the gates of the transistors Tr71 are held in the capacitors C71, so that even after Time T49, the same amount of current keeps flowing between the source and the drain of each of the transistors Tr71.

During a period from Time T50 to Time T51, the wiring OSM is set at the high-level potential. At this time, the high-level potential is supplied to the gates of the transistors Tr75 in the circuits SO[1] to SO[n], so that the transistors Tr75 are turned on. The current $I_B[j]$ output from the column output circuit COT[j] is $\Sigma I_0[i,j]$ (here, $\Sigma I_0[i,j]$ is the summation of $I_0[i,j]$ over i from 1 to m). When the current $I_{CMref0}$ is smaller than the current $I_B[j]$, the current flows into the first terminals of the transistors Tr75 from the first terminals of the capacitors C72 through the second terminals of the transistors Tr75, and negative potentials are held in the capacitors C72. Thus, the potentials of the gates of the transistors Tr74 are held, so that the current corresponding to the potential of the gate of each of the transistors Tr74 flows between the source and the drain of the transistor Tr74.

When Time T51 starts, the low-level potential is supplied to the wiring OSM, so that the transistors Tr75 in the circuits SO[1] to SO[n] are turned off. The potentials of the gates of the transistors Tr74 are held in the capacitors C72, so that even after Time T51, the same amount of current keeps flowing between the source and the drain of each of the transistors Tr74.

Note that in the timing chart in FIG. 31, the operation for switching the conducting and non-conducting states of the transistor Tr72 (during the period from Time T48 to Time T49) is performed before the operation for switching the conducting and non-conducting states of the transistor Tr75 (during the period from Time T50 to Time T51); however, the order of the operation of the offset circuit 815 is not limited thereto. For example, the operation for switching the conducting and non-conducting states of the transistor Tr75 (during the period from Time T50 to Time T51) may be performed first, and then the operation for switching the conducting and non-conducting states of the transistor Tr72 (during the period from Time T48 to Time T49) may be performed.

Here, the description will be made with a focus on the column output circuit COT[j] during a period from Time T46 to Time T52 (shown in FIG. 32). In the column output circuit COT[j], the current flowing from the wiring OL[j] to the first terminal of the transistor Tr71 is denoted by $I_{CP}[j]$, and the current flowing from the first terminal of the transistor Tr74 to the wiring OL[1] is denoted by $I_C[j]$. Into the terminal CT12[j] of the column output circuit COT[j], the current $I_{CMref0}$ from the terminal CT13[j] of the current supply circuit CUREF is input. The sum of the amounts of current flowing through each of the transistors Tr62 in the memory cells AM[1,i] to AM[n,i] flows in the wiring B[j] electrically connected to the column output circuit COT[j]. In other words, the current $\Sigma I_0[i,j]$ ($\Sigma$ represents the current obtained by summing over i from 1 to m) flows in the wiring B[j]. During the period from Time T46 to Time T52, in the column output circuit COT[j], the current $I_{CMref0}$ that is to be input is different from that is to be output, the current $I_C[j]$ is supplied to the wiring OL[j] through the circuit SO[j], or the current $I_{CP}[j]$ is discharged from the wiring OL[j] through the circuit SI[j]. Thus, the above provides the following formula.

[Formula 14]

$$I_{CMref0} + I_C[j] - I_{CP}[j] = \sum_i I_0[i, j] \qquad (2.4)$$

The operation after Time T52 is described with reference to FIG. 32. During a period from Time T52 to Time T53, a potential higher than the reference potential (denoted by REFP in FIG. 32) by $V_W[i]$ is applied to the wiring RW[i]. At this time, the potential $V_W[i]$ is applied to the second terminals of the capacitors C52 in the memory cells AM[i,1] to AM[i,n] and the memory cell AMref[i], so that the potentials of the gates of the transistors Tr62 increase.

Note that the potential $V_W[i]$ is a potential corresponding to the second analog data.

An increase in the potential of the gate of the transistor Tr62 corresponds to the potential obtained by multiplying a change in potential of the wiring RW[i] by a capacitive coupling coefficient determined by the memory cell configuration. The capacitive coupling coefficient is calculated on the basis of the capacitance of the capacitor C52, the gate capacitance of the transistor Tr62, and the parasitic capacitance. In this operation example, to avoid complexity of explanation, a value corresponding to an increase in the potential of the wiring RW[i] is regarded as the same value corresponding to an increase in the potential of the gate of the transistor Tr62. This means that the capacitive coupling coefficient in each of the memory cell AM and the memory cell AMref is regarded as 1.

Note that the capacitive coupling coefficients are each 1. When the potential $V_W[i]$ is applied to the second terminals of the capacitors C52 in the memory cell AM[i,j], the memory cell AM[i,j+1], and the memory cell AMref[i], the potentials of the node N[i,j], the node N[i,j+1], and the node Nref[i] each increase by $V_W[i]$.

A current flowing from the first to second terminal of the transistor Tr62 in each of the memory cell AM[i,j], the memory cell AM[i,j+1], and the memory cell AMref[i] is considered. The current I[i,j] flowing from the wiring B[j] to the second terminal of the transistor Tr62 in the memory cell AM[i,j] through the first terminal thereof can be expressed by the following formula.

[Formula 15]

$$I[i,j] = k(V_{PR} - V_X[i,j] + V_W[i] - V_{th})^2 \quad (2.5)$$

In other words, by supplying the potential $V_W[i]$ to the wiring RW[i], the current flowing from the wiring B[j] increases by $I[i,j] - I_0[i,j]$ (denoted by $\Delta I[i,j]$ in FIG. 32).

Similarly, the current I[i,j+1] flowing from the wiring B[j+1] to the second terminal of the transistor Tr62 in the memory cell AM[i,j+1] through the first terminal thereof can be expressed by the following formula.

$$I[i,j+1] = k(V_{PR} - V_X[i,j+1] + V_W[i] - V_{th})^2 \quad [\text{Formula 16}]$$

In other words, by supplying the potential $V_W[i]$ to the wiring RW[i], the current flowing from the wiring B[j+1] increases by $I[i,j+1] - I_0[i,j+1]$ (denoted by $\Delta I[i,j-1]$ in FIG. 32).

Furthermore, the current $I_{ref}[i]$ flowing from the wiring Bref to the second terminal of the transistor Tr62 in the memory cell AMref[i] through the first terminal thereof can be expressed by the following formula.

[Formula 17]

$$I_{ref}[i] = k(V_{PR} + V_W[i] - V_{th})^2 \quad (2.6)$$

In other words, by supplying the potential $V_W[i]$ to the wiring RW[i], the current flowing from the wiring Bref increases by $I_{ref}[i] - I_{ref0}[i]$ (denoted by $\Delta I_{ref}[i]$ in FIG. 32).

Here, the description will be made with a focus on the current supply circuit CUREF. The sum of the amounts of current flowing through the transistors Tr62 in the memory cells AMref[1] to AMref[m] flows into the wiring Bref that is electrically connected to the current supply circuit CUREF. That is, the current $I_{Bref}$, which is the current $\Sigma I_{ref0}[i]$, flows into the wiring Bref (here, $\Sigma I_{ref0}[i]$ is the summation of $I_{ref0}[i]$ over i from 1 to m). The current flows from the second terminal to the first terminal of the transistor Tr78 in accordance with the potential of the terminal CTref of the current supply circuit CUREF.

Thus, the current $I_{CMref}$ that is output from the terminal CTref of the current supply circuit CUREF can be represented by the following formula.

[Formula 18]

$$I_{CMref} = \sum_i I_{ref}[i] \quad (2.7)$$

Note that in the current supply circuit CUREF, the potentials of the gates of the transistors Tr77[1] to Tr77[n] are equal to the potential of the gate of the transistor Tr78 (potential of the terminal CTref); accordingly, the currents $I_{CMref}$ output from the terminals CT13[1] to CT13[n] are equal to each other.

Here, the current $\Delta I_B[j]$ output from the wiring B[j] is focused on. During the period from Time T51 to Time T52, Formula (2.4) is satisfied, and the current $\Delta I_B[j]$ is not output from the wiring B[j].

During the period from Time T52 to Time T53, a potential higher than the reference potential by $V_W[i]$ is applied to the wiring RW[i], and the current flowing between the source and the drain of the transistor Tr62 in the memory cell AM[i,j] changes. Thus, the current $\Delta I_B[j]$ is output from the wiring B[j]. Specifically, in the column output circuit COT [j], the current $I_C[j]$ flows from the first terminal of the transistor Tr74 in the circuit SO to the wiring OL[j], the current $I_{CP}[j]$ flows from the wiring OL[j] to the first terminal of the transistor Tr71 in the current SI. Then, to the terminal CT12[j] of the column output circuit COT[j], the current $I_{CMref}$ is input from the terminal CT13[j] of the current supply circuit CUREF. Thus, the current $\Delta I_B[j]$ can be represented by the following formula using $\Sigma I[i,j]$, which is the summation of current I[i,j] over i from 1 to m. Here, the current I[i,j] is current flowing between the source and the drain of the transistor Tr62 in the memory cell AM[i,j].

[Formula 19]

$$\Delta I_B[j] = (I_C[j] + I_{CMref} - I_{CP}[j]) - \sum_i I[i, j] \quad (2.8)$$

For Formula (2.8), Formulae (2.1) to (2.7) are used, whereby the following formula can be obtained.

[Formula 20]

$$\Delta I_B[j] = 2k \sum_i (V_X[i, j] V_W[i]) \quad (2.9)$$

According to Formula (2.9), the current $\Delta I_B[j]$ is a value corresponding to the sum of products of the potential $V_X[i,j]$ that is the first analog data and the potential $V_W[i]$ that is the second analog data. Accordingly, when the current $\Delta I_B[j]$ is calculated, the value of the sum of products of the first analog data and the second analog data can be obtained.

During the period from Time T52 to Time T53, when all of the wirings RW[1] to RW[m] except the wiring RW[i] are set to have a reference potential, the relation, $V_W[g]=0$ (g is an integer that is greater than or equal to 1 and less than or equal to m and not i), is satisfied. Thus, according to Formula (2.9), $\Delta I_B[j]=2 kV_X[i,j]V_W[i]$ is output. In other words, the data corresponding to the product of the first analog data stored in the memory cell AM[i,j] and the second analog data corresponding to a selection signal supplied to the wiring RW[i] is output from the wiring B[j].

Furthermore, a differential current output from the wiring B[j+1] is expressed as $\Delta I_B[j+1]=2 kV_X[i,j+1]V_W[i]$. The data corresponding to the product of the first analog data stored in the memory cell AM[i,j+1] and the second analog data corresponding to a selection signal supplied to the wiring RW[i] is output from the wiring B[j+1].

During a period from Time T53 to Time T54, the ground potential is supplied to the wiring RW[i]. The ground potential is supplied to the second terminals of the capacitors C52 in the memory cells AM[i,j] to AM[i,n] and the memory cell AMref[i]. Thus, the potentials of the nodes N[i,1] to N[i,n] and the node Nref[i] return to the potentials during the period from Time T51 to Time T52.

During a period from Time T54 to Time T55, the wirings RW[1] to RW[m] except the wiring RW[i+1] are set to have the reference potential, and a potential higher than the reference potential by $V_W[i+1]$ is applied to the wiring RW[i+1]. At this time, as in the operation during the period from Time T52 to Time T53, the potential $V_W[i+1]$ is supplied to the second terminals of the capacitors C52 in the memory cells AM[i+1,1] to AM[i+1,n] and the memory cell AMref[i+1], so that the potentials of the gates of the transistors Tr62 increase.

The potential $V_W[i+1]$ corresponds to the second analog data.

As described above, the capacitive coupling coefficients of the memory cells AM and the memory cell AMref are each 1. When the potential $V_W[i+1]$ is applied to the second terminals of the capacitors C52 in the memory cell AM[i+1,j], the memory cell AM[i+1,j+1], and the memory cell AMref[i+1], the potentials of the node N[i+1,j], the node N[i+1,j+1], and the node Nref[i+1] each increase by $V_W[i+1]$.

When the potentials of the node N[i+1,j], the node N[i+1,j+1], and the node Nref[i+1] increase by $V_W[i+1]$, the amount of current flowing in each of the transistors Tr62 in the memory cell AM[i+1,j], the memory cell AM[i+1,j+1], and the memory cell AMref[i+1] increases. When the current flowing in the transistor Tr62 in the memory cell AM[i+1,j] is denoted by I[i+1,j], the current flowing from the wiring B[j] increases by $I[i+1,j]-I_0[i+1,j]$ (denoted by $\Delta I[i+1,j]$ in FIG. 32). Similarly, when the current flowing in the transistor Tr62 in the memory cell AM[i+1,j+1] is denoted by I[i+1,j+1], the current flowing from the wiring B[j+1] increases by $I[i+1,j+1]-I_0[i+1]$ (denoted by $\Delta I[i+1,j+1]$ in FIG. 32). When the current flowing in the transistor Tr62 in the memory cell AMref[i+1] is denoted by $I_{ref}[i+1]$, the current flowing from the wiring Bref increases by $I_{ref}[i+1]-I_{ref0}[i+1]$ (denoted by $\Delta I_{ref}[i+1]$ in FIG. 32).

The operation during the period from Time T54 to Time T55 can be similar to the operation during the period from Time T52 to Time T53. Thus, when Formula (2.9) is applied to the operation during the period from Time T54 to Time T55, the differential current that is output from the wiring B[j] is expressed as $\Delta I_B[j]=2 kV_X[i+1,j]V_W[i+1]$. In other words, the data corresponding to the product of the first analog data stored in the memory cell AM[i+1,j] and the second analog data corresponding to a selection signal applied to the wiring RW[i+1] is output from the wiring B[1].

Furthermore, the differential current output from the wiring B[j+1] is expressed as $\Delta I_B[j+1]=2 kV_X[i+1,j+1]V_W[i+1]$. The data corresponding to the product of the first analog data stored in the memory cell AM[i+1,j+1] and the second analog data corresponding to a selection signal applied to the wiring RW[i+1] is output from the wiring B[j+1].

During a period from Time T52 to Time T53, the ground potential is supplied to the wiring RW[i+1]. In this period, the ground potential is supplied to the second terminals of the capacitors C52 in the memory cells AM[i+1,1] to AM[i+1,n] and the memory cell AMref[i+1], and the potentials of nodes N[i+1,1] to N[i+1,n] and the node Nref[i+1] return to the potentials in the period from Time T53 to Time T54.

During a period from Time T56 to Time T57, the wirings RW[1] to RW[m] except the wiring RW[i] and the wiring RW[i+1] are set to have the reference potential, a potential higher than the reference potential by $V_{W2}[i]$ is applied to the wiring RW[i], and a potential lower than the reference potential by $V_{W2}[i+1]$ is applied to the wiring RW[i+1]. At this time, as in the operation during the period from Time T52 to Time T53, the potential $V_{W2}[i]$ is supplied to the second terminals of the capacitors C52 in the memory cells AM[i,1] to AM[i,n] and the memory cell AMref[i], so that potentials of the gates of the transistors Tr62 in the memory cells AM[i,1] to AM[i,n] and the memory cell AMref[i] increase. Concurrently, the potential $-V_{W2}[i+1]$ is applied to the second terminals of the capacitors C52 in the memory cells AM[i+1,1] to AM[i+1,n] and the memory cell AMref[i+1], so that the potentials of the gates of the transistors Tr62 in the memory cells AM[i+1,1] to AM[i+1,n] and the memory cell AMref[i+1] decrease.

The potential $V_{W2}[i]$ and the potential $V_{W2}[i+1]$ are potentials each corresponding to the second analog data.

Note that the capacitive coupling coefficients of the memory cell AM and the memory cell AMref are each 1. When the potential $V_{W2}[i]$ is supplied to the second terminals of the capacitors C52 in the memory cell AM[i,j], the memory cell AM[i,j+1], and the memory cell AMref[i], the potentials of the node N[i,j], the node N[i,j+1], and the node Nref[i] each increase by $V_{W2}[i]$. When the potential $-V_{W2}[i+1]$ is supplied to the second terminals of the capacitors C52 in the memory cell AM[i+1,j], the memory cell AM[i+1,j+1], and the memory cell AMref[i+1], the potentials of the node N[i+1,j], the node N[i+1,j+1], and the node Nref[i+1] each decrease by $V_{W2}[i+1]$.

When each of the potentials of the node N[i,j], the node N[i,j+1], and the node Nref[i] increases by $V_{W2}[i]$, the amount of current flowing in each of the transistors Tr62 in the memory cell AM[i,j], the memory cell AM[i,j+1], and the memory cell AMref[i] increases. Here, the current flowing in the transistor Tr62 in the memory cell AM[i,j] is denoted by I[i,j], the current flowing in the transistor Tr62 in the memory cell AM[i,j+1] is denoted by I[i,j+1], and the current flowing in the transistor Tr62 in the memory cell AMref[i] is denoted by $I_{ref}[i]$.

When the potentials of the node N[i+1,j], the node N[i+1,j+1], and the node Nref[i+1] each decrease by $V_{W2}[i+1]$, the amount of current flowing in each of the transistors Tr62 in the memory cell AM[i+1,j], the memory cell AM[i+1,j+1], and the memory cell AMref[i+1] decreases. Here, the current flowing in the transistor Tr62 in the memory cell AM[i+1,j] is denoted by $I_2[i,j]$, the current flowing in the transistor Tr62 in the memory cell AM[i+1,j+1] is denoted by $I_2[i,j+1]$, and the current flowing in the transistor Tr62 in the memory cell AMref[i+1] is denoted by $I_{2ref}[i+1]$.

At this time, the current flowing to the wiring B[j] increases by $(I_2[i,j]-I_0[i,j])+(I_2[i+1,j]-I_0[i+1,j])$ (denoted by $\Delta I[j]$ in FIG. 32). The current flowing to the wiring B[j+1] increases by $(I_2[i,j+1]-I_0[i,j+1])+(I_2[i+1,j+1]-I_0[i+1,j+1])$ (denoted by $\Delta I[j+1]$ in FIG. 32, which is a negative current). The current flowing to the wiring Bref increases by $(I_{ref}[i,j]-I_{ref0}[i,j])+(I_{ref}[i+1,j]-I_{ref0}[i+1,])$ (denoted by $\Delta I_{Bref}$ in FIG. 32).

The operation during the period from Time T56 to Time T57 can be similar to the operation during the period from Time T52 to Time T53. When Formula (2.9) is applied to the operation during the period from Time T56 to Time T57, the differential current that is output from the wiring B[j] is expressed as $\Delta I_B[j]=2k\{V_X[i,j]V_{W2}[i]-V_X[i+1,j]V_{W2}[i+1]\}$. Thus, the data corresponding to the sum of products of the first analog data stored in each of the memory cell AM[i,j] and the memory cell AM[i+1,j] and the second analog data corresponding to a selection signal applied to each of the wiring RW[i] and the wiring RW[i+1] is output from the wiring B[j].

The differential current output from the wiring B[j+1] is expressed as $\Delta I_B[j+1]=2k\{V_X[i,j+1]V_{W2}[i]-V_X[i+1,j+1]V_{W2}[i+1]\}$. The data corresponding to the product of the first analog data stored in each of the memory cell AM[i,j+1] and the memory cell AM[i+1,j+1] and the second analog data corresponding to a selection signal applied to each of the wiring RW[i] and the wiring RW[i+1] is output from the wiring B[j+1].

After Time T57, the ground potential is supplied to the wiring RW[i] and the wiring RW[i+1]. At this time, the ground potential is supplied to the second terminals of the capacitors C52 in the memory cells AM[i,1] to AM[i,n], the memory cells AM[i+1,1] to AM[i+1,n], the memory cell AMref[i], and the memory cell AMref[i+1]. Thus, the potentials of the nodes N[i,1] to N[i,n], the nodes N[i+1,1] to N[i+1,n], the node Nref[i], and the node Nref[i+1] return to the potentials in the period from Time T55 to Time T56.

As described above, with the circuit configuration in FIG. 25, the product-sum operation necessary for the calculation of the neural network can be executed. The product-sum operation is not an operation using digital values; thus, a large-scale digital circuit is not necessary, and the circuit size can be small.

Here, the first analog data serves as weight coefficients and the second analog data corresponds to neuron outputs, whereby calculation of the weighted sums of the neuron outputs can be conducted concurrently. Thus, data corresponding to results of the calculation of the weighted sums, that is, synapse inputs can be obtained as the output signals. Specifically, weight coefficients $w_{s[k]\cdot 1}^{(k)}$ to $w_{s[k]\cdot Q[k-1]}^{(k)}$ of the s[k]-th neuron in the k-th layer are stored as the first analog data in the memory cells AM[1,j] to AM[m,j] and output signals $z_{1\cdot s[k]}^{(k-1)}$ to $z_{Q[k-1]\cdot s[k]}^{(k-1)}$ of the neurons in the (k−1)-th layer are supplied as the second analog data to the wirings RW[1] to RW[m], whereby the summation $u_{s[k]}^{(k)}$ of signals input to the s[k]-th neuron in the k-th layer can be obtained. That is, the product-sum operation expressed by Formula (1.1) can be performed with the semiconductor device 700.

In the case where weight coefficients are updated in supervised learning, weight coefficients $w_{1\cdot s[k]}^{(k+1)}$ to $w_{Q[+1]s[k]}^{(k+1)}$ multiplied by when a signal is transmitted from the s[k]-th neuron in the k-th layer to neurons in the (k+1)-th layer are stored as the first analog data in the memory cells AM[1,j] to AM[m,j] and errors $\delta_1^{(k+1)}$ to $\delta_{Q[k+1]}^{(k+1)}$ of the neurons in the (k+1)-th layer are supplied as the second analog data to the wirings RW[1] to RW[m], whereby a value of $\Sigma w_{s[k+1]\cdot s[k]}^{(k+1)}\cdot\delta_{s[k+1]}^{(k+1)}$ in Formula (1.3) can be obtained from the differential current $\Delta I_B[j]$ flowing through the wiring B [j]. That is, part of the operation expressed by Formula (1.3) can be performed with the semiconductor device 700.

Figure 33:
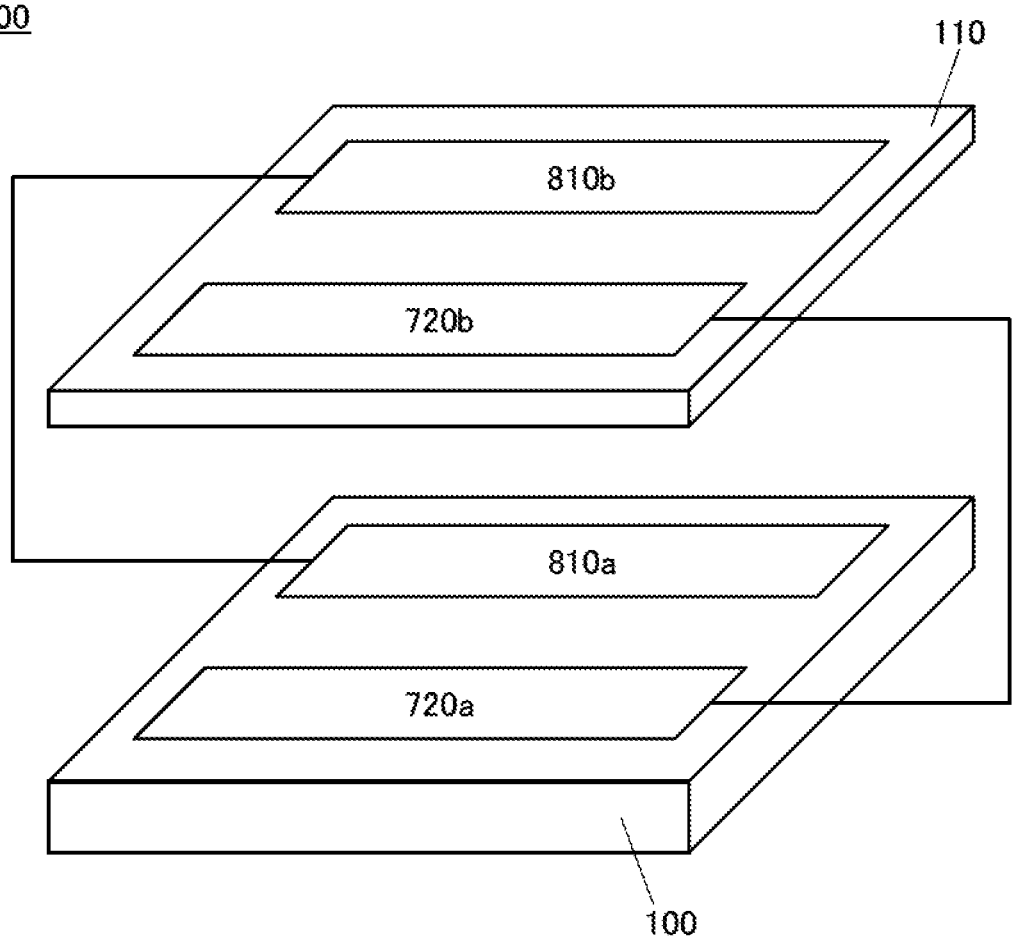
FIG. 33 illustrates a configuration example of a semiconductor device.

The circuits in the semiconductor device 800 described in this embodiment can be each formed by a transistor provided on a semiconductor substrate and a transistor provided over an insulating layer. Specifically, an offset circuit can be formed by a circuit 810a provided on the semiconductor substrate 100 and a circuit 810b provided over the insulating layer 110, as illustrated in FIG. 33. Moreover, a memory cell array can be formed by a circuit 720a provided on the semiconductor substrate 100 and a circuit 720b provided over the insulating layer 110.

The transistors Tr71, Tr72, Tr73, Tr75, and Tr76 of the transistors illustrated in FIG. 26 or FIG. 28 can be OS transistors provided in the circuit 810b and the other transistors can be provided in the circuit 810a, for example. In addition, the transistor Tr61 illustrated in FIG. 27 or FIG. 29 can be the OS transistor provided in the circuit 720b, and the transistor Tr92 can be provided in the circuit 720a.

As described above, the display system of one embodiment of the present invention can perform image processing in accordance with user's preference depending on environment by using a neural network.

This embodiment can be combined with any of the other embodiments as appropriate.

Embodiment 3

In this embodiment, a structure example of a transistor that can be used for the display system 10 described in the above embodiment is described.

<Structure Example of OS Transistor>

Figure 34A:
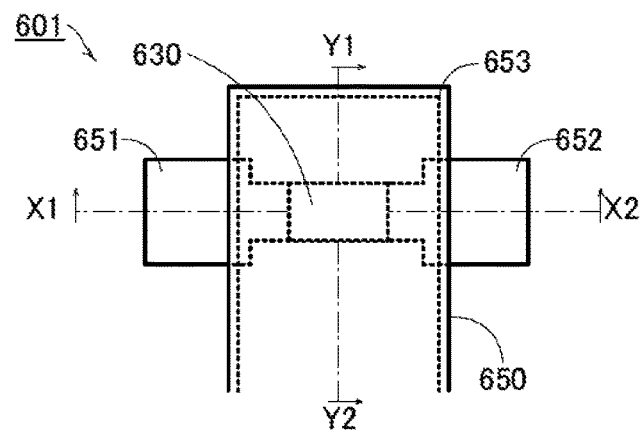
FIGS. 34A to 34C illustrate a structure example of a transistor.
Figure 34B:
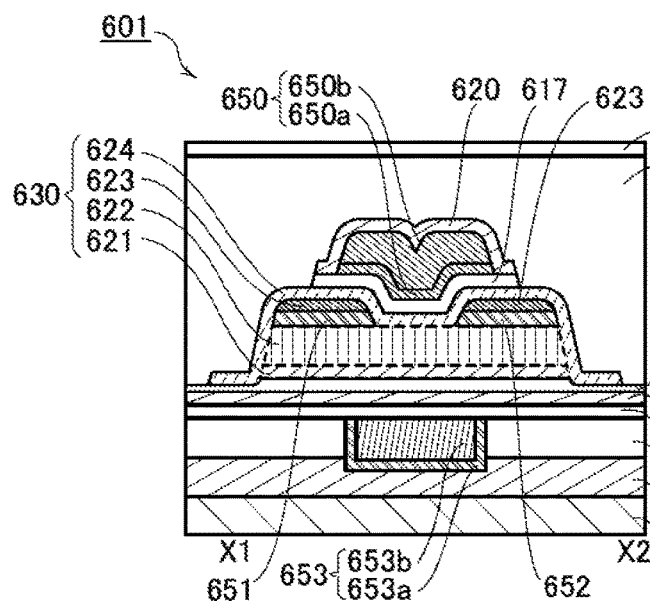
Figure 34C:
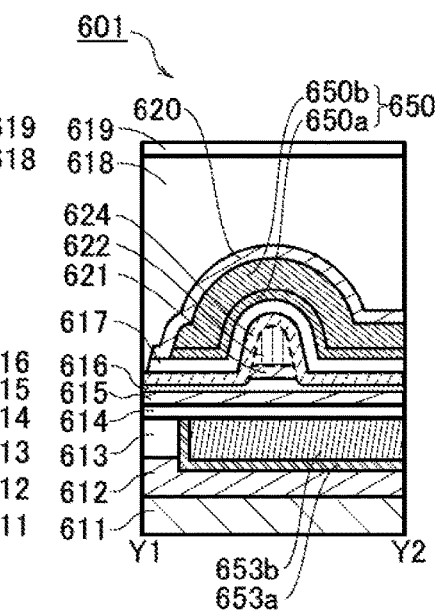

FIG. 34A is a top view illustrating a structure example of a transistor 601. FIG. 34B is a cross-sectional view taken along the line X1-X2 in FIG. 34A, and FIG. 34C is a cross-sectional view taken along the line Y1-Y2 in FIG. 34A. Here, in some cases, the direction of the line X1-X2 is referred to as a channel length direction, and the direction of the line Y1-Y2 is referred to as a channel width direction. Accordingly, FIG. 34B illustrates a cross-sectional structure of the transistor 601 in the channel length direction, and FIG. 34C illustrates a cross-sectional structure of the transistor 601 in the channel width direction. Note that to clarify the device structure, some components are not illustrated in FIG. 34A.

The transistor 601 can be used as a transistor formed over the insulating layer 110 in FIGS. 3 to 5, FIG. 18, and FIG. 33.

The semiconductor device of one embodiment of the present invention includes insulating layers 612 to 620, metal oxide films 621 to 624, and conductive layers 650 to 653. The transistor 601 is formed over an insulating surface. FIGS. 34A to 34C illustrate the case where the transistor 601 is formed over an insulating layer 611. The transistor 601 is covered with the insulating layer 618 and the insulating layer 619.

An insulating layer, a metal oxide film, a conductive film, and the like which construct the transistor 601 may have a single layer or a stack of a plurality of layers. Any of various deposition methods such as sputtering, molecular beam epitaxy (MBE), pulsed laser ablation (PLA), CVD, and atomic layer deposition (ALD) can be used to form these elements. Examples of CVD include plasma-enhanced CVD, thermal CVD, and metal organic CVD.

The conductive layer 650 includes a region functioning as a gate electrode of the transistor 601. A conductive layer 651 and a conductive layer 652 include a region functioning as a source electrode and a drain electrode. A conductive layer 653 includes a region functioning as a back gate electrode. An insulating layer 617 includes a region functioning as a gate insulating layer on a gate electrode (a front gate electrode) side, and an insulating layer of a stack of insulating layers 614 to 616 includes a region functioning as a gate insulating layer on a back gate electrode. The insulating layer 618 functions as an interlayer insulating layer. The insulating layer 619 functions as a barrier layer.

Metal oxide films 621 to 624 are collectively referred to as an oxide layer 630. The oxide layer 630 includes a region where the metal oxide film 621, the metal oxide film 622, and the metal oxide film 624 are stacked in this order as shown in FIGS. 34B and 34C. A pair of metal oxide films 623 is positioned over each of the conductive layer 651 and the conductive layer 652. When the transistor 601 is turned on, a channel formation region is mainly formed in the metal oxide film 622 within the oxide layer 630.

The metal oxide film 624 covers metal oxide films 621 to 623, the conductive layer 651, and the conductive layer 652. The insulating layer 617 is positioned between the metal oxide film 623 and the conductive layer 650. The conductive layer 651 and the conductive layer 652 each include a region overlapping with the conductive layer 650 with the metal oxide film 623, the metal oxide film 624, and the insulator layer 617 located therebetween.

The conductive layer 651 and the conductive layer 652 are formed using a hard mask used for forming the metal oxide film 621 and the metal oxide film 622. Therefore, the conductive layer 651 and the conductive layer 652 do not include a region in contact with the side surfaces of the metal oxide film 621 and the metal oxide film 622. For example, the metal oxide film 621, the metal oxide film 622, the conductive layer 651, and the conductive layer 652 can be formed through the following steps. First, a conductive film is formed over a metal oxide film including a stack of two layers. The conductive film is processed (etched) into a desired shape so that a hard mask is formed. The metal oxide film 621 and the metal oxide film 622 which are stacked are formed by processing the shape of the two-stacked layer of metal oxide films using the hard mask. The conductive layer 651 and the conductive layer 652 are formed by processing the hard mask into a desired shape.

For an insulating material used for insulating layers 611 to 618, aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, or the like can be given. The insulating layers 611 to 618 are formed using a single layer structure or a layered structure of these insulating materials. The layers used for the insulating layers 611 to 618 may include a plurality of insulating materials.

In this specification and the like, an oxynitride refers to a compound in which the oxygen content is higher than the nitrogen content, and a nitride oxide refers to a compound in which the nitrogen content is higher than the oxygen content.

The insulating layers 616 to 618 preferably contain oxygen to suppress the increase in oxygen vacancies in the oxide layer 630. The insulating layers 616 to 618 are each preferably formed using an insulating layer from which oxygen is released by heating (hereinafter also referred to as an "insulating layer containing excess oxygen"). Since oxygen is supplied from the insulating film containing excess oxygen to the oxide layer 630, the oxygen vacancy in the oxide layer 630 can be compensated. The reliability and electrical characteristics of the transistor 601 can be improved.

The insulating film containing excess oxygen is a film from which oxygen molecules at more than or equal to $1.0 \times 10^{18}$ molecules/cm$^{-3}$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^{-3}$.

The insulating film containing excess oxygen can be formed by performing treatment for adding oxygen to an insulating film. For the oxygen adding treatment, heat treatment under an oxygen atmosphere, an ion implantation method, an ion doping method, a plasma immersion ion implantation method, plasma treatment performed under an atmosphere containing oxygen, or the like can be employed. As a gas for adding oxygen, an oxygen gas of $^{16}O_2$, $^{18}O_2$, or the like, a nitrous oxide gas, an ozone gas, or the like can be used.

The hydrogen concentration in the insulating layers 612 to 619 is preferably low in order to prevent an increase in the hydrogen concentration in the oxide layer 630. In particular, it is preferable to reduce the hydrogen concentration in the insulating layers 613 to 618. Specifically, the hydrogen concentration is less than or equal to $2 \times 10^{20}$ atoms/cm$^{-3}$, preferably less than or equal to $5 \times 10^{19}$ atoms/cm$^{-3}$, more preferably $1 \times 10^{19}$ atoms/cm$^{-3}$, still more preferably $5 \times 10^{18}$ atoms/cm$^{-3}$.

Note that the concentration of hydrogen is measured by secondary ion mass spectrometry (SIMS).

In the transistor 601, the oxide layer 630 is preferably surrounded by an insulating layer with oxygen and hydrogen barrier properties (hereinafter such an insulating layer is also referred to as a "barrier layer"). With such a structure, it is possible to suppress the release of oxygen from the oxide layer 630 and entry of hydrogen into the oxide layer 630. The reliability and electrical characteristics of the transistor 601 can be improved.

For example, the insulating layer 619 functions as a barrier layer and at least one of the insulating layers 611, 612, and 614 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 611 to 618 is described. In this example, each of the insulating layers 611, 612, 615, and 619 functions as a barrier layer. The insulating layers 616 to 618 are oxide layers containing excess oxygen. The insulating layer 611 is formed using silicon nitride. The insulating layer 612 is formed using aluminum oxide. The insulating layer 613 is formed using silicon oxynitride. The insulating layers 614 to 616 serving as gate insulating layers on the back gate electrode side are formed using a stack of silicon oxide, aluminum oxide, and silicon oxynitride. The gate insulating layer 617 serving as a gate insulating layer on the front gate side is formed using silicon oxynitride. The insulating layer 618 serving as an interlayer insulating film is formed using silicon oxide. The insulating layer 619 is formed using aluminum oxide.

Examples of a conductive material used for the conductive layers 650 to 653 include a metal such as molybdenum, titanium, tantalum, tungsten, aluminum, copper, chromium, neodymium, or scandium; and a metal nitride containing any of the above metals as its component (e.g., tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 650 to 653 is described. The conductive layer 650 is a single layer of tantalum nitride or tungsten. Alternatively, the conductive layer 650 is a stacked-layer including tantalum nitride, tantalum, and tantalum nitride. The conductive layer 651 is a single layer of tantalum nitride or a stacked-layer including tantalum nitride and tungsten. The conductive layer 652 has a structure similar to that of the conductive layer 651. The conductive layer 653 is formed using tantalum nitride. The conductor is formed using tungsten.

In order to reduce the off-state current of the transistor 601, for example, the energy gap of the metal oxide film 622 is preferably large. The energy gap of the metal oxide film 622 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 630 has preferably crystallinity. At least the metal oxide film 622 has preferably crystallinity. With the above structure, the transistor 601 with high reliability and favorable electrical characteristics can be achieved.

As the metal oxide film 622, for example, an In—Ga oxide, an In—Zn oxide, or an In-M-Zn oxide (M is Al, Ga, Y or Sn) can be used. The metal oxide film 622 is not limited to the oxide layer containing indium. The metal oxide film 622 can be formed using a Zn—Sn oxide, a Ga—Sn oxide, or a Zn—Mg oxide, for example. Each of the metal oxide films 621, 623, and 624 can be formed using an oxide that is similar to the oxide of the metal oxide film 622. In particular, each of the metal oxide films 621, 623, and 624 can be formed using a Ga oxide.

When an interface level is formed at the interface between the metal oxide film 622 and the metal oxide film 621, a channel formation region is formed also in the vicinity of the interface, which causes a change in the threshold voltage of the transistor 601. It is preferable that the metal oxide film 621 contain at least one of the metal elements contained in the metal oxide film 622 as its component. Accordingly, an interface level is unlikely to be formed at the interface between the metal oxide film 622 and the metal oxide film 621, and variations in the electrical characteristics of the transistor 601, such as the threshold voltage can be reduced.

It is preferable that the metal oxide film 624 contain at least one of the metal elements contained in the metal oxide film 622 as its component because interface scattering is unlikely to occur at the interface between the metal oxide film 622 and the metal oxide film 624, and carrier transfer is not inhibited. Thus, the field-effect mobility of the transistor 601 can be increased.

It is preferable that the metal oxide film 622 have the highest carrier mobility among the metal oxide films 621 to 624. Accordingly, a channel can be formed in the metal oxide film 622 that is apart from the insulating layers 616 and 617.

In a metal oxide containing In such as an In-M-Zn oxide, carrier mobility can be increased by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as a metal oxide film, whereby carrier mobility can be increased.

For example, the metal oxide film 622 is formed using an In—Ga—Zn oxide, and the metal oxide films 621 and 623 are formed using a Ga oxide. For example, in the case where the metal oxide films 621 to 623 are formed using an In-M-Zn oxide, the metal oxide film 622 has the highest In content among the metal oxide films 621 to 623. In the case where the In-M-Zn oxide is formed by sputtering, the In content can be changed by a change in the atomic ratio of metal elements of a target.

For example, it is preferable that the atomic ratio of metal elements of a target used for depositing the metal oxide film 622 be In:M:Zn=1:1:1, 3:1:2, or 4:2:4.1. For example, it is preferable that the atomic ratio of metal elements of a target used for depositing the metal oxide films 621 and 623 be In:M:Zn=1:3:2 or 1:3:4. The atomic ratio of an In-M-Zn oxide deposited using a target of In:M:Zn=4:2:4.1 is approximately In:M:Zn=4:2:3.

In order that the transistor 601 have stable electrical characteristics, it is preferable to reduce the concentration of impurities in the oxide layer 630. In the metal oxide, hydrogen, nitrogen, carbon, silicon, and a metal element other than a main component are impurities. For example, hydrogen and nitrogen form donor levels to increase the carrier density. In addition, silicon and carbon in the metal oxide forms an impurity level. The impurity levels serve as traps and might cause the electric characteristics of the transistor to deteriorate.

For example, the oxide layer 630 includes a region where the concentration of silicon is lower than or equal to $2 \times 10^{18}$ atoms/cm$^{-3}$, preferably lower than or equal to $2 \times 10^{17}$ atoms/cm$^{-3}$. The same applies to the concentration of carbon in the oxide layer 630.

The oxide layer 630 includes a region where the concentration of alkaline earth metal is lower than $1 \times 10^{18}$ atoms/cm$^{-3}$, preferably lower than or equal to $2 \times 10^{16}$ atoms/cm$^{-3}$. The same applies to the concentration of alkaline earth metal in the oxide film 622.

The oxide layer 630 includes a region where the concentration of hydrogen is lower than $1 \times 10^{20}$ atoms/cm$^{-3}$, preferably lower than $1 \times 10^{19}$ atoms/cm$^{-3}$, more preferably lower than $5 \times 10^{18}$ atoms/cm$^{-3}$, still more preferably lower than $1 \times 10^{18}$ atoms/cm$^{-3}$.

The concentration of the impurities in the metal oxide film 622 is measured by SIMS.

For example, in the case where the metal oxide film 622 contains oxygen vacancy, donor levels are formed by entry of hydrogen into sites of oxygen vacancy in some cases. The oxygen vacancy is a factor in decreasing the on-state current of the transistor 601. Note that sites of oxygen vacancy become more stable by entry of oxygen than by entry of hydrogen. Therefore, by reducing oxygen vacancy in the metal oxide film 622, the on-state current of the transistor 601 can be increased in some cases. Consequently, preventing entry of hydrogen into sites of oxygen vacancy by a reduction in hydrogen in the metal oxide film 622 is effective in improving on-state current characteristics.

Hydrogen contained in a metal oxide reacts with oxygen bonded to a metal atom to be water, and thus causes an oxygen vacancy, in some cases. Entry of hydrogen into the oxygen vacancy generates an electron serving as a carrier. Furthermore, in some cases, bonding of part of hydrogen to oxygen bonded to a metal atom causes generation of an electron serving as a carrier. Thus, the transistor 601 is likely to be normally-on when the metal oxide film 622 contains hydrogen because the metal oxide film 622 includes a channel formation region. Accordingly, it is preferable that hydrogen in the metal oxide film 622 be reduced as much as possible.

FIGS. 34A to 34C illustrate examples in which the oxide layer 630 has a four-layer structure; however, one embodiment of the present invention is not limited thereto. For example, the oxide layer 630 can have a three-layer structure without the metal oxide film 621 or the metal oxide film 623. Alternatively, the oxide layer 630 may include one or more metal oxide films that are similar to the metal oxide films 621 to 624 at two or more of the following positions: between given layers in the oxide layer 630, over the oxide layer 630, and below the oxide layer 630.

Figure 35:
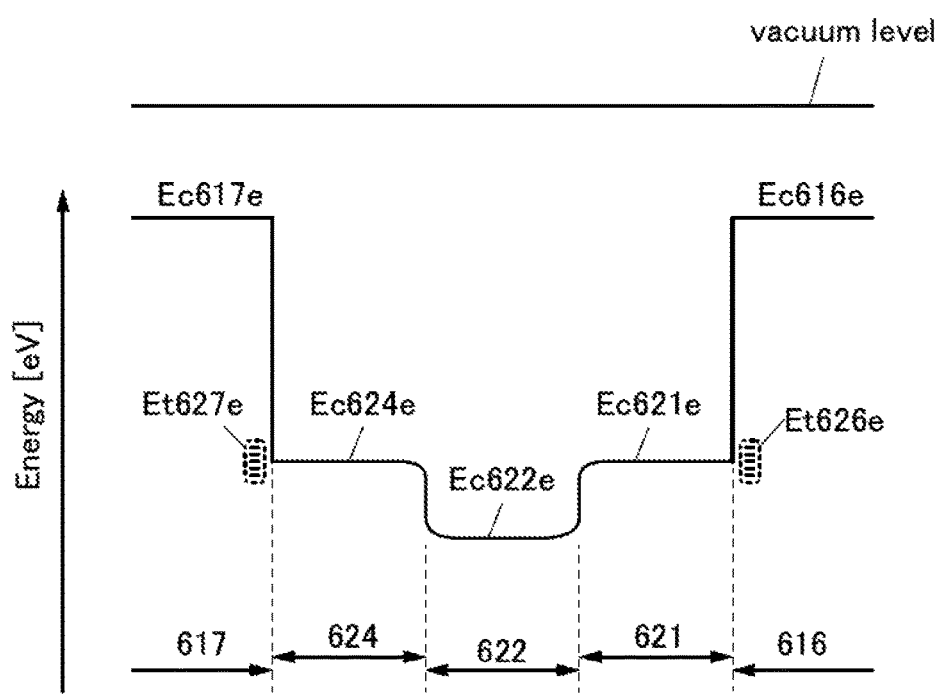
FIG. 35 shows an energy band diagram.

Effects of the stack of the metal oxide films 621, 622, and 624 are described with reference to FIG. 35. FIG. 35 is a schematic diagram showing the energy band structure of a channel formation region of the transistor 601.

In FIG. 35, Ec616e, Ec621e, Ec622e, Ec624e, and Ec617e indicate the energy of the conduction band minimum of the insulating layer 616, the metal oxide film 621, the metal oxide film 622, the metal oxide film 624, and the insulating layer 617, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layers 616 and 617 are insulators, Ec616e and Ec617e are closer to the vacuum level than Ec621e, Ec622e, and Ec624e (i.e., the insulating layers 616 and 617 have a smaller electron affinity than the metal oxide films 621, 622, and 624).

The metal oxide film 622 has a higher electron affinity than the metal oxide films 621 and 624. For example, the difference in electron affinity between the metal oxide films 622 and 621 and the difference in electron affinity between the metal oxide films 622 and 624 are each greater than or equal to 0.07 eV and less than or equal to 1.3 eV. The difference in electron affinity between the metal oxide films 622 and 621 and the difference in electron affinity between the metal oxide films 622 and 624 are each preferably greater than or equal to 0.1 eV and less than or equal to 0.7 eV, more preferably greater than or equal to 0.15 eV and less than or equal to 0.4 eV. Note that the electron affinity refers to an energy difference between the vacuum level and the conduction band minimum.

When voltage is applied to the gate electrode (the conductive layer 650) of the transistor 601, a channel is mainly formed in the metal oxide film 622 having the highest electron affinity among the metal oxide films 621, 622, and 624.

An indium gallium oxide has a low electron affinity and a high oxygen-blocking property. Therefore, the metal oxide film 624 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide films 621 and 622 between the metal oxide films 621 and 622. In some cases, there is also a mixed region of the metal oxide films 624 and 622 between the metal oxide films 624 and 622. Because the mixed region has low interface state density, a stack of the metal oxide films 621, 622, and 624 has a band structure where energy at each interface and in the vicinity of the interface is changed continuously (continuous junction).

Electrons transfer mainly through the metal oxide film 622 in the oxide layer 630 having such an energy band structure. Therefore, even if an interface state exists at the interface between the metal oxide film 621 and the insulating layer 612 or the interface between the metal oxide film 624 and the insulating layer 613, electron movement in the oxide layer 630 is less likely to be inhibited and the on-state current of the transistor 601 can be increased.

Although trap states Et626e and Et627e due to impurities or defects might be formed in the vicinity of the interface between the metal oxide film 621 and the insulating layer 616 and the vicinity of the interface between the metal oxide film 624 and the insulating layer 617 as illustrated in FIG. 35, the metal oxide film 622 can be separated from the trap states Et626e and Et627e owing to the existence of the metal oxide films 621 and 624.

Note that when a difference in energy between Ec621e and Ec622e is small, an electron in the metal oxide film 622 might reach the trap state Et626e by passing over the difference in energy. Since the electron is trapped at the trap state Et626e, negative fixed charge is generated at the interface with the insulating film, causing the threshold voltage of the transistor to be shifted in a positive direction. The same applies to the case where a difference in energy between Ec622e and Ec624e is small.

Each of the difference in energy between Ec621e and Ec622e and the difference in energy between Ec624e and Ec622e is preferably greater than or equal to 0.1 eV, more preferably greater than or equal to 0.15 eV so that a change in the threshold voltage of the transistor 601 can be reduced and the transistor 601 can have favorable electrical characteristics.

Note that the transistor 601 does not necessarily include a back gate electrode.

<Transistor in Display Portion>

Figure 36:
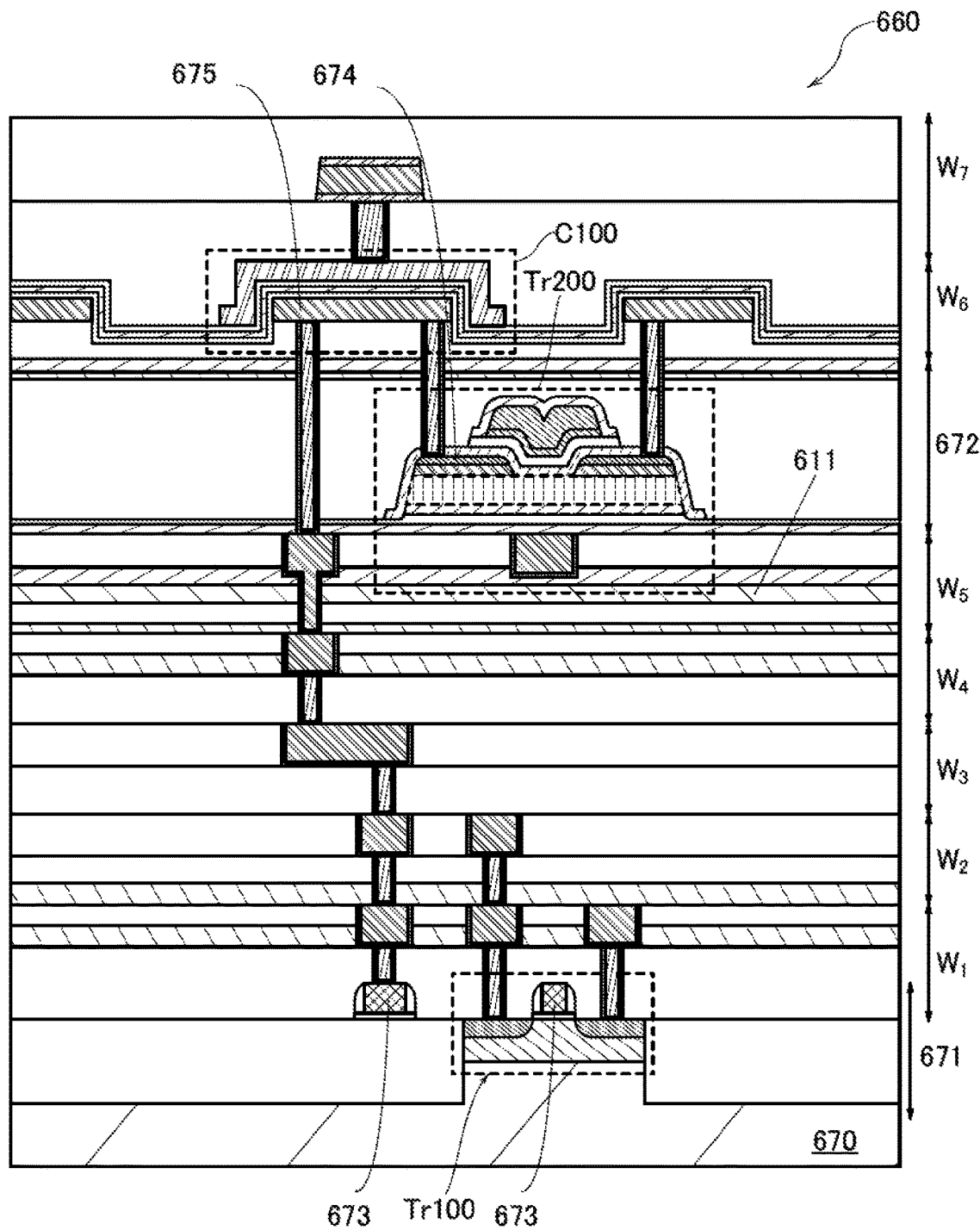
FIG. 36 illustrates a configuration example of a semiconductor device.

Next, a structure example in which a transistor provided on a semiconductor substrate and a transistor provided over an insulating layer are stacked is described. FIG. 36 illustrates an example of a stacked structure of a semiconductor device 660 in which a transistor Tr100, a transistor Tr200, and a capacitor C100 are stacked.

The transistor Tr100 corresponds to the transistor provided on the semiconductor substrate 100 in FIGS. 3 to 5, FIG. 18, and FIG. 33. The transistor Tr200 corresponds to the transistor provided over the insulating layer 110 in FIGS. 3 to 5, FIG. 18, and FIG. 33. The capacitor C100 corresponds to, for example, the capacitor illustrated in FIGS. 2A, 2B-1, and 2B-2, FIGS. 9A and 9B, FIG. 11, FIGS. 14A and 14B, FIGS. 15A and 15B, and FIGS. 26 to 29. An example in which a single crystal silicon wafer is used as a semiconductor substrate is described below.

The semiconductor device 660 includes a stack of a CMOS layer 671, wiring layers $W_1$ to $W_5$, a transistor layer 672, and wiring layers $W_6$ and $W_7$.

The transistor Tr100 is provided in the CMOS layer 671. A channel formation region of the transistor Tr100 is provided in a single crystal silicon wafer 870. FIG. 36 illustrates a structure example in which a gate electrode 673 of the transistor Tr100 is connected to one electrode 675 of the capacitor C100 through the wiring layers $W_1$ to $W_5$.

In the transistor layer 672, the transistor Tr200 is provided over the insulating layer 611. The transistor Tr200 in FIG. 36 has a structure similar to that of the transistor 601 in FIGS. 34A to 34C. An electrode 674 corresponding to one of a source and a drain of the transistor Tr200 is connected to the one electrode 675 of the capacitor C100. Note that in FIG. 36, the transistor Tr200 includes its back gate electrode in the wiring layer $W_5$ as an example. The capacitor C100 is formed in the wiring layer $W_6$.

As described above, the structures illustrated in FIGS. 3 to 5, FIG. 18, and FIG. 33 can be achieved by using the transistor Tr100 provided on the single crystal silicon wafer 870 and the transistor Tr200 provided over the insulating layer 611.

<Metal Oxide>

Next, a metal oxide that can be used in the OS transistor is described. In particular, the details of a metal oxide and a cloud-aligned composite (CAC)-OS are described below.

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC-metal oxide can be called a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element including a CAC-OS has high reliability. Thus, the CAC-OS is suitably used in a variety of semiconductor devices.

This embodiment can be combined with any of the other embodiments as appropriate.

Embodiment 4

In this embodiment, a structure example of a display device that can be used for the display portion 20 described in the above embodiment is described.

Figure 37:
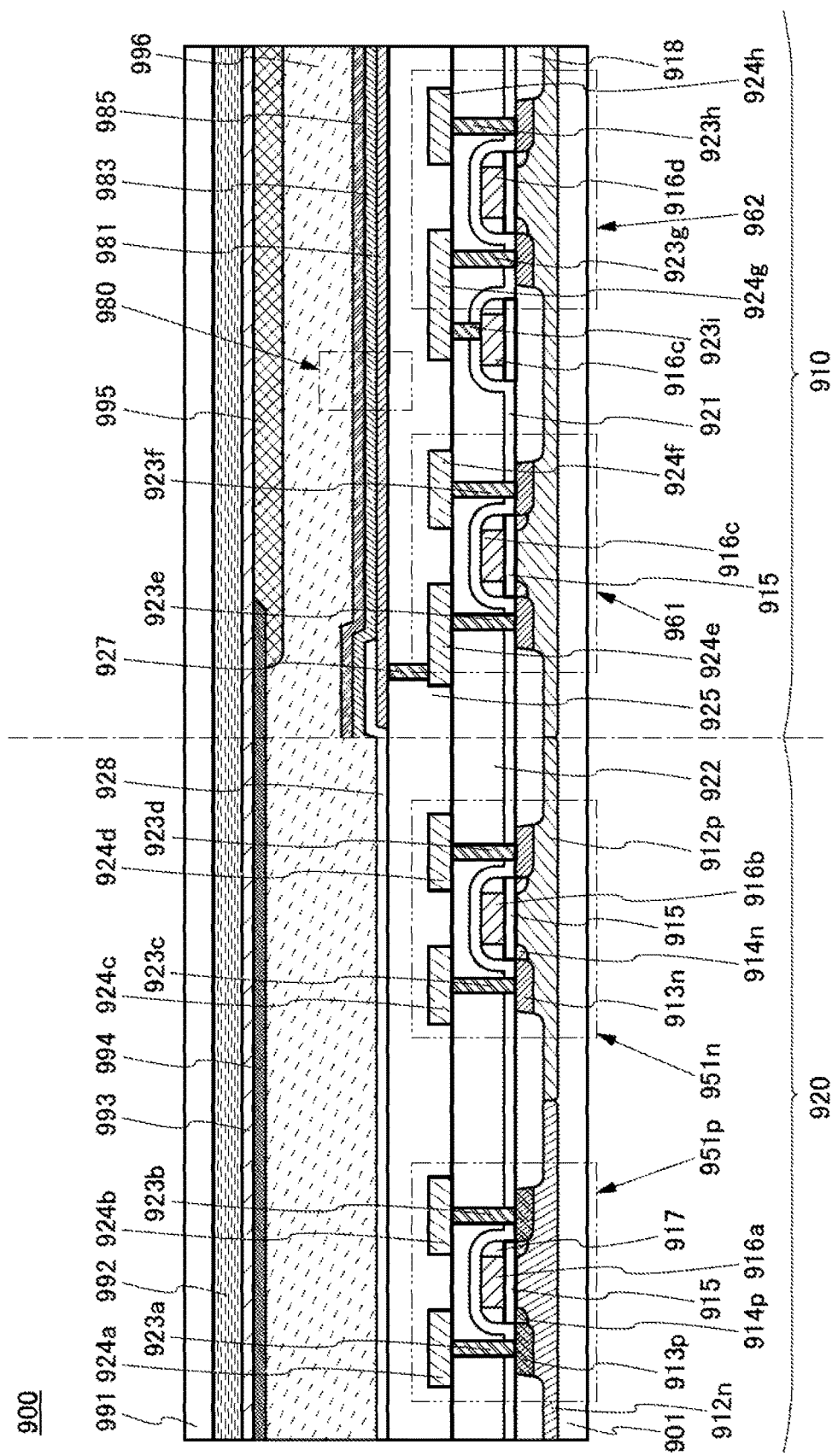
FIG. 37 illustrates a structure example of a display device.

FIG. 37 illustrates a structure example of a display device 900 including a pixel portion 910 and a driver circuit 920. The pixel portion 910 and the driver circuit 920 respectively correspond to the pixel portion 21 in FIG. 1 and the driver circuit 23 in FIG. 1.

FIG. 37 illustrates a semiconductor substrate 901, a transistor 951n, a transistor 951p, a transistor 961, a transistor 962, element isolation regions 918, a light-emitting element 980, a substrate 991, a bonding layer 992, an insulating film 993, a light-blocking layer 994, a coloring layer 995, a bonding layer 996, and the like.

A channel formation region of the transistor can be formed in the semiconductor substrate 901. The semiconductor substrate 901 is less likely to be shrunk by heat treatment in the process for manufacturing a display device, so that deterioration of characteristics of a transistor or a display element can be reduced and manufacturing yield can be decreased, and a display device with high resolution can be manufactured.

The pixel portion 910 and the driver circuit 920 may each include only p-channel transistors, only n-channel transistors, or a p-channel transistor and an n-channel transistor. FIG. 37 illustrates an example in which the transistor 961 and the transistor 962, which are n-channel transistors, are provided on the semiconductor substrate 901 in the pixel portion 910. In addition, the transistor 951p and the transistor 951n, which are respectively a p-channel transistor and an n-channel transistor, are provided on the semiconductor substrate 901 in the driver circuit 920 in the example illustrated in FIG. 37.

The transistor 951p is a p-channel transistor. The transistor 951p includes an n-well 912n, p-type impurity regions 913p, lightly doped drain (LDD) regions 914p, a gate insulating film 915, a gate 916a, sidewalls 917, an insulating film 921, an insulating film 922, a conductive film 923a, a conductive film 923b, a conductive film 924a, and a conductive film 924b.

One of the p-type impurity regions 913p of the transistor 951p is connected to the conductive film 924a over the insulating film 922 with the conductive film 923*a* located therebetween, and the other of the p-type impurity regions 913*p* of the transistor 951*p* is connected to the conductive film 924*b* over the insulating film 922 with the conductive film 923*b* located therebetween.

The transistor 951*n* includes a p-well 912*p*, n-type impurity regions 913*n*, LDD regions 914*n*, the gate insulating film 915, a gate 916*b*, the sidewalls 917, the insulating film 921, the insulating film 922, a conductive film 923*c*, a conductive film 923*d*, a conductive film 924*c*, and a conductive film 924*d*.

One of the n-type impurity regions 913*n* of the transistor 951*n* is connected to the conductive film 924*c* over the insulating film 922 with the conductive film 923*c* located therebetween, and the other of the n-type impurity regions 913*n* of the transistor 951*n* is connected to the conductive film 924*d* over the insulating film 922 with the conductive film 923*d* located therebetween.

The transistor 961 is an n-channel transistor. The transistor 961 includes the p-well 912*p*, the n-type impurity regions 913*n*, the LDD regions 914*n*, the gate insulating film 915, a gate 916*c*, the sidewalls 917, the insulating film 921, the insulating film 922, a conductive film 923*e*, a conductive film 923*f*, a conductive film 924*e*, and a conductive film 924*f*.

One of the n-type impurity regions 913*n* of the transistor 961 is connected to the conductive film 924*e* over the insulating film 922 with the conductive film 923*e* located therebetween, and the other of the n-type impurity regions 913*n* of the transistor 961 is connected to the conductive film 924*f* over the insulating film 922 with the conductive film 923*f* located therebetween.

The transistor 962 is an n-channel transistor. The transistor 962 includes the p-well 912*p*, the n-type impurity regions 913*n*, the LDD regions 914*n*, the gate insulating film 915, a gate 916*d*, the sidewalls 917, the insulating film 921, the insulating film 922, a conductive film 923*g*, a conductive film 923*h*, a conductive film 924*g*, and a conductive film 924*h*.

One of the n-type impurity regions 913*n* of the transistor 962 is connected to the conductive film 924*g* over the insulating film 922 with the conductive film 923*g* located therebetween, and the other of the n-type impurity regions 913*n* of the transistor 962 is connected to the conductive film 924*h* over the insulating film 922 with the conductive film 923*h* located therebetween.

The gate 916*c* of the transistor 961 is connected to a source or a drain of the transistor 962. Specifically, the gate 916*c* is connected to the conductive film 924*g* with a conductive film 923*i* located therebetween. The conductive film 924*g* is connected to the n-type impurity region 913*n* with the conductive film 923*g* located therebetween.

In the case where a p-channel transistor and an n-channel transistor are formed on the same substrate, the n-well 912*n* or the p-well 912*p* may be formed in part of the semiconductor substrate 901 as illustrated in FIG. 37. In the case where an n-type crystalline semiconductor substrate is used, the p-well 912*p* may be formed by adding an impurity element that imparts p-type conductivity, such as boron, to the semiconductor substrate 901, for example. Similarly, in the case where a p-type crystalline semiconductor substrate is used, the n-well 912*n* may be formed by adding an impurity element that imparts n-type conductivity, such as phosphorus, to the semiconductor substrate 901, for example.

The transistors each include a pair of n-type impurity regions 913*n* or a pair of p-type impurity regions 913*p*. One of the pair of impurity regions functions as a source region and the other of the pair of impurity regions functions as a drain region. The n-type impurity region 913*n* contains an impurity element that imparts n-type conductivity, such as phosphorus. The p-type impurity region 913*p* contains an impurity element that imparts p-type conductivity, such as boron.

The transistors may each include a low-concentration impurity region. The LDD region 914*n* of the n-channel transistor contains an impurity element that imparts n-type conductivity, such as phosphorus. The LDD region 914*p* of the p-channel transistor contains an impurity element that imparts p-type conductivity, such as boron.

The gate insulating films 915 are positioned between the semiconductor substrate 901 and the gates of the transistors. The gates of the transistors overlap with the channel formation regions in the semiconductor substrate 901 with the gate insulating films 915 located therebetween.

The transistors are electrically isolated by the element isolation regions 918. The element isolation regions 918 may be formed by a local oxidation of silicon (LOCOS) method, a shallow trench isolation (STI) method, or the like.

The light-emitting element 980 includes an electrode 981, an EL layer 983, and an electrode 985. The light-emitting element 980 emits light to the substrate 991 side.

One of the electrode 981 and the electrode 985 functions as an anode and the other functions as a cathode. When a voltage higher than the threshold voltage of the light-emitting element 980 is applied between the electrode 981 and the electrode 985, holes are injected to the EL layer 983 from the anode side and electrons are injected to the EL layer 983 from the cathode side. The injected electrons and holes are recombined in the EL layer 983 and a light-emitting substance contained in the EL layer 983 emits light.

A source or a drain of the transistor 961 is electrically connected to the electrode 981 over an insulating film 925 with a conductive film 927 located therebetween.

Top surfaces of the insulating films 922 and 925 and the like are preferably planarized by chemical mechanical polishing (CMP) or the like as necessary.

The electrode 981 functions as a pixel electrode and is provided for each light-emitting element 980. Two adjacent electrodes 981 are electrically insulated from each other by an insulating film 928. The electrode 985 functions as a common electrode and is provided for a plurality of light-emitting elements 980.

Although the insulating film 928 is an inorganic insulating film in the example illustrated in FIG. 37, the insulating film 928 may be an organic insulating film.

The insulating film 993, the light-blocking layer 994, and the coloring layer 995, which are formed over a different substrate from the semiconductor substrate 901, are bonded to the semiconductor substrate 901 with the bonding layer 996. In the case where only a functional element or a functional film that requires less fine processing than a transistor or the like is formed over a substrate, the functional element or the functional film is less likely to be influenced by heat shrinkage of a substrate in some cases. Therefore, the insulating film 993, the light-blocking layer 994, the coloring layer 995, and the like are not necessarily formed over the semiconductor substrate. In the case where fine processing is required in manufacturing, it is preferable that also the insulating film 993, the light-blocking layer 994, the coloring layer 995, and the like be formed over the semiconductor substrate.

The insulating film 993, the light-blocking layer 994, and the coloring layer 995 may be formed directly on the substrate 991, for example. In the case where a light-emitting element or a transistor is likely to deteriorate due to impurities such as moisture, a display device including the substrate 991 with a low gas barrier property has insufficient reliability in some cases. When a material with a low gas barrier property (e.g., organic resin) is used for the substrate 991, the insulating film 993 with a high gas barrier property is preferable. Thus, the following method may be used: transferring the insulating film 993, the light-blocking layer 994, and the coloring layer 995, which are formed over a formation substrate, to the semiconductor substrate 901 with the bonding layer 996, separating the formation substrate, and bonding the insulating film 993 and the substrate 991 with the bonding layer 992. Since the insulating film 993 is formed over a formation substrate with high heat resistance at high temperature, the insulating film 993 can have a high gas barrier property.

The light-emitting element 980 overlaps with the coloring layer 995 with the bonding layer 996 located therebetween. The insulating film 928 overlaps with the light-blocking layer 994 with the bonding layer 996 located therebetween.

Although FIG. 37 illustrates an example in which the light-emitting element 980 is provided in the pixel portion 910, a display element provided in the pixel portion 910 is not limited to a light-emitting element. For example, a liquid crystal element can be provided instead of the light-emitting element 980. In this case, a structure in which a liquid crystal element is a reflective liquid crystal element and light is emitted to the substrate 991 side is preferable.

This embodiment can be combined with any of the other embodiments as appropriate.

Embodiment 5

In this embodiment, electronic devices in which the display system described in the above embodiments can be provided are described.

Examples of electronic devices are a television set, a projector, a projection television (rear projector), a goggle-type display (head mounted display), a monitor of a computer or the like, a digital camera, a digital video camera, a digital photo frame, a mobile phone, a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 38A:
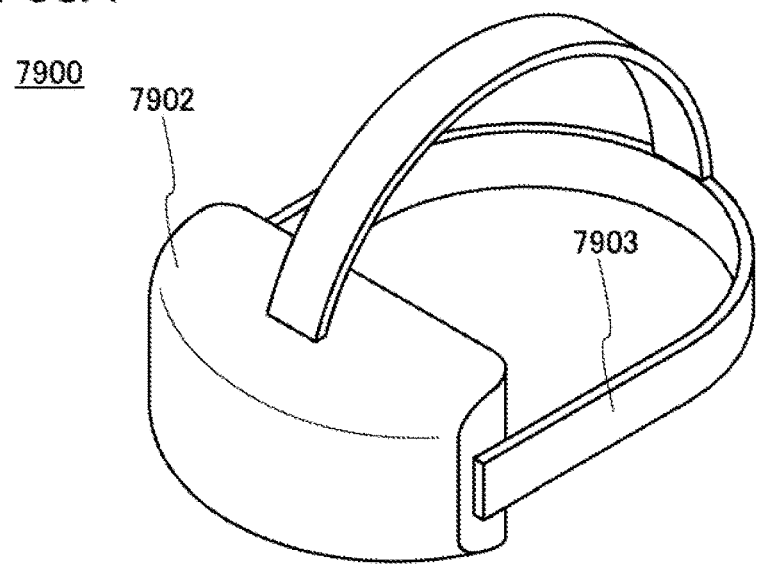
FIGS. 38A to 38C illustrate a structure example of a head mounted display.
Figure 38B:
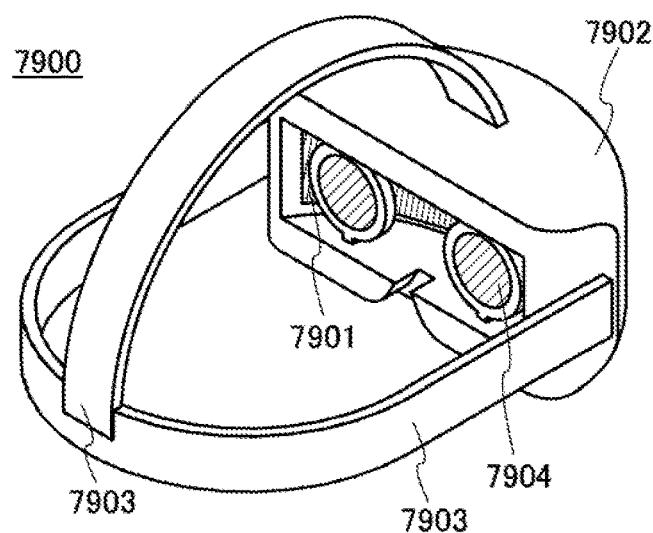
Figure 38C:
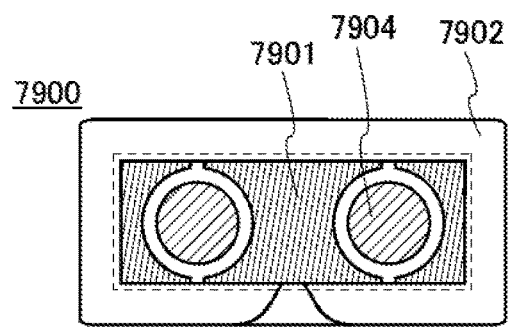

FIGS. 38A and 38B are perspective views of a head mounted display 7900. FIG. 38C is a schematic view of a side of the head mounted display 7900, which is put on user's face.

The head mounted display 7900 includes a main body 7902 and mounting portions 7903, and a display device 7901 and lenses 7904 are attached to the main body 7902. A user can see display on the display device 7901 through the lenses 7904.

The length of the mounting portions 7903 and the positions of the lenses 7904 can be changed as appropriate by the user.

The head mounted display 7900 preferably includes a sight line tracking device such as a head tracking device. The head mounted display 7900 tracks user's sight line with such a device and performs display corresponding to the sight line, whereby a realistic sensation can be increased.

The head mounted display 7900 preferably includes one or more of an antenna, a battery, a camera, a speaker, headphones, earphones, a microphone, and an operation button.

The head mounted display 7900 may include a unit including a processor that performs image processing, audio processing, or the like, a unit including a battery that supplies power to the main body (display unit) worn by a user, or the like in addition to the main body. The units can be connected to each other with or without wires.

Although an immersive head mounted display is described as an example, the display device of one embodiment of the present invention may be applied to a transmissive head mounted display.

Since a head mounted display is mounted on user's head, a lightweight head mounted display is desired to prevent fatigue due to long-time use of the head mounted display. The display device of one embodiment of the present invention can be favorably used for a head mounted display because the size and the thickness of the display device are easily reduced and thus weight thereof can be reduced.

Since the display device of one embodiment of the present invention has high definition, the user can feel a stereoscopic effect in an image without a complicated configuration (e.g., an image including a binocular parallax or 3D glasses). As a result, a high immersive sensation in displayed content in a head mounted display can be obtained.

Figure 39A:
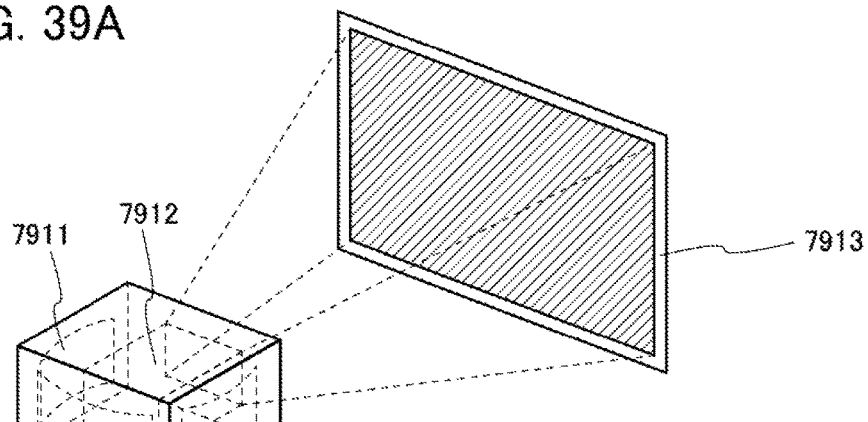
FIGS. 39A to 39C illustrate a structure example of a projector.
Figure 39B:
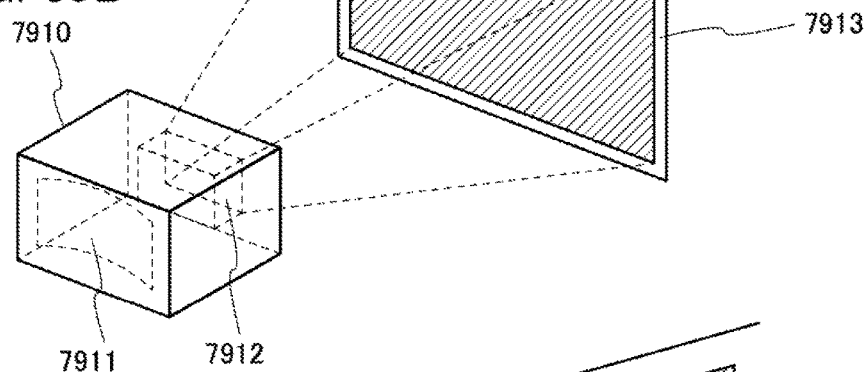
Figure 39C:
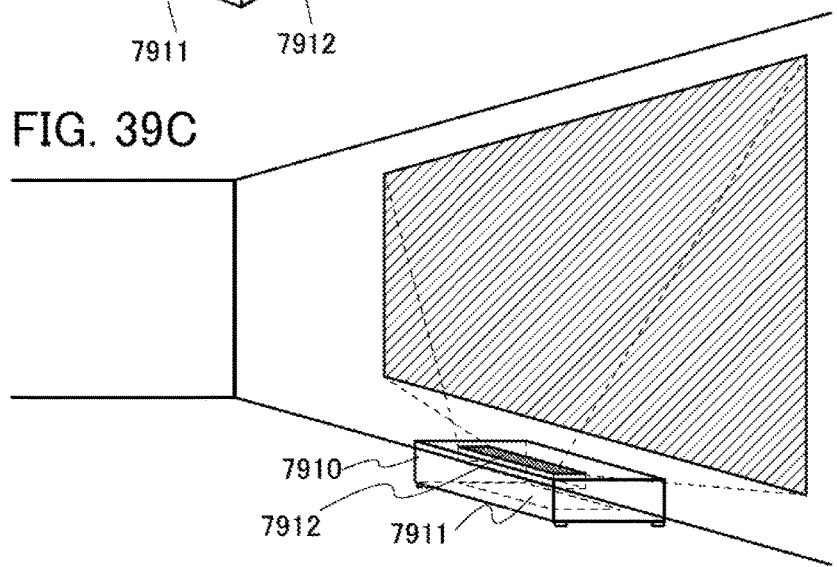

FIGS. 39A to 39C illustrate a projector 7910. The projector 7910 includes a display device 7911 and an optical system 7912. The projector 7910 projects an image on a screen 7913.

The display device 7911 may include an organic EL element as a display element. When a self-luminous display element is used, no additional light source is needed for the projector 7910. Therefore, the projector 7910 can be lightweight and small.

FIG. 39A illustrates a three-panel type projector including three display devices 7911. The display devices 7911 each have a concave display surface.

FIG. 39B is a single-panel type projector including one display device 7911. The display device 7911 has a convex display surface.

FIG. 39C illustrates an ultra short focus projector. The ultra short focus projector can be provided near a screen, a wall, or the like onto which an image is projected, so that the ultra short focus projector is effectively used in a narrow or limited space.

The optical system 7912 preferably includes at least one of a mirror, a prism, a retardation plate, a lens, a film having a function of polarizing light, a film for adjusting a phase difference, and an IR film. For example, light emitted from the display device 7911 is projected onto a screen through a zoom lens.

This embodiment can be combined with any of the other embodiments as appropriate.

This application is based on Japanese Patent Application Serial No. 2016-244323 filed with Japan Patent Office on Dec. 16, 2016, the entire contents of which are hereby incorporated by reference.

What is claimed is:

1. A semiconductor device comprising:
a pixel portion comprising a pixel comprising a first transistor;
a driver circuit comprising a second transistor;
a signal generation circuit comprising a third transistor and a fourth transistor; and
a level shifter comprising a fifth transistor,
wherein the level shifter is configured to amplify a signal input from the signal generation circuit and output an amplified signal to the driver circuit,
wherein a channel region of the first transistor, a channel region of the second transistor, and a channel region of the third transistor are formed in a semiconductor substrate,
wherein each of a channel region of the fourth transistor and a channel region of the fifth transistor is formed in a semiconductor film, and
wherein the semiconductor film comprises a metal oxide.

2. The semiconductor device according to claim 1,
wherein the signal generation circuit comprises a memory device, and
wherein the memory device comprises the fourth transistor.

3. The semiconductor device according to claim 1,
wherein the fourth transistor and the fifth transistor are stacked over the first transistor, the second transistor, and the third transistor.

4. The semiconductor device according to claim 1,
wherein the pixel comprises a sixth transistor and a light-emitting element,
wherein one of a source and a drain of the first transistor is electrically connected to one electrode of the light-emitting element,
wherein one of a source and a drain of the sixth transistor is electrically connected to a gate of the first transistor, and
wherein a channel region of the sixth transistor is formed in a semiconductor film containing a metal oxide.

5. The semiconductor device according to claim 1,
wherein the semiconductor substrate is a single crystal silicon substrate, a single crystal germanium substrate, a compound semiconductor substrate, or an SOI substrate.

6. A display system comprising:
the semiconductor device according to claim 1; and
a host,
wherein the signal generation circuit is configured to generate a video signal on the basis of image data input from the host.

7. The display system according to claim 6,
wherein the semiconductor device comprises an arithmetic circuit,
wherein the host comprises software,
wherein the arithmetic circuit constitutes a first neural network,
wherein the software constitutes a second neural network,
wherein the first neural network is configured to output a parameter used for image processing on the basis of information on an environment where video displayed on the pixel portion is seen,
wherein the second neural network is configured to perform supervised learning, and
wherein a weight coefficient of the second neural network updated by the supervised learning is output to the first neural network.

8. An electronic device comprising the display system according to claim 6.

* * * * *